(12) United States Patent
Ogawa et al.

(10) Patent No.: US 7,246,878 B2
(45) Date of Patent: *Jul. 24, 2007

(54) METHOD OF GENERATING EJECTION PATTERN DATA, AND HEAD MOTION PATTERN DATA; APPARATUS FOR GENERATING EJECTION PATTERN DATA; APPARATUS FOR EJECTING FUNCTIONAL LIQUID DROPLET; DRAWING SYSTEM; METHOD OF MANUFACTURING ORGANIC EL DEVICE, ELECTRON EMITTING DEVICE, PDP DEVICE, ELECTROPHORESIS DISPLAY DEVICE, COLOR FILTER, AND ORGANIC EL; AND METHOD OF FORMING SPACER, METAL WIRING, LENS, RESIST, AND LIGHT DIFFUSER

(75) Inventors: Masahiko Ogawa, Chino (JP); Tsuyoshi Kato, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 162 days.

This patent is subject to a terminal disclaimer.

(21) Appl. No.: 11/043,468

(22) Filed: Jan. 27, 2005

(65) Prior Publication Data

US 2005/0128246 A1 Jun. 16, 2005

Related U.S. Application Data

(62) Division of application No. 10/367,840, filed on Feb. 19, 2003, now Pat. No. 6,863,370.

(30) Foreign Application Priority Data

Mar. 14, 2002 (JP) ............................. 2002-070782

(51) Int. Cl.
*B41J 2/15* (2006.01)
*B41J 2/145* (2006.01)

(52) U.S. Cl. ........................................ 347/40; 347/105

(58) Field of Classification Search ................. 347/40, 347/105
See application file for complete search history.

(56) References Cited

U.S. PATENT DOCUMENTS 5,350,929 A 9/1994 Meyer et al. ............... 250/573

(Continued)

FOREIGN PATENT DOCUMENTS

JP A 06-149491 5/1994

(Continued)

*Primary Examiner*—Thinh Nguyen
(74) *Attorney, Agent, or Firm*—Oliff & Berridge, PLC

(57) ABSTRACT

A method of generating ejection pattern data for a plurality of nozzles for use in selectively ejecting functional liquid droplets from the nozzles is to draw on ore more one chip-forming area on a workpiece. The method includes a pixel-setting step of setting pixel information concerning an array of pixels in the chip-forming areas, a chip-setting step of setting chip information concerning an array of the chip-forming areas on the workpiece, a nozzle-setting step of setting nozzle information concerning an array of the nozzles, and a data-generating step of generating the ejection pattern data for the nozzles from the pixel information, the chip information, and the nozzle information, based on a positional relationship between the workpiece and the functional liquid droplet ejection head. The ejection pattern data are easily and quickly generated for the nozzles arranged in an array in the plurality of functional liquid droplet ejection heads.

19 Claims, 53 Drawing Sheets

U.S. PATENT DOCUMENTS

| | | | |
|---|---|---|---|
| 6,585,339 B2 * | 7/2003 | Schloeman et al. ........... | 347/12 |
| 6,863,370 B2 * | 3/2005 | Ogawa et al. ................ | 347/40 |
| 2002/0057450 A1 | 5/2002 | Mio et al. | |

FOREIGN PATENT DOCUMENTS

| | | |
|---|---|---|
| JP | A 10-100396 | 4/1998 |
| JP | A 2001-111953 | 4/2001 |
| JP | A 2001-253066 | 9/2001 |

* cited by examiner

F I G. 2
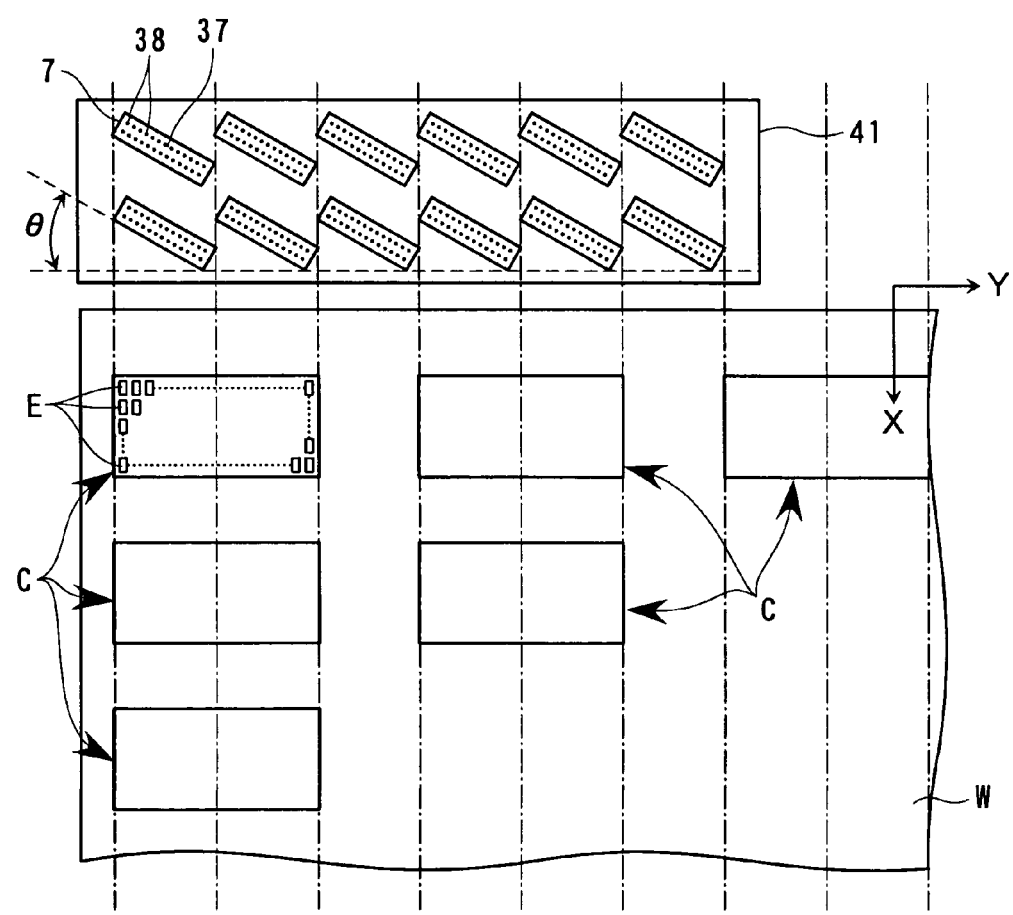

F I G. 4
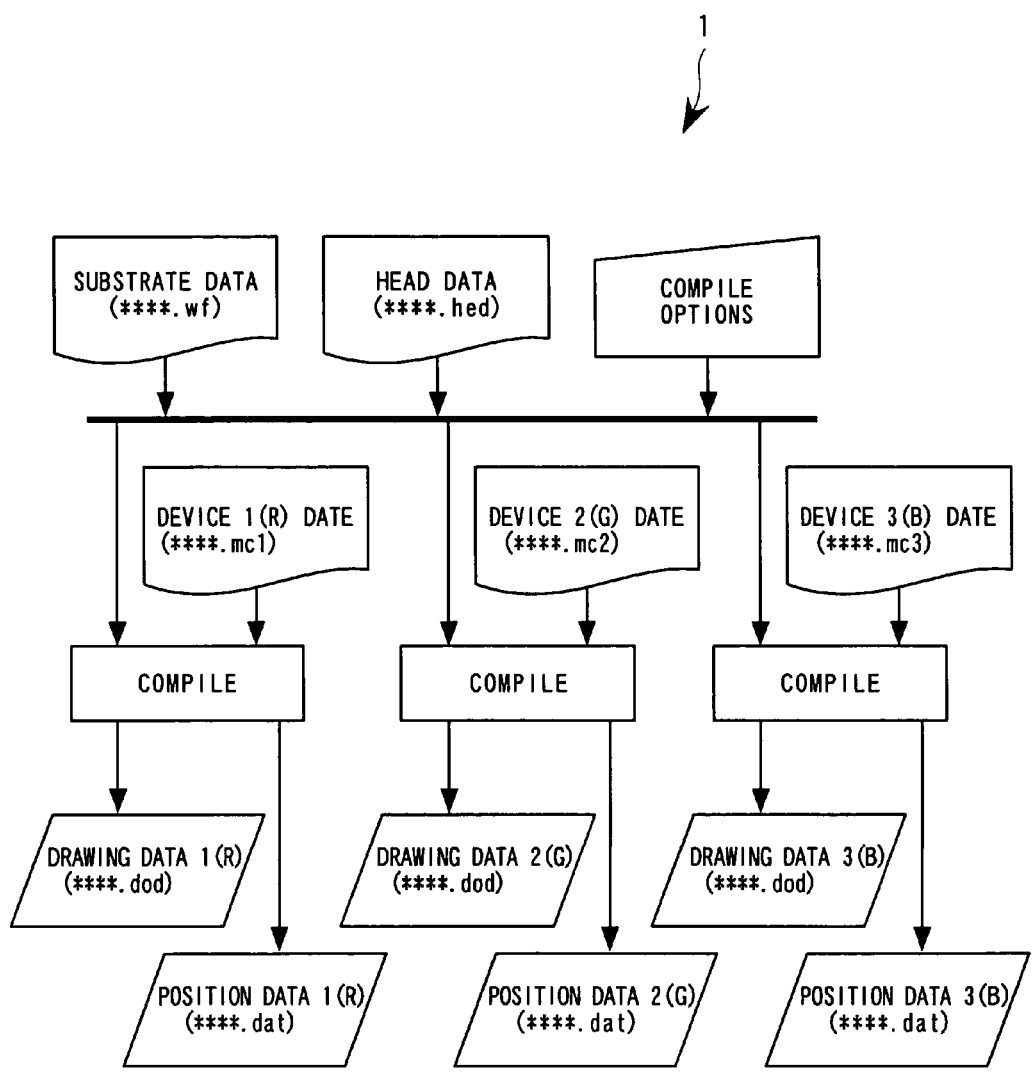

FIG. 12

| EDIT OF EXISTING MACHINE TYPE FILE |

MACHINE TYPE FILE NAME [646all_4d_200]

MACHINE TYPE NAME [646all_4d_200]

| CELL PATTERN | CF DESIGN VALUES 1 | WORK DESIGN VALUES 1 | WORK DESIGN VALUES 2 | IMAGE SETTING | DRAWING CONDITIONS | IN-PIXEL DRAWING DESIGN | OPTION |

─CF NUMBERS─
LATERAL CF NUMBER [10]
VERTICAL CF NUMBER [7]

─CF SIZES─
LATERAL SIZE [33860] μm
VERTICAL SIZE [44500] μm

─CF PITCHS─
LATERAL PITCH [42660] μm
VERTICAL PITCH [49160] μm

─CF CENTRAL PITCH─
☐ CENTRAL PITCH EXISTS
CENTRAL PITCH(a) [0] μm

─WF SIZE─
⊙ 470×370mm   ⊙ 500×400mm

─MAGAZINE PITCH─
⊙ 14 inches   ⊙ 16 inches

※ENTER VALUES IN A STATE OF WORK REFERENCE BEING LOCATED AT UPPER RIGHT CORNER

F I G. 1 4

| CELL PATTERN | CF DESIGN VALUES 1 | WORK DESIGN VALUES 1 | WORK DESIGN VALUES 2 | IMAGE SETTING | DRAWING CONDITIONS | IN-PIXEL DRAWING DESIGN | OPTION |

MACHINE TYPE FILE NAME  646all_4d_200

MACHINE TYPE NAME  646all_4d_200

SETTING OF IMAGE PROCESSING DEVICE FOR WF ALIGNMENT

─MASTER ALIGNMENT MARK─
PATTERN NAME    w01m
ACCURACY        HIGH ▶
COMPLEXITY      5 ▶
INTERMEDIATE LOWER LIMIT VALUE    6500
FINAL LOWER LIMIT VALUE            8500

─SLAVE ALIGNMENT MARK─
PATTERN NAME    w01s
ACCURACY        HIGH ▶
COMPLEXITY      5 ▶
INTERMEDIATE LOWER LIMIT VALUE    6500
FINAL LOWER LIMIT VALUE            8500

※1. ENTER PATTERN NAME BY USING FOUR ALPHANUMERIC EM (HALF-SIZE) LOWER-CASE LETTERS
※2. ENTER A VALUE SMALLER THAN FINAL LOWER LIMIT VALUE TO INTERMEDIATE LOWER LIMIT VALUE

EDIT OF EXISTING MACHINE TYPE FILE

FIG. 15

| CELL PATTERN | CF DESIGN VALUES 1 | WORK DESIGN VALUES 1 | WORK DESIGN VALUES 2 | IMAGE SETTING | DRAWING CONDITIONS | IN-PIXEL DRAWING DESIGN | OPTION |

MACHINE TYPE FILE NAME  646all_4d_200

MACHINE TYPE NAME  646all_4d_200

DRAWING CONDITIONS OF EACH COLOR

|  | RED DRAWING | GREEN DRAWING | BLUE DRAWING |
|---|---|---|---|
| EJECTION RESOLUTION (μm) | 8 | 8 | 8 |
| X-AXIS DRAWING SPEED (mm/sec) | 200 | 200 | 200 |

COMMON DRAWING CONDITION

NUMBER OF TIMES OF FLUSHING  1000

EDIT OF EXISTING MACHINE TYPE FILE

FIG. 16

EDIT OF EXISTING MACHINE TYPE FILE

MACHINE TYPE FILE NAME [646all_4d_200]

MACHINE TYPE NAME [646all_4d_200]

| CELL PATTERN | OF DESIGN VALUES 1 | WORK DESIGN VALUES 1 | WORK DESIGN VALUES 2 | IMAGE SETTING | DRAWING CONDITIONS | IN-PIXEL DRAWING DESIGN | OPTION |

INK DROPLET-LANDING START POSITION WITHIN PIXEL & NUMBER OF INK DROPLETS

| | DURING RED DRAWING | | DURING GREEN DRAWING | | DURING BLUE DRAWING | |
|---|---|---|---|---|---|---|
| | LANDING POSITION | NUMBER OF INK DROPLETS | LANDING POSITION | NUMBER OF INK DROPLETS | LANDING POSITION | NUMBER OF INK DROPLETS |
| 1ST PASS | -109 μm | 4 | -109 μm | 4 | -109 μm | 4 |
| 2ND PASS | 69 μm | 4 | 69 μm | 4 | 69 μm | 4 |
| 3RD PASS | 48 μm | 4 | 48 μm | 4 | 48 μm | 4 |
| 4TH PASS | -8 μm | 4 | -8 μm | 4 | -8 μm | 4 |

239

※INK IS EJECTED IN INCREASING DIRECTION RELATIVE TO LANDING POSITION WHEN EJECTION IS PERFORMED ON 1ST AND 2ND PASSES, WHEREAS INK IS EJECTED IN DECREASING DIRECTION WHEN EJECTION IS PERFORMED ON 3RD AND 4TH PASSES.

FIG. 20

EDIT OF EXISTING HEAD FILE

HEAD FILE NAME: Head1
HEAD NAME: Head1

Tabs: HEAD DESIGN VALUES | HEAD CARRIAGE DESIGN VALUES 1 | HEAD CARRIAGE DESIGN VALUES 2 | IMAGE SETTING | OPTION

INTERVAL OF NOZZLE ARRAYS FROM HEAD A

Nozzle arrays when head carriage is viewed from above:
- 7-A, 7-B, 8-A, 8-B, 9-A, 9-B, 10-A, 10-B, 11-A, 11-B, 12-A, 12-B (slave alignment mark side)
- 1-B, 1-A (HEAD 1-A ARRAY), 2-B, 2-A, 3-B, 3-A, 4-B, 4-A (master alignment mark), 5-B, 5-A, 6-B, 6-A

NEW LINE START DIRECTION +/−
DRAWING DIRECTION +/−

| | DISTANCE IN DRAWING DIRECTION | DISTANCE IN NEW LINE START DIRECTION | | HEAD MOUNTING |
|---|---|---|---|---|
| HEAD 1-A ARRAY | 0.00 | 0.00 | μm | NORMAL |
| HEAD 2-A ARRAY | -2258.00 | -37920.00 | μm | NORMAL |
| HEAD 3-A ARRAY | -4516.00 | -75840.00 | μm | NORMAL |
| HEAD 4-A ARRAY | -6774.00 | -113760.00 | μm | NORMAL |
| HEAD 5-A ARRAY | -9032.00 | -151680.00 | μm | NORMAL |
| HEAD 6-A ARRAY | -11290.00 | -189600.00 | μm | NORMAL |
| HEAD 1-B ARRAY | 1886.43 | 1303.69 | μm | NORMAL |
| HEAD 2-B ARRAY | -371.57 | -36616.31 | μm | NORMAL |
| HEAD 3-B ARRAY | -2629.57 | -74536.31 | μm | NORMAL |
| HEAD 4-B ARRAY | -4887.57 | -112456.31 | μm | NORMAL |
| HEAD 5-B ARRAY | -7145.57 | -150376.31 | μm | NORMAL |
| HEAD 6-B ARRAY | -9403.57 | -188296.31 | μm | NORMAL |
| HEAD 7-B ARRAY | 100000.00 | -18960.00 | μm | REVERSE |
| HEAD 8-B ARRAY | 97742.0 | -56880.00 | μm | REVERSE |
| HEAD 9-B ARRAY | 95484.00 | -94800.00 | μm | REVERSE |
| HEAD 10-B ARRAY | 93226.00 | -132720.00 | μm | REVERSE |
| HEAD 11-B ARRAY | 90968.00 | -170640.00 | μm | REVERSE |
| HEAD 12-B ARRAY | 88710.00 | -208560.00 | μm | REVERSE |
| HEAD 7-A ARRAY | 101886.43 | -17656.31 | μm | REVERSE |
| HEAD 8-A ARRAY | 99628.43 | -55576.31 | μm | REVERSE |
| HEAD 9-A ARRAY | 97370.43 | -93496.31 | μm | REVERSE |
| HEAD 10-A ARRAY | 95112.43 | -131416.31 | μm | REVERSE |
| HEAD 11-A ARRAY | 92854.43 | -169336.31 | μm | REVERSE |
| HEAD 12-A ARRAY | 90596.43 | -207256.31 | μm | REVERSE |

F I G. 2 2

```
┌─ EDIT OF EXISTING HEAD FILE ─────────────────────────────────────────────┐
│                                                                          │
│   HEAD FILE NAME  [Head1        ]                                        │
│   HEAD NAME       [Head1        ]                                        │
│  ┌──────────┬──────────┬──────────┬────────┬────────┐                    │
│  │HEAD DESIGN│HEAD CARRIAGE│HEAD CARRIAGE│ IMAGE │OPTION│                │
│  │VALUES    │DESIGN VALUES 1│DESIGN VALUES 2│SETTING│    │                │
│  ┌──SETTING OF IMAGE PROCESSING DEVICE FOR HEAD ALIGNMENT──────────────┐ │
│  │  ┌─MASTER ALIGNMENT MARK─────┐  ┌─MASTER ALIGNMENT MARK─────┐       │ │
│  │  │ PATTERN NAME   [h01m   ]  │  │ PATTERN NAME   [h01s   ]  │       │ │
│  │  │ ACCURACY       [HIGH ▼]   │  │ ACCURACY       [HIGH ▼]   │       │ │
│  │  │ COMPLEXITY     [5    ▼]   │  │ COMPLEXITY     [5    ▼]   │       │ │
│  │  │ INTERMEDIATE                │  │ INTERMEDIATE                │       │ │
│  │  │ LOWER LIMIT VALUE [ 6500] │  │ LOWER LIMIT VALUE [ 6500] │       │ │
│  │  │ FINAL LOWER                 │  │ FINAL LOWER                 │       │ │
│  │  │ LIMIT VALUE       [ 8500] │  │ LIMIT VALUE       [ 8500] │       │ │
│  │  │ BINARIZATION LEVEL[  128] │  │ BINARIZATION LEVEL[   80] │       │ │
│  │  │ AREA LOWER LIMIT            │  │ AREA LOWER LIMIT            │       │ │
│  │  │ VALUE            [10000]  │  │ VALUE            [10000]  │       │ │
│  │  │ AREA UPPER LIMIT            │  │ AREA UPPER LIMIT            │       │ │
│  │  │ VALUE            [35000]  │  │ VALUE            [35000]  │       │ │
│  │  └───────────────────────────┘  └───────────────────────────┘       │ │
│  │                                                                     │ │
│  │ ※1.ENTER PATTERN NAME BY USING FOUR ALPHANUMERIC EM (HALF-SIZE) LOWER-CASE LETTERS. │
│  │ ※2.ENTER A VALUE SMALLER THAN FINAL LOWER LIMIT VALUE TO INTERMEDIATE LOWER LIMIT VALUE. │
│  │ ※3.ENTER A VALUE SMALLER THAN AREA UPPER LIMIT VALUE TO AREA LOWER LIMIT VALUE. SET 1 OR │
│  │     A LARGER VALUE TO AREA UPPER LIMIT VALUE.                       │ │
│  └─────────────────────────────────────────────────────────────────────┘ │
└──────────────────────────────────────────────────────────────────────────┘
```

F I G. 2 5
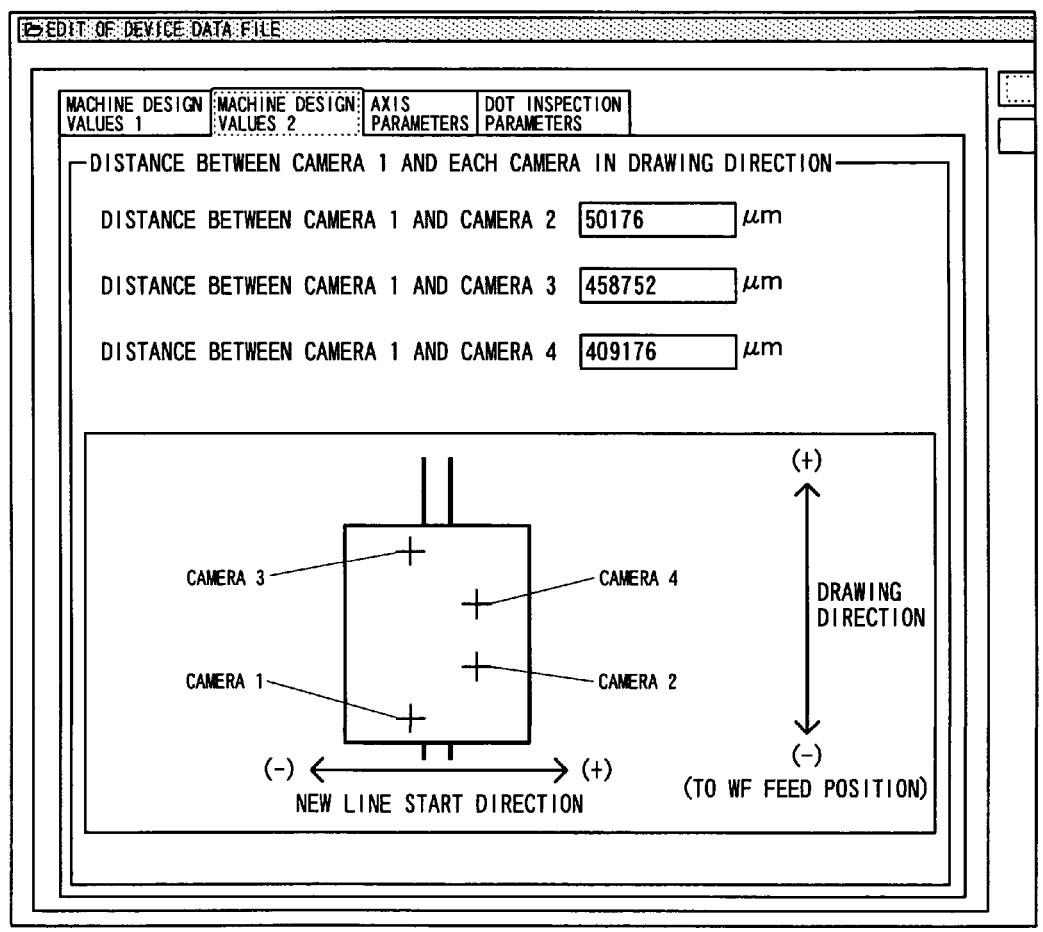

F I G. 3 0
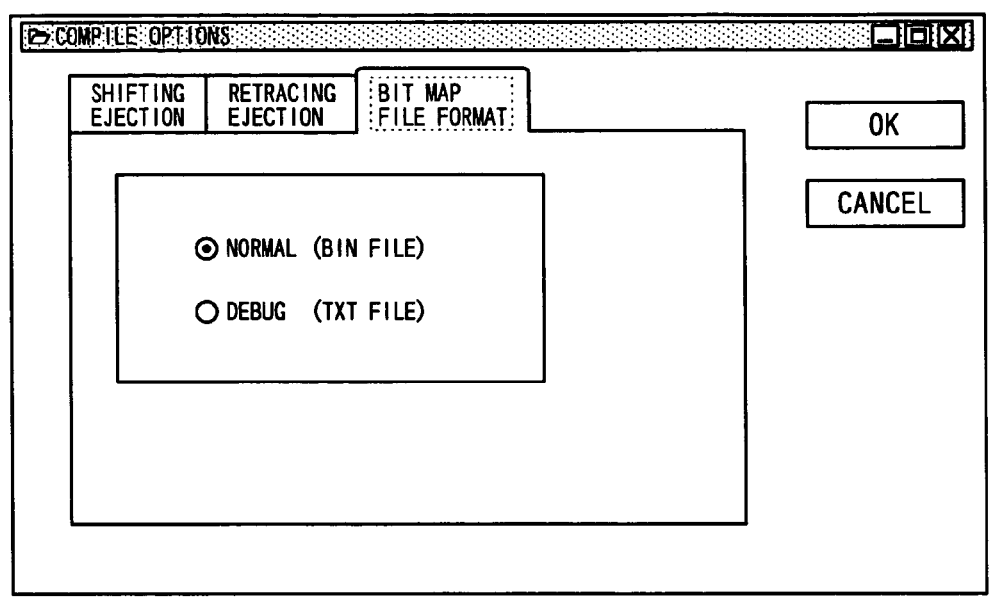

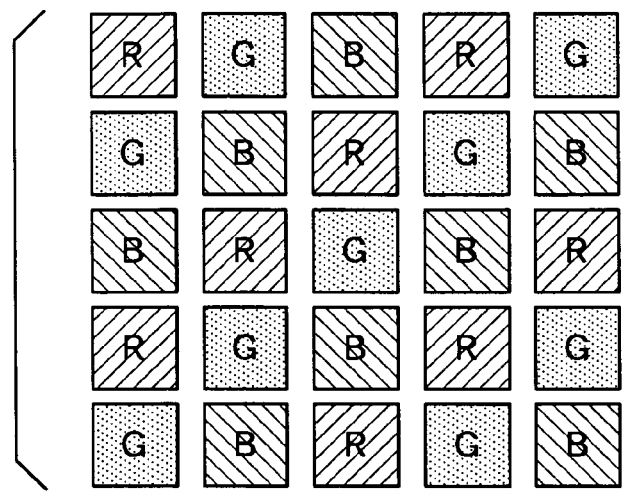
F I G. 3 1 A
MOSAIC
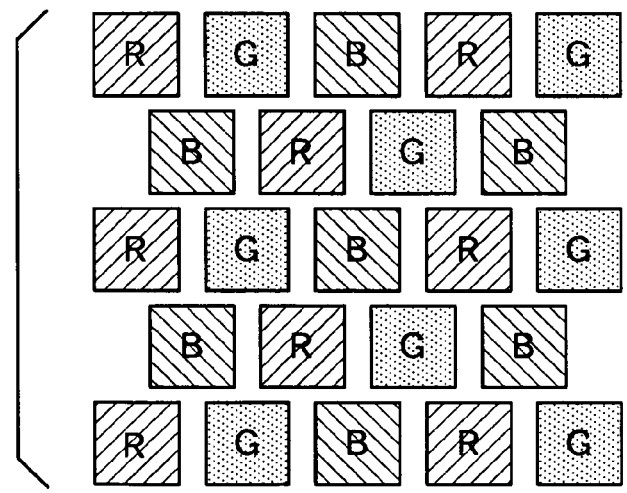
F I G. 3 1 B
DELTA
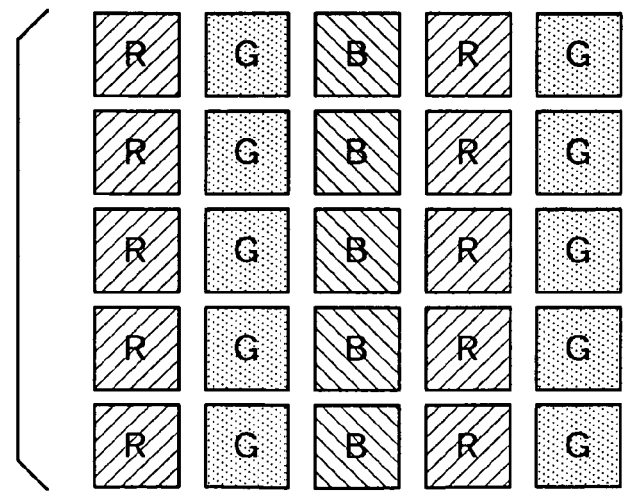
F I G. 3 1 C
STRIPE

MOSAIC

DELTA

STRIPE

FIG. 39
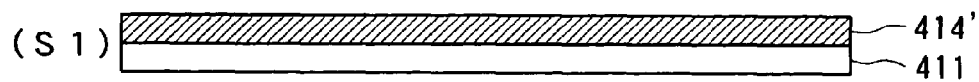
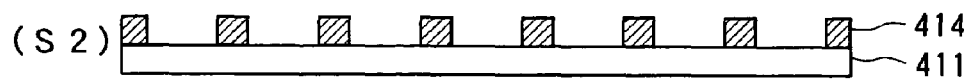
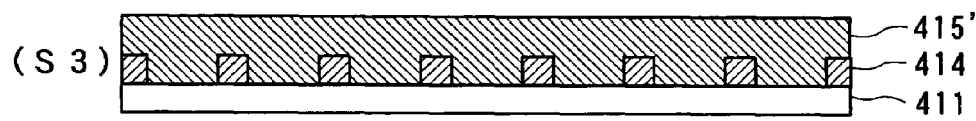
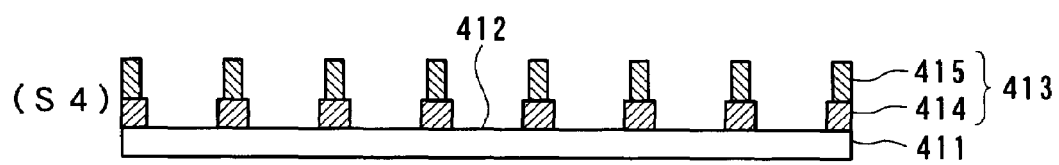
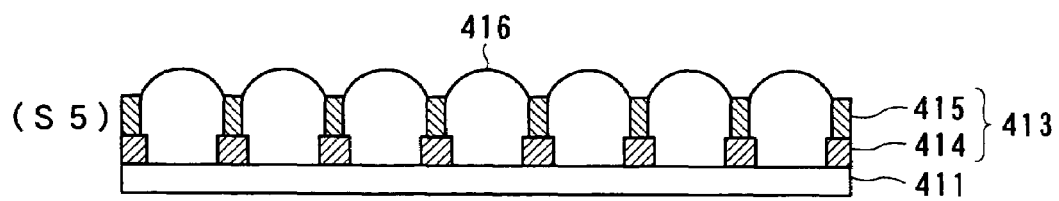
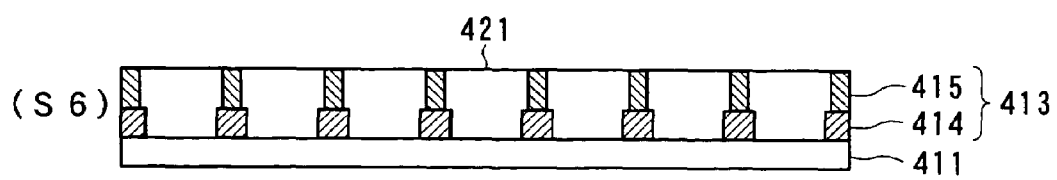
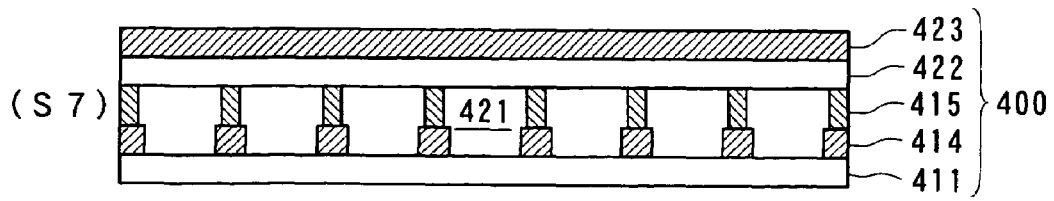

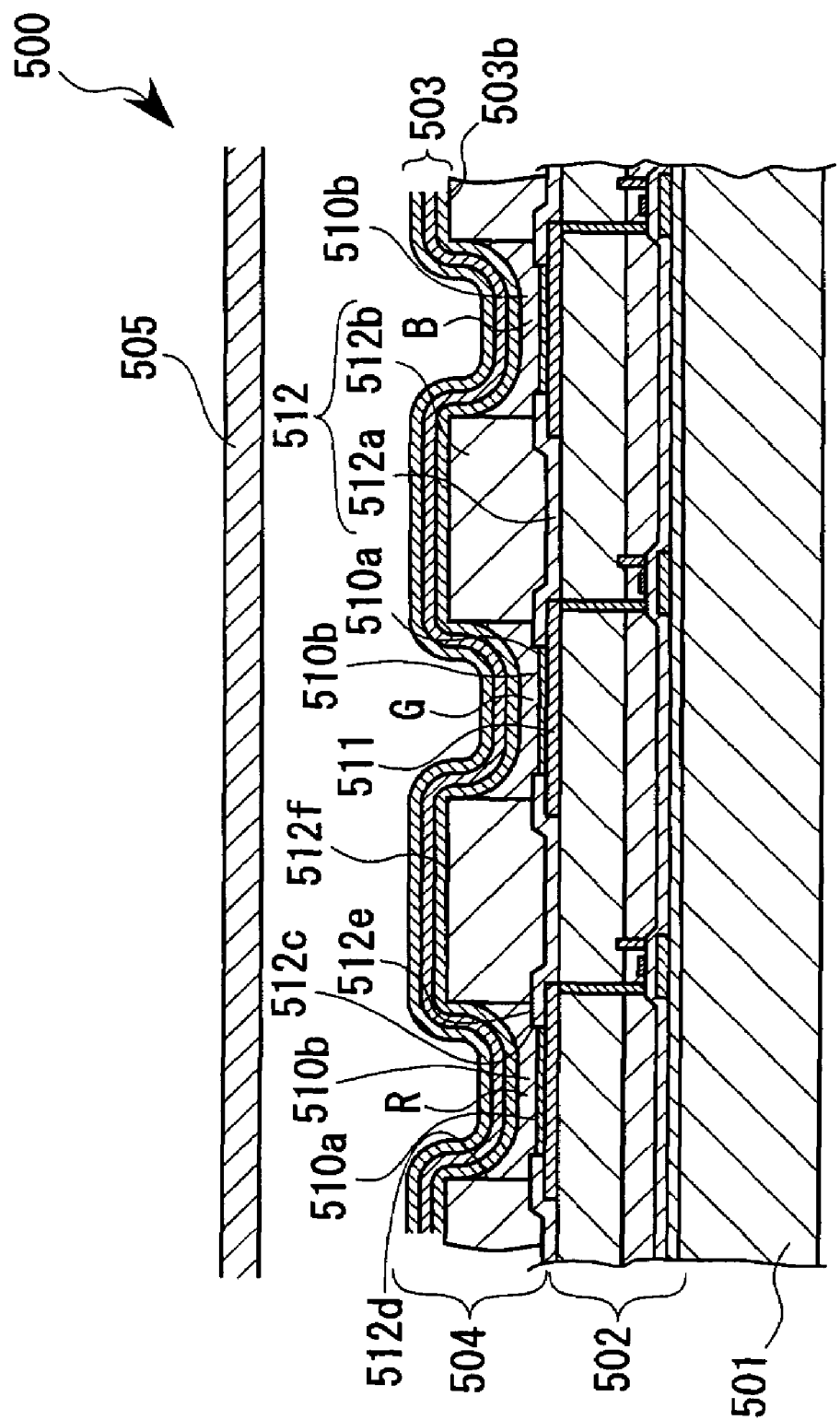

METHOD OF GENERATING EJECTION PATTERN DATA, AND HEAD MOTION PATTERN DATA; APPARATUS FOR GENERATING EJECTION PATTERN DATA; APPARATUS FOR EJECTING FUNCTIONAL LIQUID DROPLET; DRAWING SYSTEM; METHOD OF MANUFACTURING ORGANIC EL DEVICE, ELECTRON EMITTING DEVICE, PDP DEVICE, ELECTROPHORESIS DISPLAY DEVICE, COLOR FILTER, AND ORGANIC EL; AND METHOD OF FORMING SPACER, METAL WIRING, LENS, RESIST, AND LIGHT DIFFUSER

BACKGROUND

This is a Division of application Ser. No. 10/367,840 filed Feb. 19, 2003 now U.S. Pat. No. 6,863,370. The entire disclosure of the prior application is hereby incorporated by reference herein in its entirety.

This invention relates to: a method of generating ejection pattern data for selectively ejecting a functional liquid droplet from a functional liquid ejection head to a work or workpiece, and a method of generating head motion pattern data; an apparatus for generating ejection pattern data, and an apparatus for ejecting functional liquid droplets; a drawing system; a method of manufacturing a liquid crystal display device, a method of manufacturing an organic electroluminescence (EL) device, a method of manufacturing an electron emitting device, a method of manufacturing a plasma display panel (PDP) device, a method of manufacturing an electrophoresis display device, a method of manufacturing a color filter, and a method of manufacturing an organic EL; a method of forming a spacer, a method of forming metal wiring, a method of forming a lens, a method of forming a resist, and a method of forming a light diffuser.

Conventionally, in a functional liquid droplet ejection device, such as an ink jet printer, which ejects ink (functional liquid droplets) from an array of nozzles arranged at the same pitch on an ink jet head (functional liquid droplet ejection head) for forming of dots, drawing is carried out by moving one ink jet head in a main scanning direction and a sub scanning direction relative to a workpiece. In this case, ejection pattern data (drawing or imaging pattern data) indicative of a pattern of ejections from the nozzles are generated for each of nozzle arrays (heads), and the generated data are sequentially supplied to a head driving device for ejection (drawing) of functional liquid droplets equivalent to one array.

However, in a large-sized printer or the like, in view of a yield of functional liquid droplet ejection heads, all (one-line) nozzles arranged in the sub scanning direction are formed not by a single functional liquid droplet ejection head but by a plurality of functional liquid droplet ejection heads. For this reason, assuming that one line is formed by arranging six functional liquid droplet ejection heads each having two arrays of nozzles, it is necessary to form ejection pattern data for a total of twelve arrays of nozzles. However, the amount of ejection pattern data for the twelve arrays of nozzles is enormous so that it is practically impossible to generate ejection pattern data by the conventional method of generating ejection pattern data for each of the nozzle arrays.

SUMMARY

This invention has a feature of providing: a method of generating ejection pattern data in which ejection pattern data for each nozzle can be easily generated when an image is drawn by selectively ejecting functional liquid droplets from a plurality of nozzles arranged in an array in a plurality of functional liquid droplet ejection heads; and a method of generating head motion pattern data; an apparatus for generating ejection pattern data, and an apparatus for ejecting functional liquid droplets; a drawing system; a method of manufacturing a liquid crystal display device, a method of manufacturing an organic EL device, a method of manufacturing an electron emitting device, a method of manufacturing a PDP device, a method of manufacturing an electrophoresis display device, a method of manufacturing a color filter, and a method of manufacturing an organic EL; and a method of forming a spacer, a method of forming metal wiring, a method of forming a lens, a method of forming a resist, and a method of forming a light diffuser.

According to one aspect of the invention, there is provided a method of generating ejection pattern data for a plurality of nozzles formed in an array in a functional liquid droplet ejection head, the ejection pattern data being used for selectively ejecting functional liquid droplets from the nozzles, to thereby draw on at least one chip-forming area on a workpiece. The method comprises: a pixel-setting step of setting pixel information concerning an array of pixels in the at least one chip-forming area; a chip-setting step of setting chip information concerning an array of the at least one chip-forming area on the workpiece; a nozzle-setting step of setting nozzle information concerning an array of the nozzles; and a data-generating step of generating the ejection pattern data for the nozzles from the pixel information, the chip information, and the nozzle information, based on a positional relationship between the workpiece and the functional liquid droplet ejection head.

According to another aspect of the invention, there is provided an ejection pattern data-generating device that generates ejection pattern data for a plurality of nozzles formed in an array in a functional liquid droplet ejection head, the ejection pattern data being used for selectively ejecting functional liquid droplets from the nozzles, to thereby draw on at least one chip-forming area on a workpiece. The ejection pattern data-generating device comprises: pixel-setting means for setting pixel information concerning an array of pixels in the at least one chip-forming area; chip-setting means for setting chip information concerning an array of the at least one chip-forming area on the workpiece; nozzle-setting means for setting nozzle information concerning an array of the nozzles; storage means for storing the pixel information, the chip information, and the nozzle information, which have been set; and data-generating means for generating the ejection pattern data for the nozzles based on a positional relationship between the workpiece and the functional liquid droplet ejection head, and each information stored in the storage means.

According to the above arrangement, ejection pattern data are generated based on a positional relationship between the workpiece and the functional liquid droplet ejection head as well as the set pixel information, chip information, and nozzle information. Therefore, it is possible to collectively generate ejection pattern data for all the nozzles. In other words, it is possible to generate ejection pattern data for each nozzle easily and quickly, irrespective of the number of the nozzles.

Preferably, the pixel information includes color information of the functional liquid droplets and, in the data-generating step, the ejection pattern data are generated on a color-by-color basis.

Further, in this case, the pixel information preferably includes color information of the functional liquid droplets, and the data-generating means generates the ejection pattern data on a color-by-color basis.

According to the above arrangement, since ejection pattern data are generated on a color-by-color basis, it is possible to carry out drawing processing easily when the drawing on chip-forming areas is carried out by using a plurality of colors.

In these cases, the plurality of nozzles preferably form at least one array of nozzles arranged in a straight line, and the nozzle information includes information concerning a reference position of the at least one array of nozzles.

According to this arrangement, since the plurality of nozzles form at least one array of nozzles arranged in a straight line, and hence only by setting information concerning a reference position of the nozzle arrays, it is possible to set the layout of all nozzles forming the nozzle arrays collectively. Therefore, it is possible to save the trouble of setting positions of all nozzles.

In this case, the nozzle information preferably includes information concerning locations of unused nozzles in the at least one array of nozzles.

According to this arrangement, the amount of ejected functional liquid droplets varies with the position of a nozzle, e.g. when nozzles of ejecting functional liquid droplets by a piezo method are used. However, by inhibiting the use of those nozzles suffering from variation in the ejection amount, it is possible to stabilize the ejection amount.

In these cases, the nozzle information preferably includes information concerning a nozzle pitch in the main scanning direction or the sub scanning direction of the functional liquid droplet ejection head, or information concerning an inclination of the at least one array of nozzles with respect to the main scanning direction or the sub scanning direction.

According to this arrangement, it is possible to set information concerning a nozzle pitch in the main scanning direction or the sub scanning direction of the functional liquid droplet ejection head, or information concerning an inclination of the at least one array of nozzles with respect to the main scanning direction or the sub scanning direction. Therefore, it is possible to change the nozzle pitch according to an object to which functional liquid droplets are to be ejected.

In these cases, the functional liquid droplet ejection head preferably comprises a plurality of unitary heads having the at least one array of nozzles arranged therein.

According to this arrangement, the functional liquid droplet ejection head comprises a plurality of unitary heads having the at least one array of nozzles arranged therein. Therefore, it is possible to mass-produce unitary heads of the same model, which makes it possible to manufacture functional liquid droplet ejection heads at a low cost.

In these cases, the pixel information preferably includes information about which of a mosaic layout, a delta layout, and a stripe layout is employed in the arrangement of the pixels.

According to this arrangement, it is possible to set any of general types of pixel layouts, i.e., a mosaic layout, a delta layout, and a stripe layout. In other words, it is possible to generate ejection pattern data enabling drawing in any of these layouts.

In these cases, the pixel information preferably includes information of the number of pixels, a pixel size, and a pitch between adjacent ones of the pixels.

According to this construction, it is possible to generate ejection pattern data which enable drawing according to any of various settings of the number of pixels, the pixel size, and the pitch between adjacent ones of the pixels (pixel pitch).

In these cases, the chip information preferably includes a direction of placement of the at least one chip-forming area on the workpiece, the number of the at least one chip-forming area, the chip-forming area size, and the pitch between adjacent ones of the chip-forming areas.

According to this arrangement, it is possible to generate ejection pattern data enabling drawing according to any of various settings of the direction of placement of the at least one chip-forming area on the workpiece, the number of the at least one chip-forming area, the chip-forming area size, and the pitch between adjacent ones of the chip-forming areas (the pitch between the chip-forming ditances).

In these cases, the ejection pattern data-generating method preferably further includes an ejection position-setting step of setting ejection position-setting information concerning a position within each pixel to which functional liquid droplets are to be ejected and, in the data-generating step, ejection pattern data for the nozzles are generated based on the ejection position information.

Further, preferably, the ejection pattern data-generating device further includes ejection position-setting means for setting ejection position-setting information concerning a position within each pixel to which functional liquid droplets are to be ejected, and the data-generating means generates the ejection pattern data for the nozzles based on the ejection position information.

According to this arrangement, it is possible to set a position within each pixel to which functional liquid droplets are to be ejected, and hence it is possible to cause the droplets to be landed at a desired location.

Preferably, the ejection pattern data-generating method further includes an ejection count-setting step of setting ejection count information concerning the number of times of ejection of functional liquid droplets per pixel and, in the data-generating step, the ejection pattern data for the nozzles are generated based on the ejection count information.

Also, the ejection pattern data-generating device preferably further includes ejection count-setting means for setting ejection count information concerning the number of times of ejection of functional liquid droplets per pixel, and the data-generating means generates the ejection pattern data for the nozzles based on the ejection count information.

According to the above arrangement, it is possible to set the number of times of ejection of functional liquid droplets to each pixel. In other words, the number of dots per pixel can be set, e.g. to four, eight, or any other desired value.

Preferably, the ejection pattern data-generating method further includes a nozzle shift-setting step of setting nozzle shift information such that functional liquid droplets are ejected from different nozzles, when the number of times of ejection is set to a plural number in the ejection count-setting step and, in the data-generating step, the ejection pattern data for the ejection nozzles are generated based on the nozzle shift information.

The ejection pattern data-generating device preferably further includes nozzle shift-setting means for setting nozzle shift information such that functional liquid droplets are ejected from different nozzles, when the number of times of ejection is set to a plural number in the ejection count-setting step, and the data-generating means generates the ejection pattern data for the ejection nozzles based on the nozzle shift information.

According to the above arrangement, it is possible to divide the ejecting operation into a plurality of operations, and eject functional liquid droplets from different nozzles in these operations, respectively. Therefore, it is possible to make the amount of functional liquid droplets ejected to one pixel to equal to or closer to an average value, even when the amount of ejected functional liquid droplets is varied depending on a nozzle.

Preferably, the ejection pattern data-generating method further includes a position shift-setting step of setting position shift information such that functional liquid droplets are ejected to different ejection positions, when the number of times of ejection is set to a plural number in the ejection count-setting step and, in the data-generating step, the ejection pattern data for the ejection nozzles are generated based on the position shift information.

The ejection pattern data-generating device preferably further includes position shift-setting means for setting position shift information such that functional liquid droplets are ejected to different ejection positions, when the number of times of ejection is set to a plural number in the ejection count-setting step, and the data-generating means generates the ejection pattern data for the ejection nozzles based on the position shift information.

According to the above arrangement, it is possible to divide the ejecting operation into a plurality of operations, and eject functional liquid droplets to different positions within one pixel in these operations, respectively. Therefore, it is possible to draw one pixel without irregularity.

According to still another aspect of the invention, there is provided a head motion pattern data-generating method of generating head motion pattern data for a functional liquid droplet ejection head having a plurality of nozzles arranged in an array, the head motion pattern data being used for driving the functional liquid droplet ejection head while moving the functional liquid droplet ejection head relative to a workpiece, and selectively ejecting the functional liquid droplets from the plurality of nozzles to thereby form at least one chip-forming area on the workpiece. The method comprises: a head motion setting step of setting head motion information concerning relative motion of the functional liquid droplet ejection head; a chip-setting step of setting chip information concerning an array of the at least one chip-forming area on the workpiece; a nozzle-setting step of setting nozzle information concerning an array of the nozzles; and a data-generating step of generating the head motion pattern data from the head motion information, the chip information, and the nozzle information, which have been set.

According to this arrangement, head motion pattern data for performing drawing while moving the functional liquid droplet ejection head relative to a workpiece are generated based on head motion information, chip information, and nozzle information. Therefore, it is possible to collectively generate head motion pattern data for all the heads. In other words, it is possible to generate head motion pattern data for each head easily and quickly, irrespective of the number of the heads.

Preferably, the plurality of nozzles form at least one array of nozzles arranged in a straight line, and the nozzle information includes information concerning a reference position of the at least one array of nozzles.

According to this arrangement, since the plurality of nozzles form at least one array of nozzles arranged in a straight line, and hence only by setting information concerning a reference position of the nozzle arrays, it is possible to set the layout of all nozzles forming the nozzle arrays collectively. Therefore, it is possible to save the trouble of setting positions of all nozzles.

Preferably, the functional liquid droplet ejection head is arranged on a carriage, and the nozzle information includes information of relative position between an alignment mark formed on the carriage and a reference position of the at least one array of nozzles.

According to this arrangement, it is possible to set a relative position of the reference position of the nozzle arrays, with reference to an alignment mark formed on a carriage carrying the functional liquid droplet ejection head. The alignment enables functional liquid droplets to be accurately ejected to positions on the workpiece.

The nozzle information preferably includes information concerning a nozzle pitch in the main scanning direction or the sub scanning direction of the functional liquid droplet ejection head, or information concerning an inclination of the at least one array of nozzles with respect to the main scanning direction or the sub scanning direction.

According to this arrangement, it is possible to set information concerning a nozzle pitch in the main scanning direction or the sub scanning direction of the functional liquid droplet ejection head, or information concerning an inclination of the at least one array of nozzles with respect to the main scanning direction or the sub scanning direction. Therefore, it is possible to change the nozzle pitch according to an object to which functional liquid droplets are to be ejected.

Preferably, the functional liquid droplet ejection head comprises a plurality of unitary heads having the at least one array of nozzles arranged therein.

According to this arrangement, the functional liquid droplet ejection head comprises a plurality of unitary heads having the at least one array of nozzles arranged therein. Therefore, it is possible to mass-produce unitary heads of the same model, which makes it possible to manufacture functional liquid droplet ejection heads at a low cost.

Preferably, the chip information includes information of a relative position between an alignment mark formed on the workpiece and a leading chip-forming area on which drawing is first carried out.

According to this arrangement, it is possible to set a relative position of a leading chip-forming area on which drawing is first carried out, with reference to an alignment mark formed on the workpiece. Therefore, the alignment enables drawing of chip-forming areas at respective accurate locations on the workpiece.

The head motion pattern data-generating method preferably further includes an ejection position-setting step of setting ejection position-setting information concerning a position within each pixel to which functional liquid droplets are to be ejected and, in the data-generating step, the head motion pattern data are generated based on the ejection position information.

According to this arrangement, it is possible to set a position within each pixel to which functional liquid droplets are to be ejected, and hence it is possible to cause the droplets to be landed at a desired location.

Preferably, the head motion pattern data-generating method further includes an ejection count-setting step of setting ejection count information concerning a number of times of ejection of functional liquid droplets per pixel and, in the data-generating step, the head motion pattern data for the nozzles are generated based on the ejection count information.

According to this arrangement, it is possible to set the number of times of ejection of functional liquid droplets to each pixel. In other words, the number of dots per pixel can be set, e.g. to four, eight, or any other desired value.

Preferably, the head motion pattern data-generating method further includes a nozzle shift-setting step of setting nozzle shift information such that functional liquid droplets are ejected from different nozzles, when the number of times of ejection is set to a plural number in the ejection count-setting step and, in the data-generating step, the head motion pattern data are generated based on the nozzle shift information.

According to this arrangement, it is possible to divide the ejecting operation into a plurality of operations, and eject functional liquid droplets from different nozzles in these operations, respectively. Therefore, it is possible to make the amount of functional liquid droplets ejected to one pixel to equal to or closer to an average value, even when the amount of ejected functional liquid droplets is varied depending on a nozzle.

Preferably, the head motion pattern data-generating method further includes a position shift-setting step of setting position shift information such that functional liquid droplets are ejected to different ejection positions, when the number of times of ejection is set to a plural number in the ejection count-setting step and, in the data-generating step, the head motion pattern data are generated based on the position shift information.

The head motion pattern data-generating method preferably further includes a pixel-setting step of setting pixel information concerning an array of pixels in the at least one chip-forming area and, in the data-generating step, the head motion pattern data are generated based on the pixel information.

According to this arrangement, it is possible to generate head motion pattern data which enable drawing in a various layouts of pixels.

Preferably, the head motion pattern data-generating method further includes a temperature-setting step of setting temperature information concerning an environmental temperature of the workpiece and, in the data-generating step, the head motion pattern data are generated based on the temperature information.

According to this arrangement, it is possible to generate head motion pattern data by taking into account an expansion or contraction of a workpiece due to temperature. Therefore, it is possible to cause functional liquid droplets to be accurately landed at desired positions.

According to a still another aspect of the invention, there is provided a functional liquid droplet ejection device comprising any of the ejection pattern data-generating devices described above.

According to this arrangement, it is possible to provide a functional liquid droplet ejection device capable of generating ejection pattern data easily and quickly irrespective of the number of nozzles (number of functional liquid droplet ejection nozzles).

The functional liquid droplet ejection device preferably further includes head motion-setting means for setting head motion information concerning relative motion of the functional liquid droplet ejection head with respect to the workpiece, and head motion pattern data-generating means for generating head motion pattern data for the functional liquid droplet ejection head based on each information stored in the storage means and the head motion information.

According to this arrangement, it is possible to collectively generate ejection pattern data for the nozzles and head motion pattern data for moving the functional liquid droplet ejection heads easily and quickly.

According to a still further aspect of the invention, there is provided a drawing system comprising a plurality of the functional liquid droplet ejection devices as described above, in a manner associated with a plurality of colors, and drawing means for drawing on the at least one chip-forming area based on the ejection pattern data generated on a color-by-color basis, by the plurality of the functional liquid droplet ejection devices.

According to this arrangement, it is possible to draw chip-forming areas based on ejection pattern data generated based on a color-by-color basis by the plurality of functional liquid droplet ejection devices. That is, even when drawing in one color is carried out by a single functional liquid droplet ejection device (functional liquid droplet ejection head), it is possible to collectively generate ejection pattern data for a plurality of colors easily and quickly.

Preferably, the functional liquid droplet ejection heads arranged on the plurality of the functional liquid droplet ejection devices have respective arrays of nozzles arranged in the same number and in the same layout, and assuming that identical nozzle numbers are assigned to nozzles of each array, respectively, starting from one end of the array, the drawing means is inhibited from ejecting the functional liquid droplets to pixels adjacent to each other from nozzles having the same nozzle number.

According to the above arrangement, the functional liquid droplet ejection heads associated with a plurality of colors have respective arrays of nozzles arranged in the same number and in the same layout, and assuming that identical nozzle numbers are assigned to nozzles of each array, respectively, starting from one end of the array, do not eject the functional liquid droplets to pixels adjacent to each other from nozzles having the same nozzle number. Therefore, it is possible to make uniform the amounts of functional liquid droplets ejected from the nozzles, as a whole. More specifically, assuming that adjacent pixels are R (red), and G (green), if functional liquid droplets are ejected to the pixel of R by a nozzle number (x), it is possible to make it difficult to recognize unevenness of ejection by the eye by carrying out ejection of function liquid droplets to the pixel of G by a nozzle number (x+10), for instance.

According to another aspect of the invention, there is provided a method of manufacturing a liquid crystal display device, by using the functional liquid droplet ejection device described above, the liquid crystal display device having a multiplicity of filter elements formed on a substrate of a color filter thereof. The method comprises: introducing filter materials of colors into a plurality of the functional liquid droplet ejection heads; and forming a multiplicity of filter elements by causing the functional liquid droplet ejection heads to scan relative to the substrate and selectively eject the filter materials.

According to still another aspect of the invention, there is provided a method of manufacturing an organic EL device, by using the functional liquid droplet ejection device described above, the organic EL device having EL light-emitting layers formed on a multiplicity of pixels on a substrate thereof. The method comprises: introducing light-emitting materials of colors into a plurality of the functional liquid droplet ejection heads; and forming a multiplicity of the EL light-emitting layers by causing the functional liquid droplet ejection heads to scan relative to the substrate and selectively eject the light-emitting materials.

According to still another aspect of the invention, there is provided a method of manufacturing an electron emitting device, by using the functional liquid droplet ejection device described above, the electron emitting device having a multiplicity of phosphors formed on electrodes thereof. The method comprise: introducing fluorescent materials into a plurality of the functional liquid droplet ejection heads; and forming the phosphors by causing the functional liquid droplet ejection head to scan relative to the electrodes and selectively eject the fluorescent materials.

According to another aspect of the invention, there is provided a method of manufacturing a PDP device, by using the functional liquid droplet ejection device described above, the PDP device having a multiplicity of phosphors formed in concave portions of a back substrate thereof. The method comprises: introducing fluorescent materials into a plurality of the functional liquid droplet ejection heads; and forming the large number of phosphors by causing the functional liquid droplet ejection heads to scan relative to the back substrate and selectively eject the fluorescent materials.

According to a still further aspect of the invention, there is provided a method of manufacturing an electrophoresis display device, by using the functional liquid droplet ejection device described above, the electrophoresis display device having a multiplicity of migration elements formed in concave portions of electrodes thereof. The method comprises: introducing migration element materials into a plurality of the functional liquid droplet ejection heads; and forming the multiplicity of migration elements by causing the functional liquid droplet ejection heads to scan relative to the electrodes and selectively eject the migration element materials.

As described above, the functional liquid droplet ejection device is applied to the method of manufacturing a liquid crystal display device, the method of manufacturing an organic EL device, the method of manufacturing an electron emitting device, the method of manufacturing a PDP device, and the method of manufacturing an electrophoresis display device, whereby it is possible to selectively supply filter materials and light-emitting materials necessary for manufacturing those devices, at appropriate positions in appropriate amounts. Further, in general, the functional liquid droplet ejection heads are moved for main scanning and sub scanning. However, when so-called "one line" is formed by a single liquid droplet ejection head, the head is moved only for sub scanning. Further, the electron emitting device is a concept including a Field Emission Display (FED) device.

According to another aspect of the invention, there is provided a method of manufacturing a color filter by using the functional liquid droplet ejection device described above, the color filter having a multiplicity of filter elements arranged on a substrate thereof. The method comprises: introducing filter materials into a plurality of the functional liquid droplet ejection heads; and forming a multiplicity of filter elements by causing the functional liquid droplet ejection heads to scan relative to the substrate and selectively eject the filter materials.

In this case, preferably, the color filter includes an overcoating layer covering the multiplicity of filter elements, and the method further includes, subsequent to forming of the filter elements, introducing a transparent coating material into the plurality of the functional liquid droplet ejection heads, and forming the overcoating layer by causing the functional liquid droplet ejection heads to scan relative to the substrate and selectively eject the coating material.

According to another aspect of the invention, there is provided a method of manufacturing an organic EL, by using the functional liquid droplet ejection device described above, the organic EL having a multiplicity of pixels, including EL light-emitting layers, arranged on a substrate thereof. The method comprise: introducing light-emitting materials into a plurality of the functional liquid droplet ejection heads; and forming a multiplicity of EL light-emitting layers by causing the functional liquid droplet ejection heads to scan relative to the substrate and selectively eject the light-emitting materials.

In this case, the organic EL preferably includes a multiplicity of pixel electrodes formed between the EL light-emitting layers and the substrate in a manner associated with the EL light-emitting layers, respectively, and the method further includes introducing an electrode material in a liquid form into a plurality of the functional liquid droplet ejection heads, and forming the multiplicity of pixel electrodes, by causing the functional liquid droplet ejection heads to scan relative to the substrate and selectively eject the electrode material.

In this case, preferably, the organic EL has opposed electrodes formed in a manner covering the multiplicity of EL light-emitting layers, and the method further includes, subsequent to forming of the EL light-emitting layers, introducing an electrode material in a liquid form into a plurality of the functional liquid droplet ejection heads, and forming the opposed electrodes, by causing the functional liquid droplet ejection heads to scan relative to the substrate and selectively eject the electrode material in the liquid form.

According to a further aspect of the invention, there is provided a method of forming particulate spacers, by using the functional liquid droplet ejection device described above, the spacers creating very small cell gaps between two substrates. The method comprises: introducing a particle material for forming the spacers into a plurality of the functional liquid droplet ejection heads; and causing the functional liquid droplet ejection heads to scan relative to at least one of the two substrates and selectively eject the particle material, thereby forming the spacers on the substrate.

According to still another aspect of the invention, there is provided a method of forming metal wiring on a substrate, by using either of the ejection systems described above. The method comprises: introducing a metal material in a liquid form into the functional liquid droplet ejection head; and forming the metal wiring by causing the functional liquid droplet ejection head to scan relative to the substrate and selectively eject the metal material.

According to a further aspect of the invention, there is provided a method of forming a multiplicity of microlenses on a substrate, by using the functional liquid droplet ejection device described above. The method comprises: introducing a lens material into a plurality of the functional liquid droplet ejection head; and forming the large number of microlenses by causing the functional liquid droplet ejection heads to scan relative to the substrate and selectively eject the lens material.

According to a still further aspect of the invention, there is provided a method of forming a resist having a desired shape on a substrate, by using the functional liquid droplet ejection device described above. The method comprises: introducing a resist material into the functional liquid droplet ejection head; and forming the resist by causing a plurality of the functional liquid droplet ejection heads to scan relative to the substrate and selectively eject the resist material.

According to another aspect of the invention, there is provided a method of forming light diffusers on a substrate, by using the functional liquid droplet ejection device described above. The method comprises: introducing a light diffusing material into a plurality of the functional liquid droplet ejection heads; and forming the large number of light diffusers by causing the functional liquid droplet ejection heads to scan relative to the substrate and selectively eject the light diffusing material.

As described above, the functional liquid droplet ejection device described above is applied to the method of manufacturing a color filter, the method of manufacturing an organic EL, the method of forming a spacer, the method of forming metal wiring, the method of forming a lens, the method of forming a resist, and the method of forming a light diffuser, whereby it is possible to selectively supply filter materials, light-emitting materials, or the like, necessary for manufacturing various kinds of electronic devices, optical devices, or the like, at appropriate positions in appropriate amounts.

BRIEF DESCRIPTION OF THE DRAWINGS

The above and other advantages and features of this invention will become more readily apparent from the following detailed description taken in conjunction with the accompanying drawings, wherein:

FIG. 2 is a view schematically showing a functional liquid droplet ejection head according to the embodiment and a substrate;

FIG. 4 is a diagram showing an outline of methods of generating drawing data and position data;

FIG. 12 is a diagram showing a screen for entering workpiece design values 1, as an example of the operation screen according to the embodiment;

FIG. 14 is a diagram showing an input screen for setting an image, as an example of the operation screen according to the embodiment;

FIG. 15 is a diagram showing a screen for entering drawing information, as an example of the operation screen according to the embodiment;

FIG. 16 is a diagram showing a screen for entering an in-pixel drawing design, as an example of the operation screen according to the embodiment;

FIG. 20 is a diagram showing a screen for entering head carriage design values 1, as an example of the operation screen according to the embodiment;

FIG. 22 is a diagram showing an input screen for setting images, as an example of the operation screen according to the embodiment;

FIG. 25 is a diagram showing a screen for entering machine design values 2, as an example of the operation screen according to the embodiment;

FIG. 30 is a diagram showing an input screen for a bit map file format, as an example of the operation screen according to the embodiment;

FIGS. 31A to 31C are diagrams showing examples of pixel layouts, according to the embodiment;

FIGS. 38A and 38B are enlarged partial views of a color filter manufactured by a color filter-manufacturing method according to an embodiment of the invention, in which:

FIG. 38A is a schematic fragmentary plan view of the color filter; and

FIG. 38B is a cross-sectional view of the color filter taken on line B-B of FIG. 38A;

FIG. 39 provides cross-sectional views schematically showing a process of color filter being manufactured by the color filter-manufacturing method according to the embodiment;

FIG. 53 is a cross-sectional view useful in explaining a sealing process in the organic EL device manufacturing method according to the embodiment.

DETAILED DESCRIPTION OF EMBODIMENTS

Figure 1:
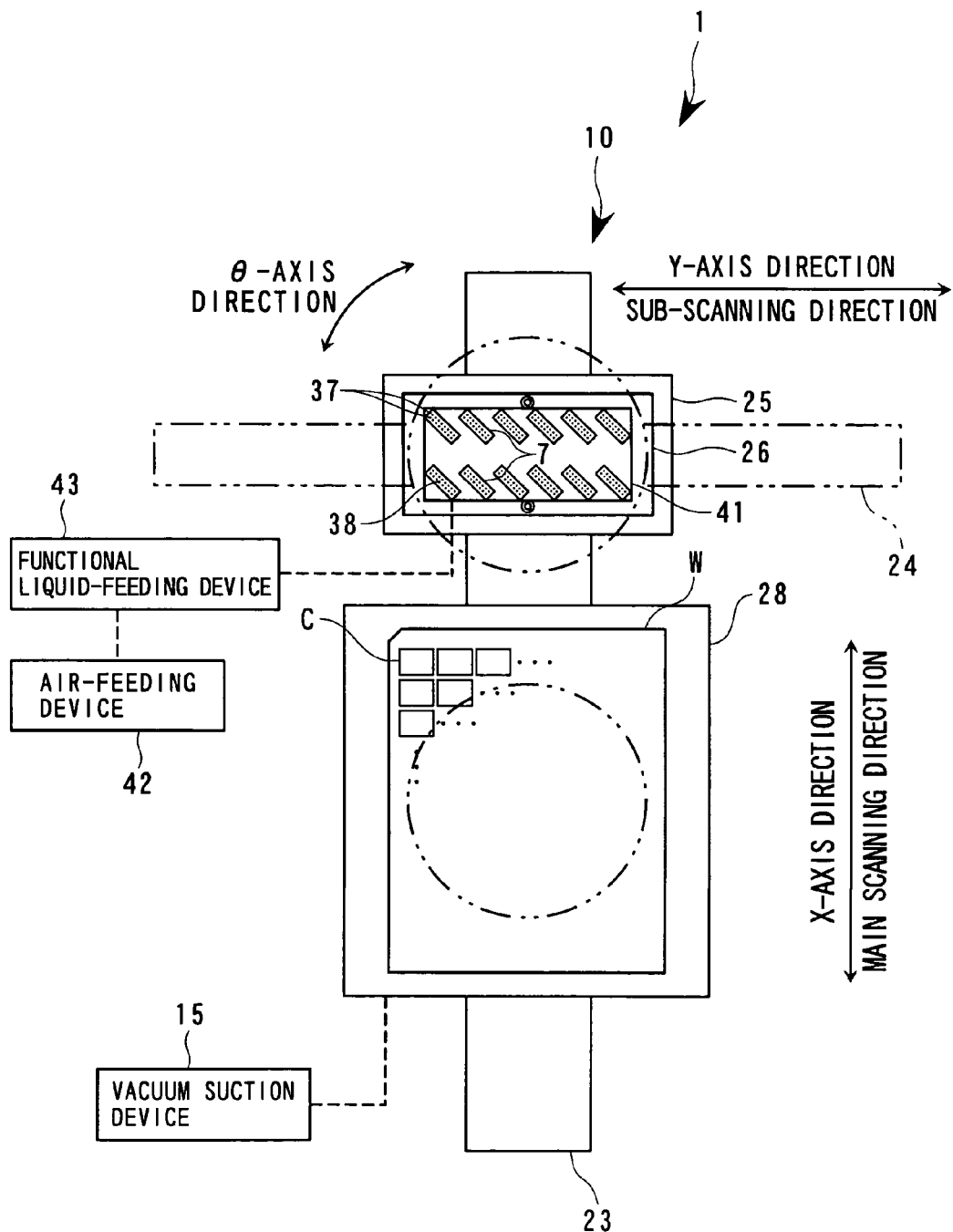
FIG. 1 is a view schematically showing a drawing system according to an embodiment of the invention.

The invention will now be described in detail with reference to the drawings showing a preferred embodiment thereof. A functional liquid droplet ejection device as a component of a drawing system is capable of accurately ejecting very small ink droplets such that the droplets are formed into dots, from a plurality of nozzles arranged on a functional liquid droplet ejection head of the device. Hence, it is expected that the functional liquid droplet ejection device can be applied to various fields of manufacturing component parts by using special inks, photosensitive or light-emitting resins, etc. as functional liquids.

An ejection pattern data-generating device, a head motion pattern data-generating device, the functional liquid droplet ejection device, and the drawing system according to the present embodiment are applied, for instance, to a manufacturing system for manufacturing so-called flat displays, such as a liquid crystal display device and an organic EL device. The manufacturing system ejects functional liquid droplets e.g. of a filter material or a light-emitting material, from a plurality of functional liquid droplet ejection heads thereof (by the ink jet method), thereby forming filter elements of R (red), G (green), and B (blue) colors used in the liquid display device, and the EL light-emitting layers and positive hole injection layers of pixels used in the organic EL device. In the present embodiment, the ejection pattern data-generating method, the head motion pattern data-generating method, and so forth will be described by taking a drawing system incorporated e.g. in a manufacturing system for manufacturing a liquid display device or the like, as an example.

As shown in FIGS. 1 and 2, the functional liquid droplet ejection device 10 as a component of the drawing system 1 includes an X-axis table 23, a Y-axis table 24 orthogonal to the X-axis table 23, a main carriage 25 provided for the Y-axis table 24, and a head unit 26 mounted on the main carriage 25. The head unit 26 has the plurality of functional liquid droplet ejection heads 7 mounted thereon via a sub-carriage 41, as will be described in detail hereinafter. Further, the functional liquid droplet ejection device 10 is configured such that a substrate (work or workpiece) W is set on a suction table 28 of the X-axis table 23 in a manner associated with the plurality of functional liquid droplet ejection heads 7.

The functional liquid droplet ejection device 10 according to the present embodiment is configured such that the substrate W is moved in synchronism with the driving of the functional liquid droplet ejection heads 7 (for selective ejection of functional liquid droplets). The so-called main scanning of the functional liquid droplet ejection heads 7 is performed in accordance with reciprocating motion of the X-axis table 23 in an X-axis direction. Further, in a manner associated with the main scanning of the heads 7, so-called sub scanning is performed in accordance with reciprocating motion of the heads 7 by the Y-axis table 24 in a Y-axis direction. It should be noted that the above main scanning may be effected only by an advancing motion (or a returning motion) of the heads 7 in the X-axis direction.

The head unit 26 includes a sub-carriage 41, and the plurality of (twelve) functional liquid droplet ejection heads 7 carried by the sub-carriage 41. The twelve functional liquid droplet ejection heads 7 are grouped into two arrays, i.e. left and right arrays each consisting of six heads. All the heads 7 are arranged in a manner inclined at a predetermined angle relative to the main scanning direction. It should be noted that the functional liquid droplet ejection heads 7 according to the present embodiment are implemented by precision heads making use of piezoelectric effects, and selectively eject very small liquid droplets onto a colored layer-forming area.

The six functional liquid droplet ejection heads 7 of each array are laid out in a manner displaced from each other with respect to the sub-scanning direction such that all the ejection nozzles 38 of the twelve heads 7 are continuous with each other (in a manner partially overlapping each other) in the sub-scanning direction. More specifically, the head layout according to the present embodiment is configured such that two arrays each consisting of six functional liquid droplet ejection heads 7 inclined in the same direction are laid out on the sub-carriage 41. By performing the main scanning with the functional liquid droplet ejection heads 7 inclined at a predetermined angle (angle θ with respect to the sub-scanning direction), as described above, it is possible to adjust a nozzle pitch between the plurality of nozzles to a pixel pitch on the substrate W. Further, each functional liquid droplet ejection head 7 has two nozzle arrays 37, 37 laid out in a manner parallel to each other. Each of the nozzle arrays 37, 37 is formed by 180 ejection nozzles 38 (schematically illustrated in the figures) aligned at a constant pitch.

However, the above layout pattern is only one example of many possible patterns. For instance, it is possible to lay out adjacent functional liquid droplet ejection heads 7, 7 in each head array at 90 degrees relative to each other (such that the adjacent heads form part of the shape of a funnel in cross section), or alternatively two functional liquid droplet ejection heads 7, 7 adjacent to each other between the head arrays at 90 degrees relative to each other (such that the two inter-array heads form part of the shape of a funnel in cross section). In any of the above cases, it is only required that dots formed by liquid droplets ejected from all the ejection nozzles 38 of the twelve heads are continuous with each other in the sub-scanning direction.

Further, if the functional liquid droplet ejection heads 7 are component parts exclusively used for substrates W of various types, respectively, it is no necessary to set the heads 7 in an inclined state, but only required to set them in a staggered layout or a stepped layout. Further, so long as nozzle arrays 37 (lines of dots) having a predetermined length can be formed, they may be arranged on a single functional liquid droplet ejection head 7 or on a plurality of functional liquid droplet ejection heads 7. In short, the number of the functional liquid droplet ejection heads 7, the number of the head arrays thereof, and further a head array pattern thereof can be set as desired.

Now, a sequence of operations carried out by the drawing system 1 will be described briefly. First, as a preparation stage, the head unit 26 for a substrate W to be worked is brought into the functional liquid droplet ejection device 10 and set on the main carriage 25. After the head unit 26 is set on the main carriage 25, the Y-axis table 24 moves the head unit 26 to the position of a head-sensing camera, not shown, to detect head alignment marks on the head unit 26 by the head-sensing camera, whereby a position of the head unit 26 is recognized. Here, theta correction of the head unit 26 is carried out based on a result of the recognition, and at the same time the position of the head unit 26 in the X-axis and Y-axis directions is corrected, not actually but by correcting data of the position. After the position correction, the head unit (main carriage 25) 26 is returned to a home position thereof.

On the other hand, when a substrate W (each substrate introduced, in this case) taken out from a magazine is introduced onto the suction table 28 of the X-axis table 23, a substrate alignment mark (see FIG. 37) is detected by a substrate-sensing camera, not shown, at this position (passing position), whereby a position of the substrate W is recognized. Here, theta correction of the substrate W is carried out based on a result of the detection, and at the same time the position of the substrate W in the X-axis and Y-axis directions is corrected, not actually but by correcting data thereof. After the position correction, the substrate (suction table 28) W is returned to a home position thereof.

After the preparation stage is thus completed, in an actual liquid droplet ejection operation, first, the X-axis table 23 is driven for causing the substrate W to reciprocate in the main scanning direction and at the same time the plurality of functional liquid droplet ejection heads 7 are driven to perform selective ejection of functional liquid droplets onto the substrate W (for forming pixels E). After the substrate W is returned, now, the Y-axis table 24 is driven to move the head unit 26 in the sub-scanning direction by one pitch, and again the substrate W is caused to reciprocate in the main scanning direction, and the plurality of functional liquid droplet ejection heads 7 are driven. By carrying out the above operation several times, the drawing on all chip-forming areas C is performed (block ejection: see FIG. 35).

After completion of drawing e.g. of R of the three colors R, G, and B which are to form the chip-forming area C, the substrate W is transported to a functional liquid droplet ejection device 10 that ejects e.g. functional liquid droplets of G, to thereby perform drawing of G. Finally, the substrate W is transferred to a functional liquid droplet ejection device 10 that ejects e.g. functional liquid droplets of B, to thereby perform drawing of B, and all the chip-forming areas C drawn in the three colors are cut out separately, whereby individual chip-forming areas C can be obtained.

On the other hand, in parallel with the above operations, functional liquid droplets are continuously fed from a functional liquid-feeding device 43 to the functional liquid droplet ejection heads 7 of the device 10 by using an air-feeding device 42 as a pressure supply source, and suction of air is carried out by a vacuum suction device 15 to attract the substrate W to the suction table 28. Further, immediately before execution of the liquid droplet ejection operation, the head unit 26 is brought to a cleaning unit, not shown, and a wiping unit, not shown, for suction of functional liquid droplets from all the ejection nozzles 38 of the functional liquid droplet ejection heads 7, and wiping of nozzle-forming surfaces of the heads 7, carried out immediately after the suction of the liquid droplets. Further, during liquid droplet ejection operation, the head unit 26 is brought to a flushing unit to carry out flushing of the heads 7 as required (see FIG. 24).

Although in the present embodiment, the substrate W onto which the head unit 26 ejects liquid droplets is moved to the head unit 26 in the main scanning direction, the head unit 26 may be configured to be moved in the main scanning direction. Further, the device may be configured such that the head unit 26 is immovable, and the substrate W is moved in the main scanning direction and the sub-scanning direction.

Figure 3:
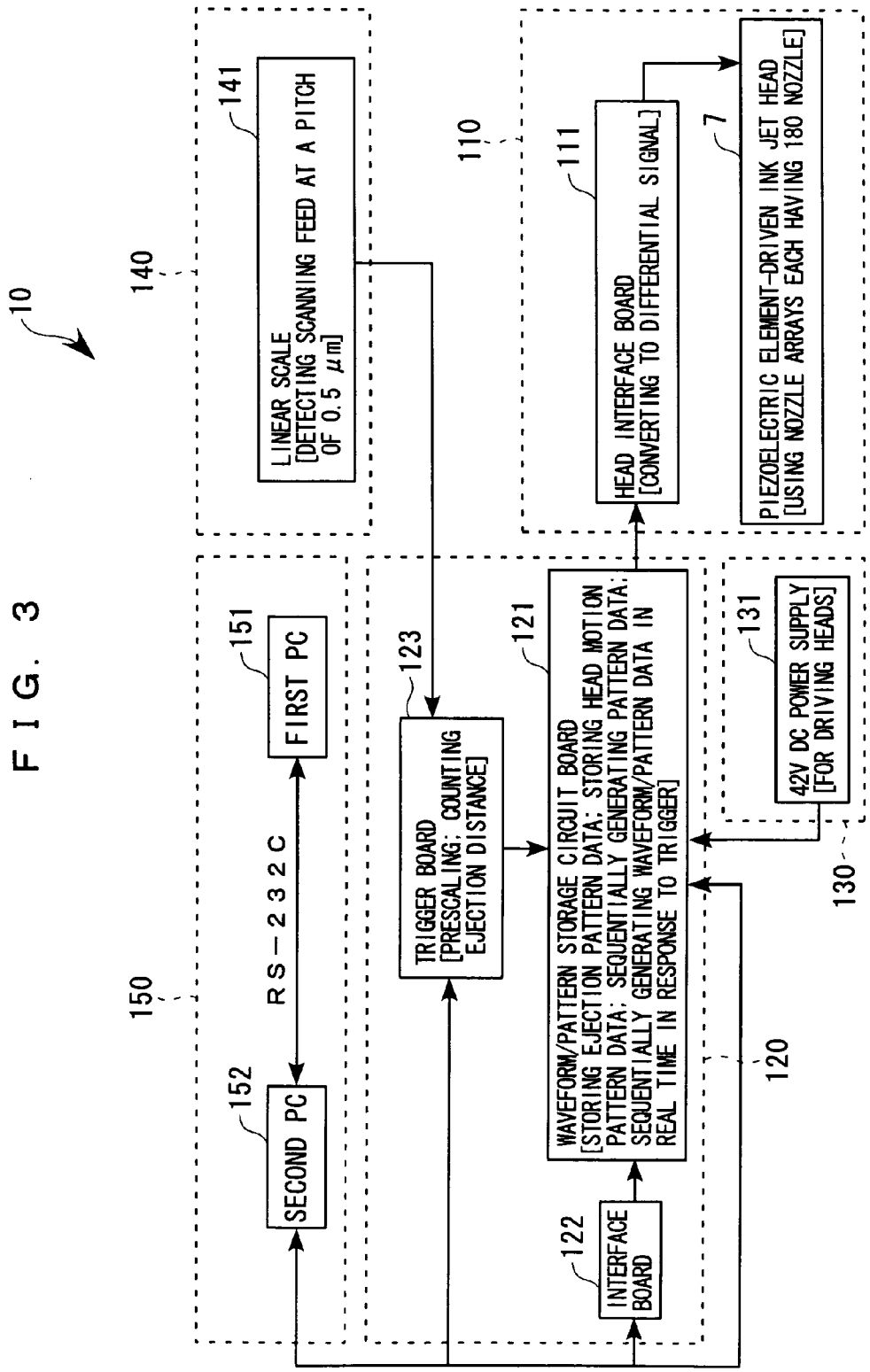
FIG. 3 is a block diagram showing a control system of a functional liquid droplet ejection device according to the embodiment.

Next, a description will be given of a control system of the functional liquid droplet ejection device 10 with reference to FIG. 3. The functional liquid droplet ejection device 10 is comprised of a head section 110 that includes the functional liquid droplet ejection heads 7 (piezoelectric element-driven ink jet heads) and a head interface board 111 for connecting the heads 7 to other sections, a driving section 120 that includes a waveform/pattern storage circuit board 121, an interface board 122 for connecting the circuit board 121 to other sections, and a trigger board 123 for transmitting a trigger pulse to the circuit board 121, and drive the functional liquid droplet ejection heads 7, a power section 130 that includes a direct current power supply 131 and supplies electric power to the waveform/pattern storage circuit board 121, a feed-detecting section 140 that includes a linear scale 141 and detects scanning feed, and a control section 150 that includes a first PC 151 for controlling the whole device, and a second PC 152 for mainly controlling the driving of the functional liquid droplet ejection heads 7.

The functional liquid droplet ejection heads 7 of the head section 110 have the above-described configuration, and two nozzle arrays each comprised of the 180 ejection nozzles 38 are used in each head. The head interface board 111 converts a signal delivered from the waveform/pattern storage circuit board 121 to a differential signal, and sends a piezoelectric element-driving signal for driving piezoelectric elements for ejection of functional liquid droplets, ejection pattern data, and head operation data, to the functional liquid droplet ejection heads 7.

The waveform/pattern storage circuit board 121 of the driving section 120 generates a driving waveform in response to a driving signal for driving the piezoelectric elements from the second PC 152. The trigger board 123, which counts the distance of ejection of functional liquid droplets based on a signal from the linear scale 141, generates a trigger pulse. In response to the trigger pulse, the waveform/pattern storage circuit board 121 sequentially reads out ejection pattern data and head operation data having been received from the second PC 152 and stored therein in advance. Further, the waveform/pattern storage circuit board 121 generates the piezoelectric element-driving waveform in accordance with waveform parameters having been received from the second PC 152 and stored therein in advance, in synchronism with the trigger pulse. Furthermore, the waveform/pattern storage circuit board 121 is supplied with electric power (for driving the heads 7) from the direct current power supply 131 of the power section 130.

The linear scale 141 of the feed-detecting section 140 detects scanning feed at a pitch of 0.5 μm to transmit a position pulse to the trigger board 123. The second PC 152 of the control section 150 is connected to the first PC 151 by RS-232C, and sends back data concerning results of driving of the heads 7 and the like in response to a command from the first PC 151. Further, the second PC 152 generates ejection pattern data, and sends a transfer control signal to the waveform/pattern storage circuit board 121 via the interface board 122 while sending a trigger control signal and an ejection control signal to the trigger board 123.

Next, a description will be given of the ejection pattern data-generating method for generating ejection pattern data for use in selective ejection of functional liquid droplets from the functional liquid droplet ejection heads 7 onto a workpiece (substrate W) for drawing thereon, and the head motion pattern data-generating method for generating head motion pattern data of the heads 7. The ejection pattern data and the head motion pattern data are collectively generated according to predetermined algorithms based on various kinds of information, set by the user, concerning the substrate W as an object on which the drawing is to be carried out and the heads 7.

As shown in FIG. 4, the user compiles information concerning a substrate W (pixel information, chip information: substrate data), information concerning the functional liquid droplet ejection heads 7 (nozzle information, head movement information: head data), and other information (compile options), together with information (device data) of the respective devices (R, G, B) to thereby generate ejection pattern data (drawing data) and head motion pattern data (position data) for the respective droplet ejection devices (colors). Since the ejection pattern data and head motion pattern data are generated on a device-by-device basis (color-by-color basis) as described above, it is possible to carry out drawing processing easily. Further, by once setting information of a substrate W and information of the functional liquid droplet ejection heads 7, it is possible to collectively generate the ejection pattern data and head motion pattern data of the color droplet ejection devices, which makes it possible to produce these data easily and quickly.

Hereafter, the description will be given by following a procedure of operations with reference to FIGS. 5 to 30 illustrating display screens of the second PC 152 storing the programs of the ejection pattern data and the head motion pattern data. It should be noted that these operations do not necessarily have to be carried out by the second PC 152, but the present operations may be performed by another PC, and the generated ejection pattern data and head motion pattern data may be recorded in a recording medium (a CD-ROM. etc.) to allow the same to be read out therefrom by the second PC 152.

Figure 5:
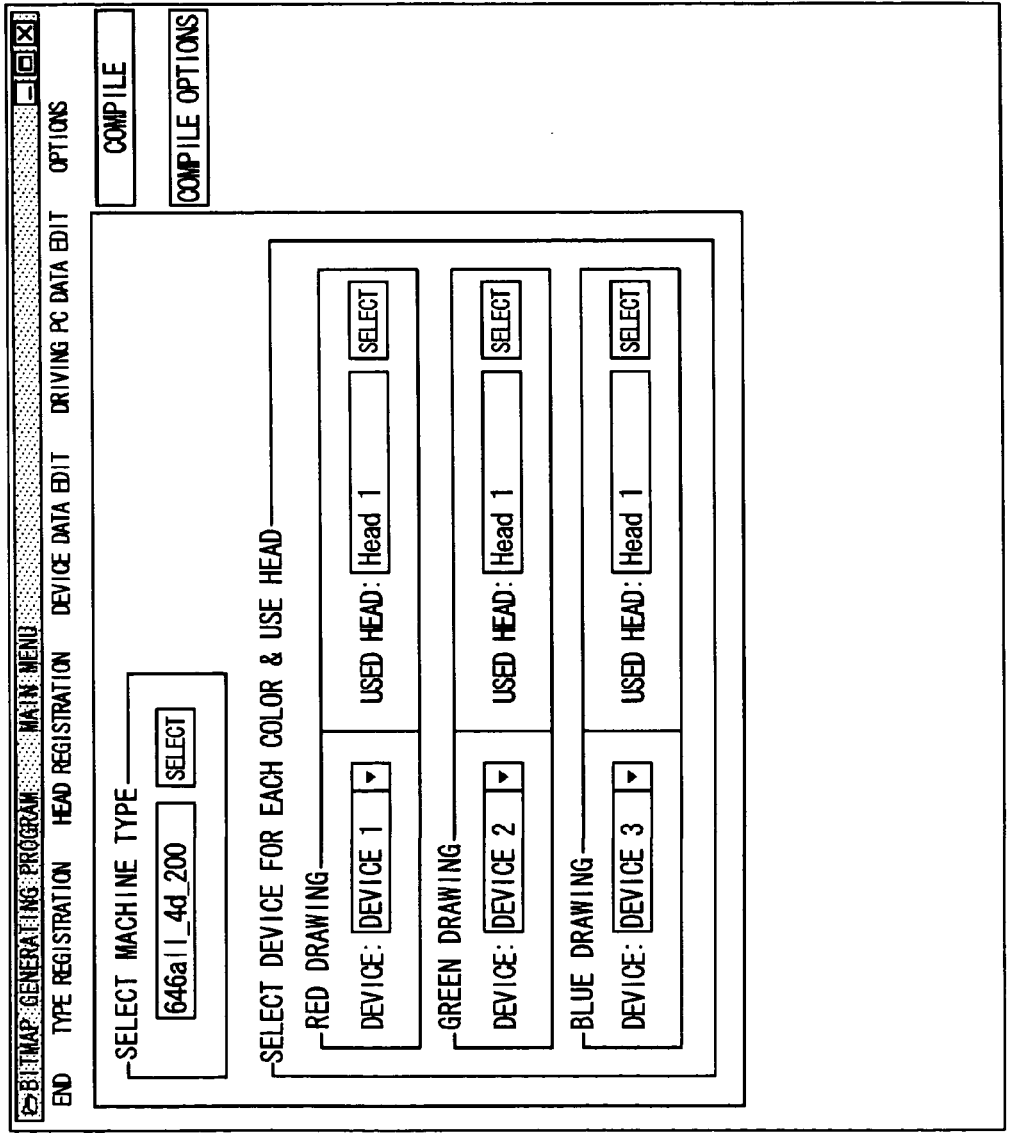
FIG. 5 is a diagram showing a main menu screen as an example of an operation screen according to the embodiment.

As shown in FIG. 5, first, the type of drawing system 1 used is selected. Then, respective liquid droplet ejection devices of the drawing system 1 for drawing colors R, G, and B and functional liquid droplet ejection heads 7 used therein are selected. In the illustrated example, all the heads are of the same type ("Head 1"), and hence it is only required to enter only information concerning the "Head 1" as head data which are to be set hereinafter (see FIGS. 18 to 23). Assuming that the functional liquid droplet ejection heads 7 used are all different types, three head data have to be entered for the respective different types of the heads.

Figure 6:
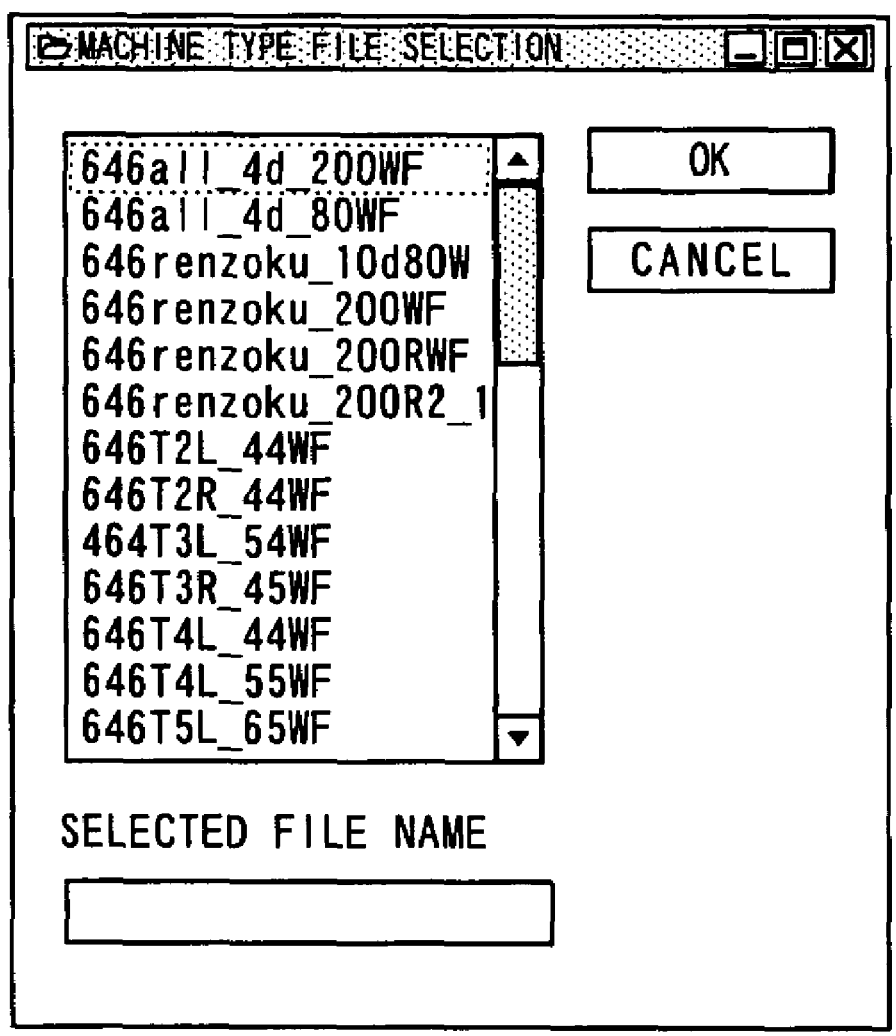
FIG. 6 is a diagram showing a screen for selecting a machine type file, as an example of the operation screen according to the embodiment.

Next, as shown in FIG. 6, a machine type file used in the selected drawing system 1 (machine type name "646all_4d_200") is selected. FIGS. 7 to 17 following FIG. 6 show edit screens for editing the machine type file selected here.

Figure 7:
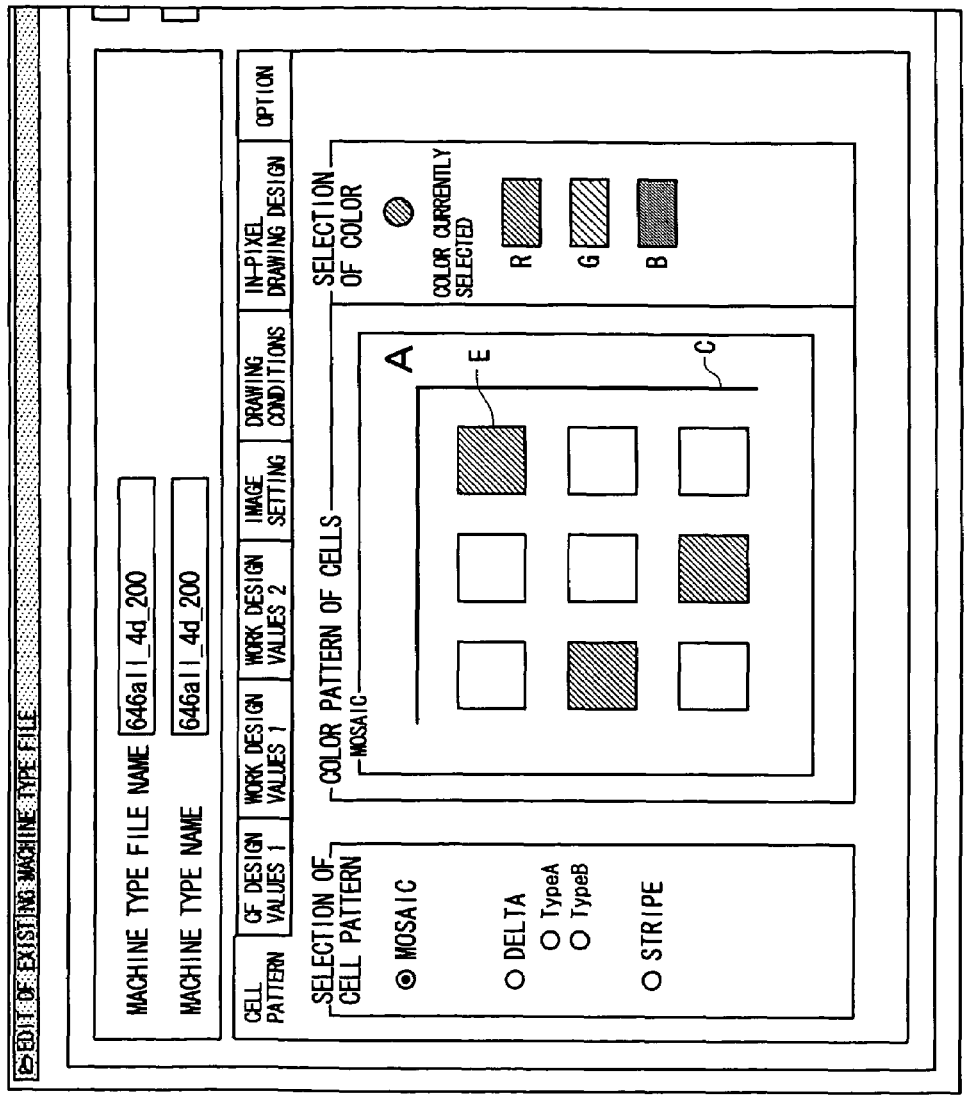
FIG. 7 is a diagram showing a screen for entering a cell pattern, as an example of the operation screen according to the embodiment.
Figure 8:
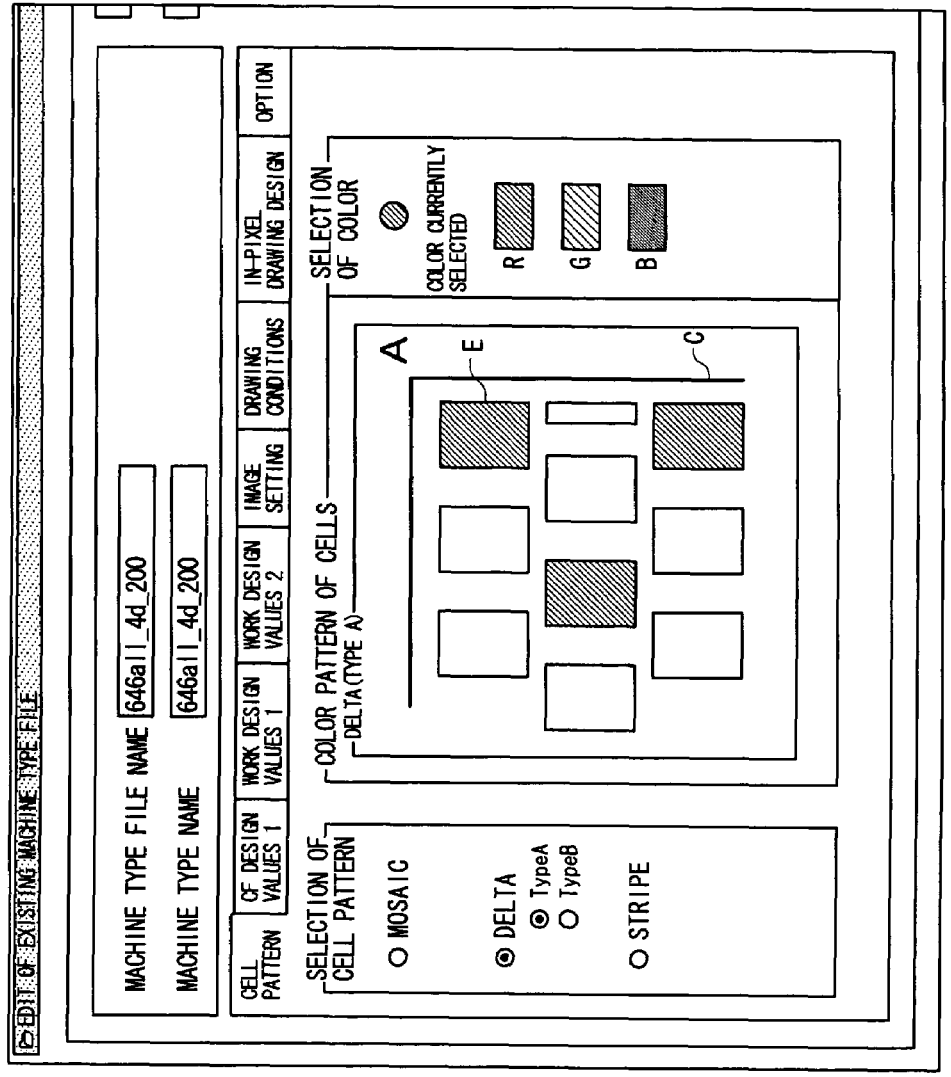
FIG. 8 is a diagram showing a screen for entering a cell pattern, different from the cell pattern shown in FIG. 7.
Figure 9:
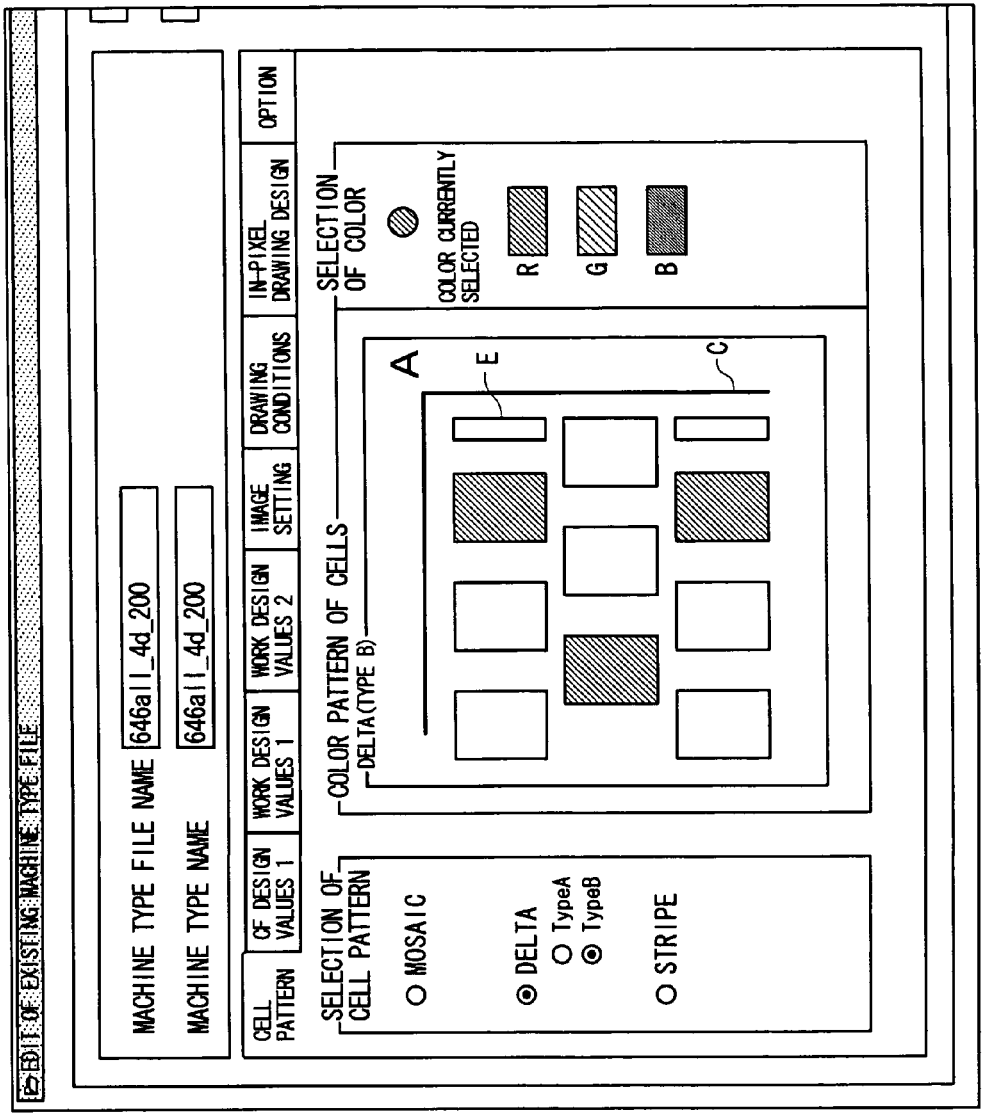
FIG. 9 is a diagram showing a screen for entering a cell pattern, different from the cell patterns shown in FIGS. 7 and 8.
Figure 10:
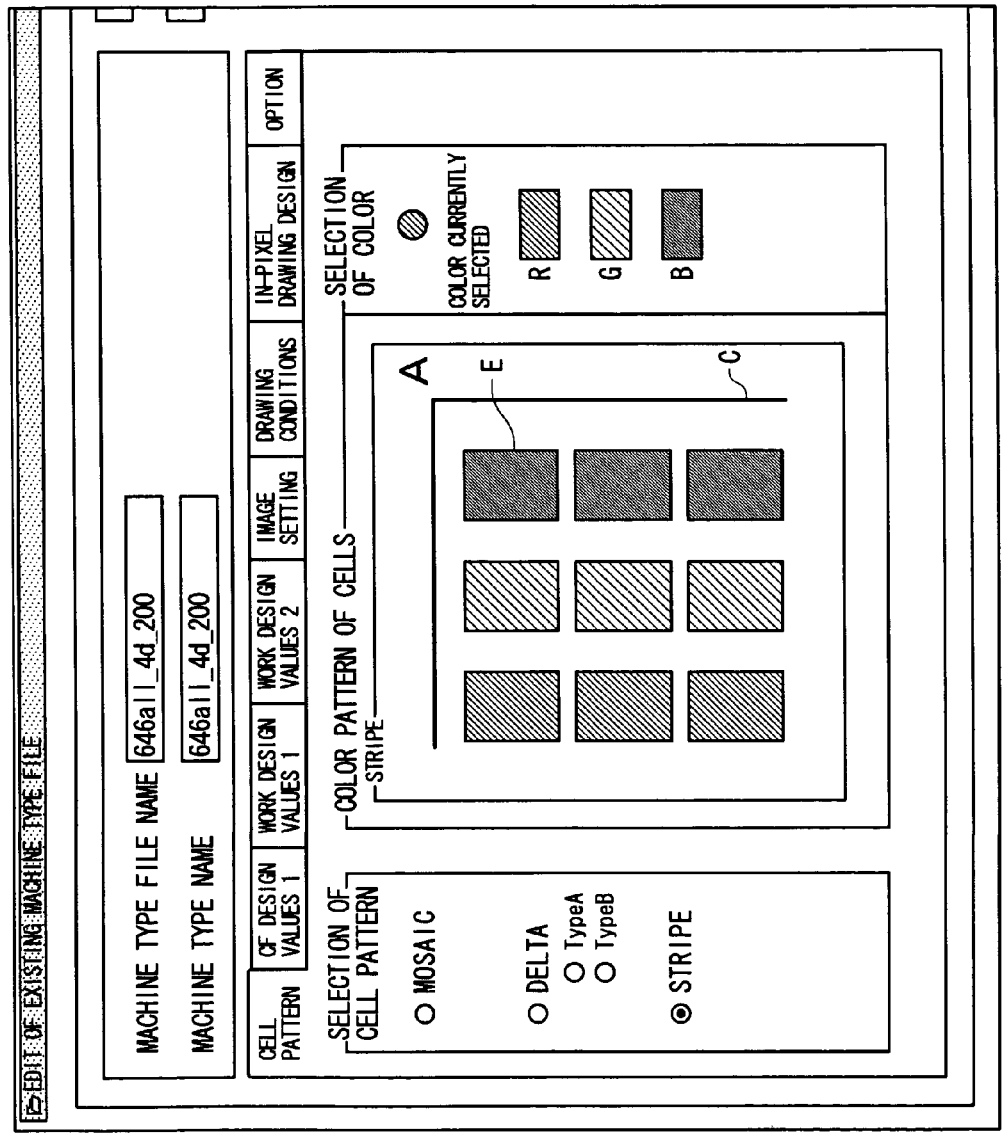
FIG. 10 is a diagram showing a screen for entering a cell pattern, different from the cell patterns shown in FIGS. 7, 8 and 9.

FIGS. 7 to 10 show selection screens for selecting cell patterns (array of pixels E), in which FIG. 7 shows an example where a mosaic layout is selected, FIGS. 8 and 9 show examples where a delta layout is selected, and FIG. 10 shows an example in which a stripe layout is selected. Here, not only cell patterns but also colors of cells (pixels E) can be selected to thereby allow a configuration of which color of functional liquid droplet to be ejected onto which cells E.

It should be noted that in each figure, an alphabetical letter "A" appearing "COLOR PATTERN OF CELLS" indicates a reference position of the chip-forming area C. Further, a "type A" and a "type B" in the case of the delta layout allow the user to select whether a pixel E closet to the reference position "A" is set to a whole pixel size (see FIG. 8) or a half pixel size (see FIG. 9).

Further, examples of the array of pixels E are illustrated in FIGS. 31A to 31C. FIG. 31A shows an example of the mosaic layout, FIG. 31B shows an example of the delta layout, and FIG. 31C shows an example of the stripe layout. As shown therein, in the stripe layout, all of a row or a column in the matrix have the same color, and in the mosaic layout, three arbitrary pixels in a row or a column have respective three colors of R, G, and B. Further, in the delta layout, pixels are laid out at different levels in the matrix such that three arbitrary pixels adjacent to each other have respective three colors of R, G, and B. Therefore, for instance, in the case of the FIG. 7 mosaic layout being selected, if a pixel at an upper right-hand corner as viewed in the figure is set to "R", the other two pixels shown in the figure are also set to "R". Next, when any one of unused pixel locations is set to "G" or "B", the colors of all the pixels shown herein are necessarily determined.

Figure 11:
FIG. 11 is a diagram showing a screen for entering CF design values 1, as an example of the operation screen according to the embodiment.
Figure 33:
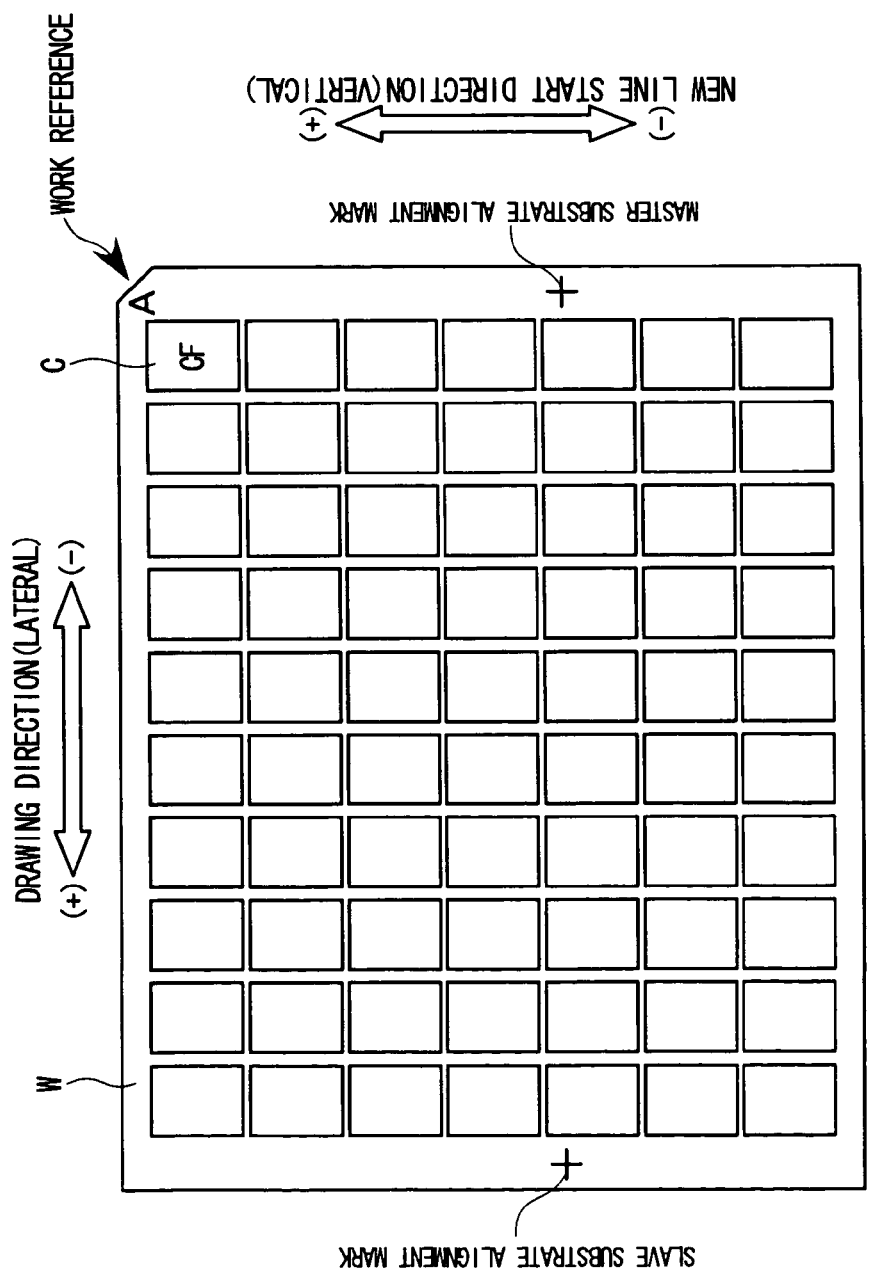
FIG. 33 is a diagram showing a chip layout on a workpiece, according to the embodiment.

FIG. 11 shows a screen for setting design values 1 of a color filter (CF: chip-forming area C). On this screen, it is possible to set (select) pixel numbers (numbers of pixels), pixel sizes, pixel pitches, and a direction of placement of the CF (chip-forming area C) with respect to a workpiece. The direction of placement of CF with respect to the workpiece is determined assuming that a workpiece reference (see FIG. 33) is located at an upper right-hand corner. Therefore, the CF to be drawn with its direction of placement being set as exemplified in FIG. 11 is oriented as shown in FIG. 33.

FIG. 12 shows a screen for setting design values 1 of the workpiece (substrate) W to. On this screen, it is possible to set (select) CF numbers (numbers of CFs), CF sizes, CF pitches, a CF central pitch (indicted by "a" in the figure), a workpiece (WF) size, and a magazine pitch. It should be noted that in the illustrated example, "lateral" means the direction of the length of the workpiece W. Further, in the case of the illustrated example, the CF central pitch is set to "none" ("CENTRAL PITCH EXISTS" is not checked). This shows that all the CFs are arranged at a constant pitch in the lateral direction (see FIG. 33). Further, although the workpiece size can be selected from two types of workpiece sizes, of course, it may be configured such that a numerical value thereof can be entered to set a desired workpiece size. Further, the magazine pitch is a distance between racks of the magazine on which workpieces W are placed. The amount of bending of a rack depends on the thickness of a workpiece (made of glass), and hence the magazine pitch is configured to be selectable from two types of pitches.

Figure 13:
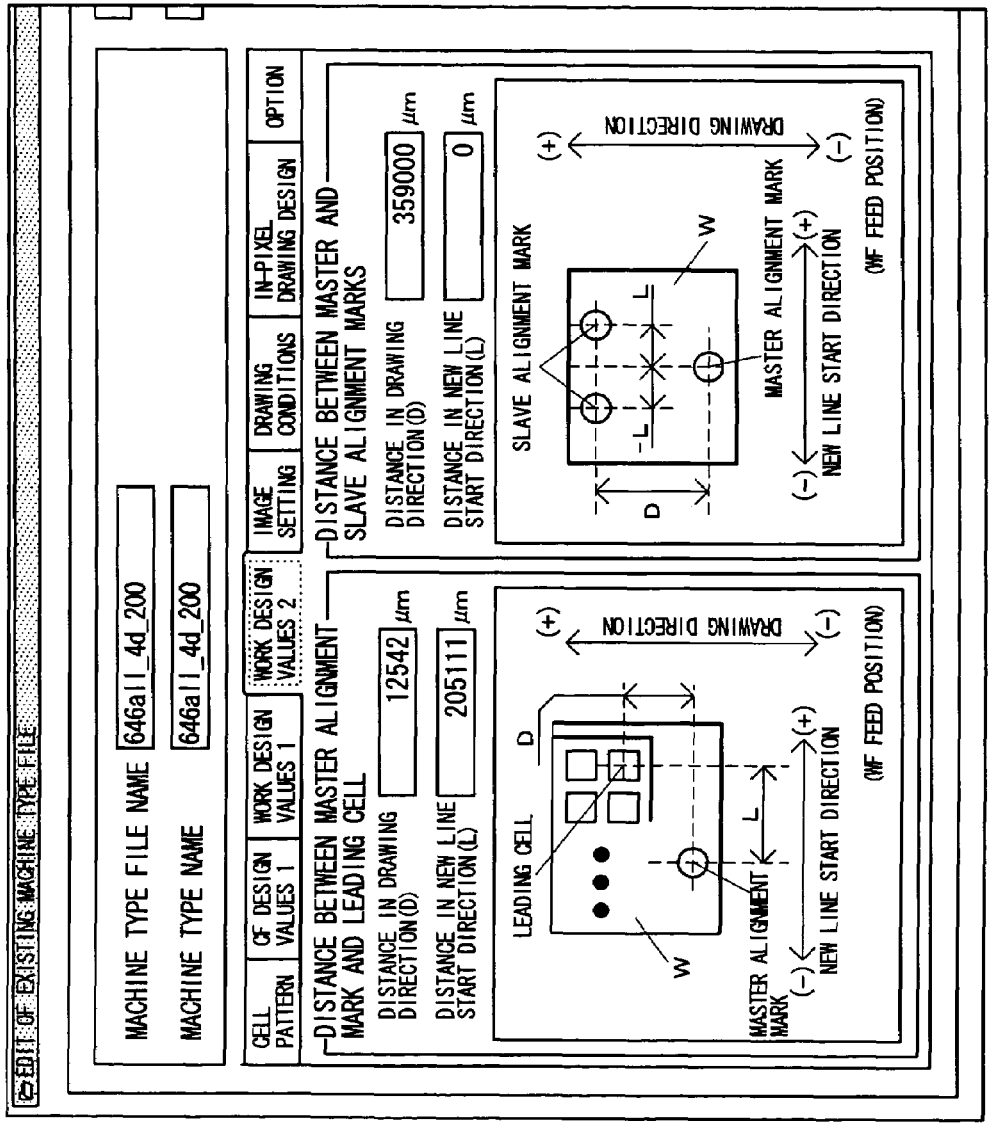
FIG. 13 is a diagram showing a screen for entering workpiece design values 2, as an example of the operation screen according to the embodiment.

FIG. 13 shows a screen for setting design values 2 of the workpiece (substrate) W. On this screen, it is possible to set a distance between a master substrate alignment mark and a leading cell, and a distance between the master substrate alignment mark and substrate alignment marks. Although a plurality of slave substrate alignment marks may be provided, in the illustrated example, a case is shown in which one slave substrate alignment mark is provided. It should be noted that "drawing direction" appearing in the figure indicates the "main scanning direction (X-axis direction) described above, and "new line start direction" indicates the "sub-scanning direction (Y-axis direction) described above. Further, to identify these marks, there are arranged a total of four substrate-sensing cameras such that the master substrate alignment mark and the slave substrate alignment marks can be sensed in both of a case in which the workpiece W is placed vertically (in portrait direction) and a case in which the workpiece W is placed laterally (in landscape direction).

Figure 37:
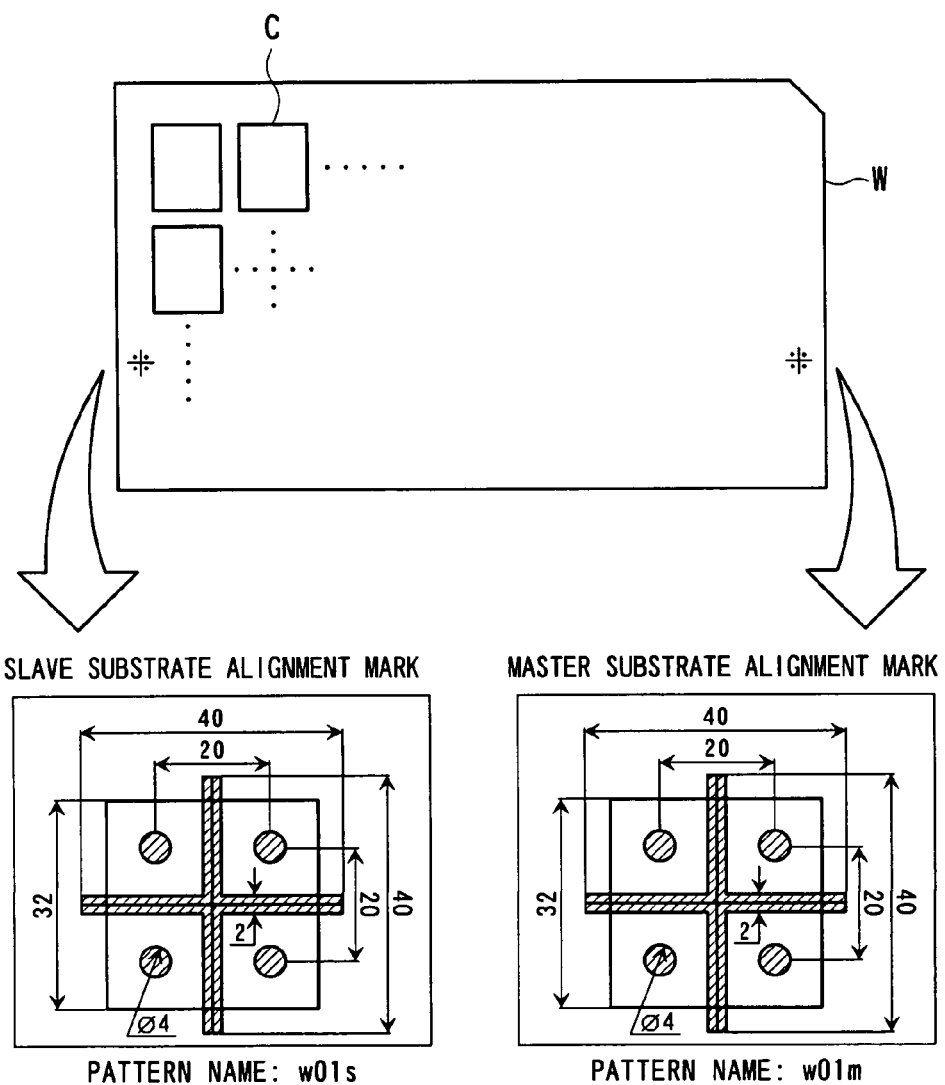
FIG. 37 is a diagram showing an example of substrate alignment marks, according to the invention.

FIG. 14 shows a screen for setting an image (concerning alignment of the workpiece W). On this screen, it is possible to set setting values for an image processing device for WF (workpiece W) alignment. This is because the shapes of the alignment marks are different depending on a workpiece W. As described above, two types of alignment marks are provided for the alignment, and it is necessary to set a pattern name, accuracy, complexity, an intermediate lower limit value, and a final lower limit value for each of the alignment marks. As shown in FIG. 37, in the present embodiment, the master substrate alignment mark and the slave substrate alignment mark have the same shape. Now, the pattern name is the name of a pattern preset for each of alignment marks, and hence a plurality of patterns have to be registered in advance. Further, the accuracy is for selecting a degree of accuracy that the pattern has, and the complexity is for selecting complexity of the shape of each alignment mark from numerical values 1 to 10 indicative of degrees of the complexity (the alignment marks shown in FIG. 37 have a complexity of "5", and hence if the alignment marks have a more complex shape, the complexity thereof has a value between 6 and 10).

Further, the intermediate lower limit value indicates a degree of matching with reference to which an alignment mark sensed by the substrate-sensing cameras is judged to be identified. A setting of "intermediate lower limit value 6500" means that a mark is identified when 65% or more of matching is recognized. Further, the two lower limit values of the intermediate lower limit value and the final lower limit value are set in order to perform identification of a mark (pattern matching) in two stages, for an increased processing speed. More specifically, in a first stage, a pattern which seemingly resembles an alignment mark is found out (a candidate point is found out), and in a second stage, it is determined whether or not the candidate point is a true pattern searched for. Therefore, if a correlation value larger than the "intermediate lower limit value" is indicated in the first stage, it is judged that "a true pattern is expected to exist around here", and the process is passed to the second stage. In the second stage, if a correlation value larger than the "final lower limit value" is indicated, it is judged that the candidate point is the true pattern searched for. Therefore, when the "intermediate lower limit value" is set to a low value, a multiplicity of candidate points appear, resulting in an increase in processing in the second stage. Inversely, when the "intermediate lower limit value" is set to a higher value, the processing speed is increased, but if the set "intermediate lower limit value" is to too high a value, it becomes impossible to find out even proper patterns. Therefore, it is preferable to set the "intermediate lower limit value" within a range of approximately 6000 to 7000. Further, the "final lower limit value" is a threshold value with reference to which it is judged that a true pattern has been found out, so that the "final lower limit value" is meaningless if it is lower than the "intermediate lower limit value". In general, the "final lower limit value" is set assuming that an image to be searched for is in its worst possible state. Moreover, if it is set to too low a value, an unexpected pattern is found by the search. Therefore, it is preferred to set the "final lower limit value" to a value equal to or larger than 8000.

FIG. 15 shows a screen for setting drawing information. On this screen, it is possible to set ejection resolution and an X-axis drawing speed as drawing information of each of the drawing colors (R, G, B), and the number of times of flushing operations as drawing information common to the drawing colors. The ejection resolution and the X-axis drawing speed are changed according to the type of a functional liquid and the characteristics of a functional liquid droplet ejection head 7 selected. In the present embodiment, the same type of functional liquids and the same type of functional liquid droplet ejection heads 7 are employed, so that the same conditions are set for the drawing colors (R, G, B). Further, the number of times of flushing operations (flushing times) is provided for setting the number of times of ejection (flushing) of functional liquid droplets to be effected per nozzle onto each of flushing regions (see FIG. 24) arranged at respective forward and backward locations in the drawing direction.

FIG. 16 shows a screen for setting an in-pixel drawing design. On this screen, it is possible to set ink droplet-landing start positions and the number of ink droplets (functional liquid droplets) within a pixel per pass. In the illustrated example, on first and second passes, ink droplets are ejected in an increasing (plus) direction (along the drawing direction) with respect to landing positions (ejection positions), while on third and fourth passes, ink droplets are ejected in an decreasing (minus) direction. This is because the ejection is carried out by a method of so-called "block ejection" (see FIG. 35), in which functional liquid droplets on the first and second passes are ejected when the heads move relative to the workpiece W in the increasing (plus) direction (i.e. when the workpiece moves in the decreasing direction), whereas when the heads move relative to the workpiece W in the decreasing (minus) direction (i.e. when the workpiece moves in the increasing direction), functional liquid droplets on the third and fourth passes are ejected. As described above, when functional liquid droplets are ejected within one pixel by a plurality of separate operations, the functional liquid droplets can be set to be ejected onto ejection positions different from each other, thereby making it possible to uniformly draw one pixel.

Figure 17:
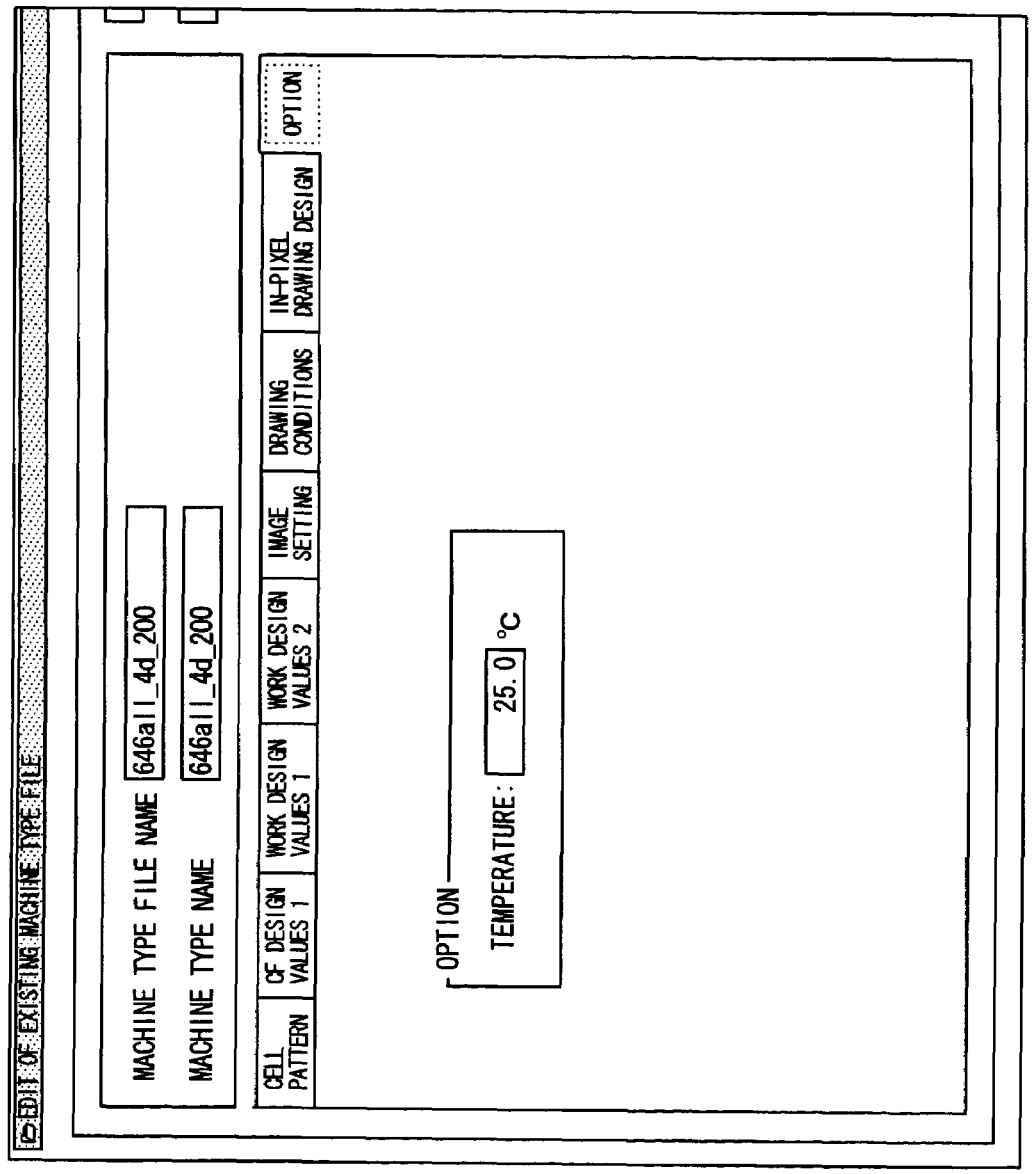
FIG. 17 is a diagram showing a screen for entering an option, as an example of the operation screen according to the embodiment.

FIG. 17 shows a screen for setting an option. On this screen, it is possible to set a temperature. Here, the temperature in this case particularly indicates an ambient temperature around a workpiece W. In this embodiment, correction values for compensating for expansion and contraction of a workpiece caused by temperature are stored in advance as a data table, and the amount of feeding of the workpiece by the X-axis table 23 and/or the Y-axis table 24 (functional liquid droplet ejection heads 7) is properly corrected according to the set temperature. As described above, functional liquid droplets can be caused to be accurately landed on desired positions on a workpiece W by taking the expansion or contraction of the workpiece caused by temperature into account.

It should be noted that a thermometer may be arranged in the vicinity of the suction table 28 to which workpieces W are supplied, and head motion pattern data may be corrected based on temperature measured by the thermometer at fixed time intervals or whenever a workpiece W is supplied thereto. This configuration makes it possible to save the trouble of setting a temperature and at the same time accurately correct the head motion pattern data. Further, in this case, it is preferred that a temperature around the magazine on which workpieces W are placed and an ambient temperature around the workpiece W fed on the suction table 28 are held identical to each other. This configuration makes it possible to perform a more accurate temperature-dependent correction.

Figure 18:
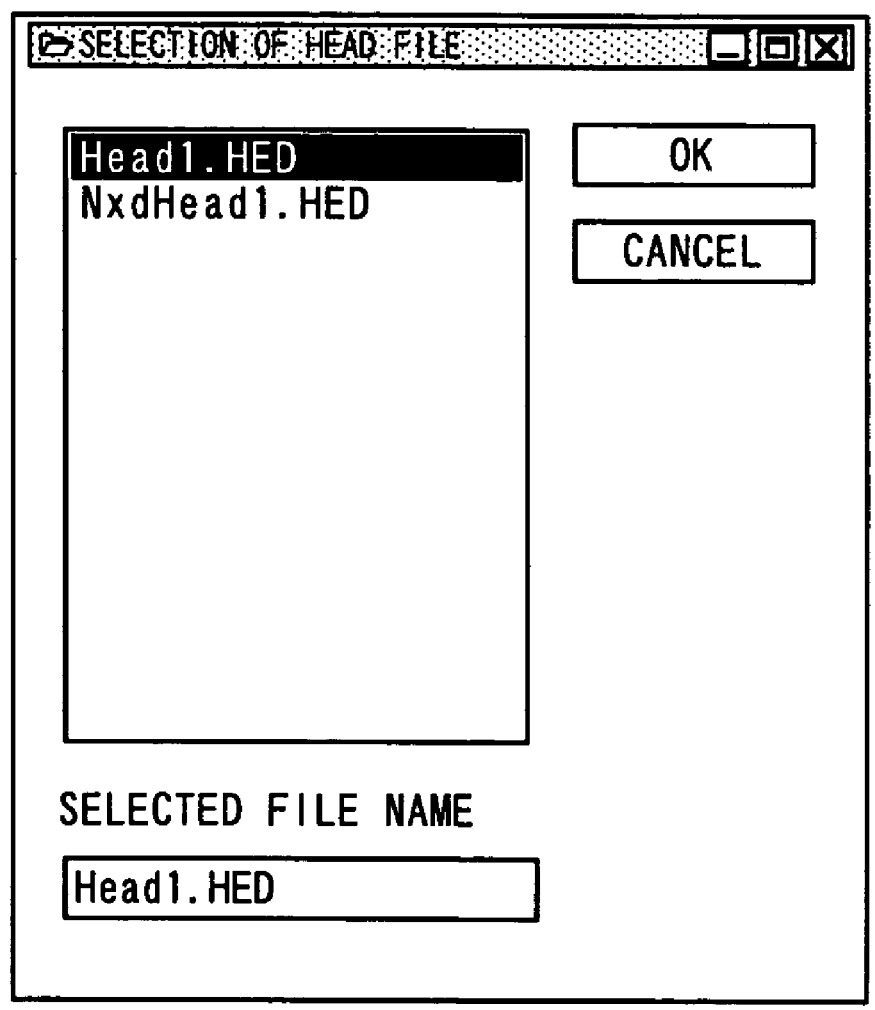
FIG. 18 is a diagram showing a screen for selecting a head file, as an example of the operation screen according to the embodiment.

FIG. 18 shows a screen for selecting a head file. On this screen, a file corresponding to the heads (Head 1) selected on the FIG. 5 screen is selected. FIGS. 19 to 23 show edit screens for editing a head file (head file name "Head 1") selected on the FIG. 18 screen. Further, if the head file is not stored in advance, it is necessary to newly enter data concerning the head file.

Figure 19:
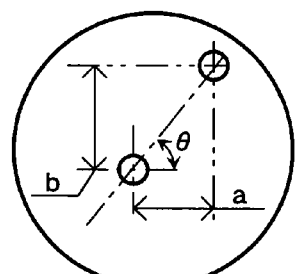
FIG. 19 is a diagram showing a screen for entering head design values, as an example of the operation screen according to the embodiment.
Figure 36:
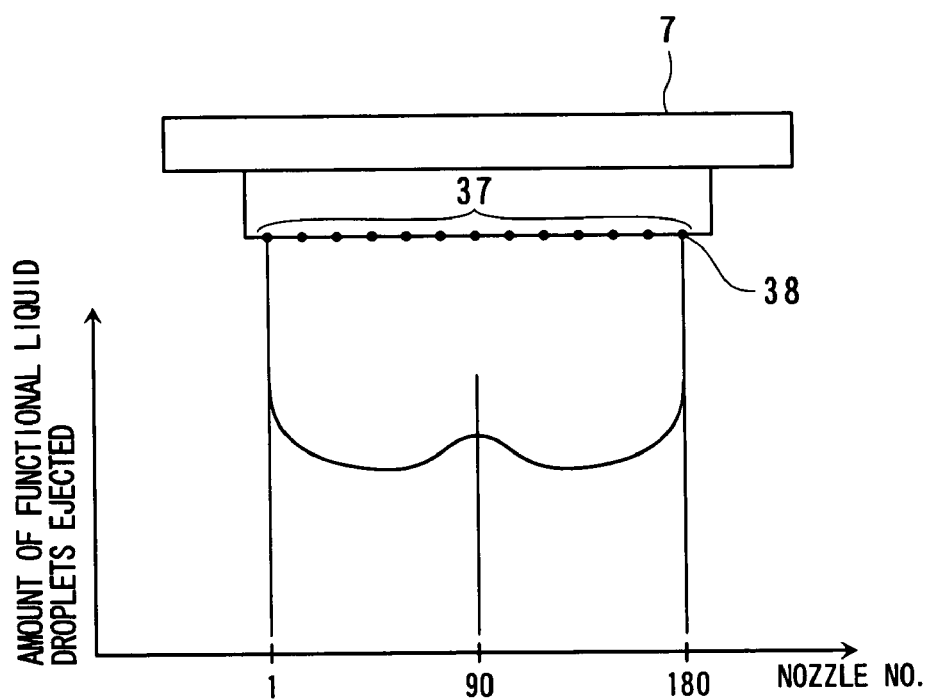
FIG. 36 is a diagram showing the relationship between a nozzle position and the amount of ejection of functional liquid droplets.

FIG. 19 shows a screen for entering head-design values. On this screen, it is possible to set the number of nozzles per head, a mounting angle of each head on the head carriage, and a nozzle pitch of the heads mounted on the head carriage. Further, out of the number of nozzles per head, it is possible to select a number (count) of unused nozzles from a leading nozzle, and a number (count) of unused nozzles from a tail end nozzle. As shown in FIG. 36, the piezo-type functional liquid droplet ejection head 7 has a characteristic that the amount of ink droplets ejected especially from nozzles at opposite ends of the nozzle array 37 tends to be increased, and therefore, by disabling these nozzles, respective amounts of ink ejection from nozzles are made equal to or close to an average value.

Further, the "head carriage" mentioned on this screen means the sub-carriage 41. If one of the mounting angle of each head on the sub-carriage 41, and the nozzle pitch of the heads mounted on the sub-carriage 41 is set, the value of the other of the mounting angle and the nozzle pitch is determined. Hence, the FIG. 19 screen may be configured such that only one of the values of the mounting angle and the nozzle pitch is entered. It should be noted that the nozzle pitch set on this screen is preferably set to a value different from the pixel pitch. In the present embodiment, three devices (of the same design with the same nozzle layout) associated with the three colors R, G, and B are employed, and ink droplets are ejected from different positions depending on each device. This configuration makes it possible to color three coloring patterns by using as many nozzles as possible. In short, it is possible to minimize unevenness of ejection (unevenness of drawing) (if the nozzle pitches of the respective devices are adjusted for the stripe layout, only one third of the nozzles can be used for each color).

FIG. 20 shows a screen for entering design values 1 for the head carriage. On this screen, it is possible to set space intervals of the nozzle arrays 37 with reference to a head 1A array (distances from the head 1A array to the other nozzle arrays 37). It should be noted that in the figure, "normal" and "reverse" in the column of "head mounting" mean that the head arrays of Head 7 to Head 12 are mounted in a manner such that the functional liquid droplet ejection heads 7 from Head 1 to Head 6 are rotated through 180 degrees.

Figure 21:
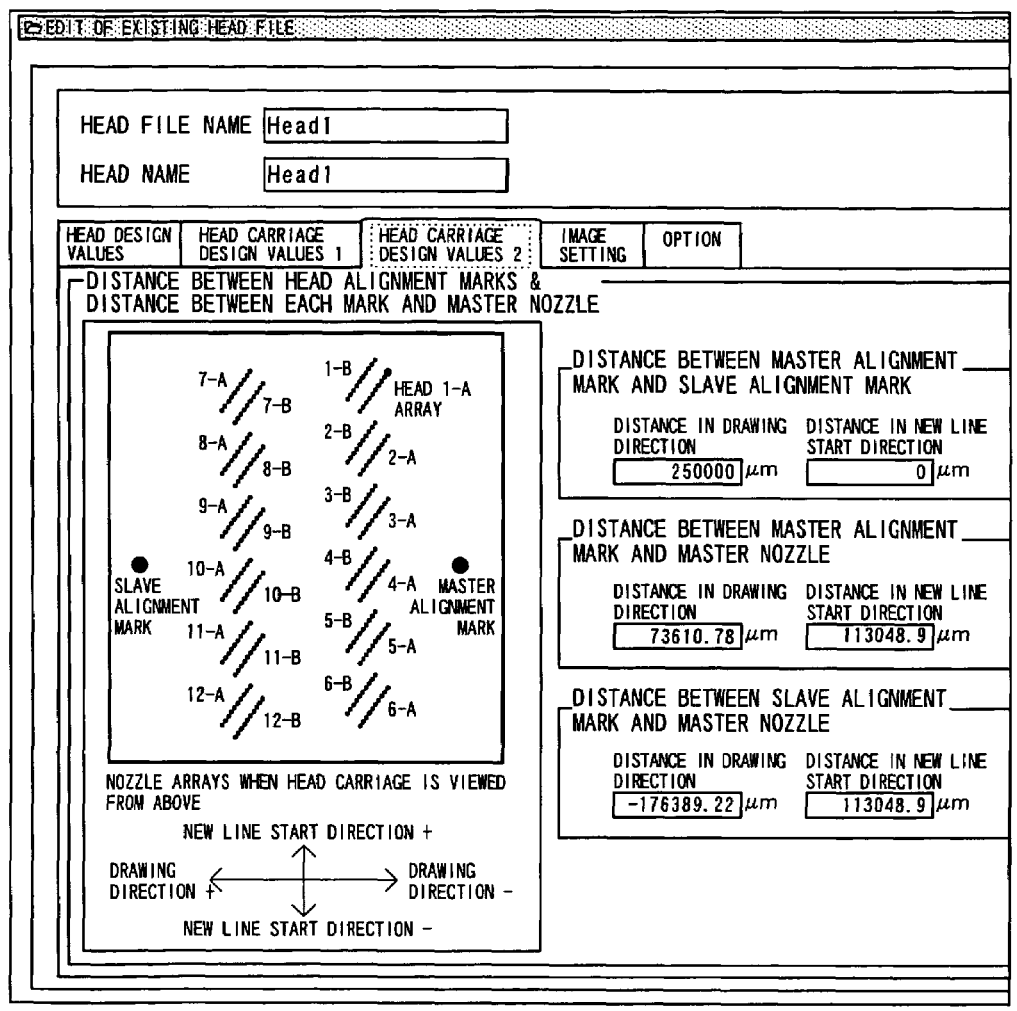
FIG. 21 is a diagram showing a screen for entering head carriage design values 2, as an example of the operation screen according to the embodiment.

FIG. 21 shows a screen for entering design values 2 for the head carriage. On this screen, it is possible to set a distance between the head alignment marks, and a distance between each alignment mark and a master nozzle. The head alignment marks are formed on the sub-carriage 41 by laser etching or the like as a master head alignment mark and a slave head alignment mark, at respective locations. Further, the master nozzle indicates a leading nozzle of the Head 1A array (represented by a black-filled circle in the figure).

FIG. 22 shows a screen for setting images for head alignment. On this screen, it is possible to set setting values for an image processing device for head alignment. This is because the shapes of head alignment marks are different depending on a carriage. As described above, there are provided two types of marks for alignment, and it is necessary to set a pattern name, accuracy, complexity, an intermediate lower limit value, a final lower limit value, a binarization level, an area lower limit value, and an area upper limit value, for each of the two types. In this embodiment, the pattern name, accuracy, complexity, intermediate lower limit value, and final lower limit value are set similarly to the "setting of the image processing device for WF alignment" shown in FIG. 14, and hence description thereof is omitted.

The binarization level, the area lower limit value, and the area upper limit value are used in calculating the center of gravity of each alignment mark after the alignment mark can be detected by pattern matching. The binarization level is used to set a reference point with reference to which 256 gradations of brightness of the alignment mark are binarized. More specifically, a portion of the alignment mark having a brightness value equal to or lower smaller than the value set on this 2 screen is converted to a "black" portion. Further, the area lower limit value and the area upper limit value are used for determining, after the alignment mark is divided into a "white" area or a "black" area with reference to the binarization level, whether or not an area of the "black area" is equal to or larger than the area lower limit value and equal to or smaller than the area upper limit value, and if it is determined that the area is equal to or larger than the area lower limit value and equal to or smaller than the area upper limit value so, the center of gravity of the "black area" is calculated. Therefore, in the illustrated example, if the area of the "black area" is 10% or more and 35% or less, the center of gravity of the alignment mark is calculated.

Figure 23:
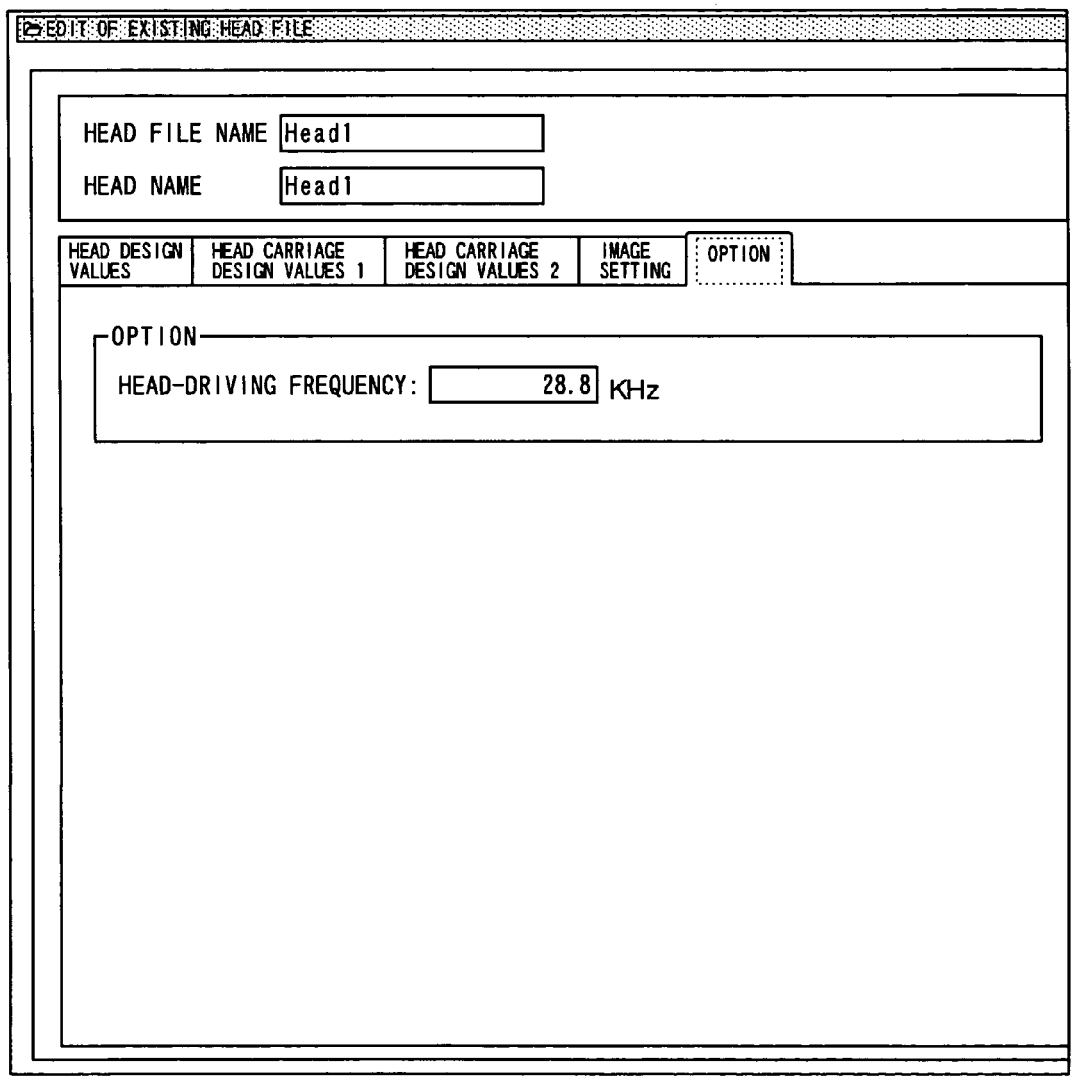
FIG. 23 is a diagram showing a screen for entering an option, as an example of the operation screen according to the embodiment.

FIG. 23 shows a screen for setting an option. On this screen, it is possible to set a head-driving frequency. Although an ejection-enabling pitch of one nozzle may be determined based on the head-driving frequency and a traveling speed of the head in the drawing direction, the head-driving frequency is not necessarily required to be entered (input thereof is not an essential requirement).

Figure 24:
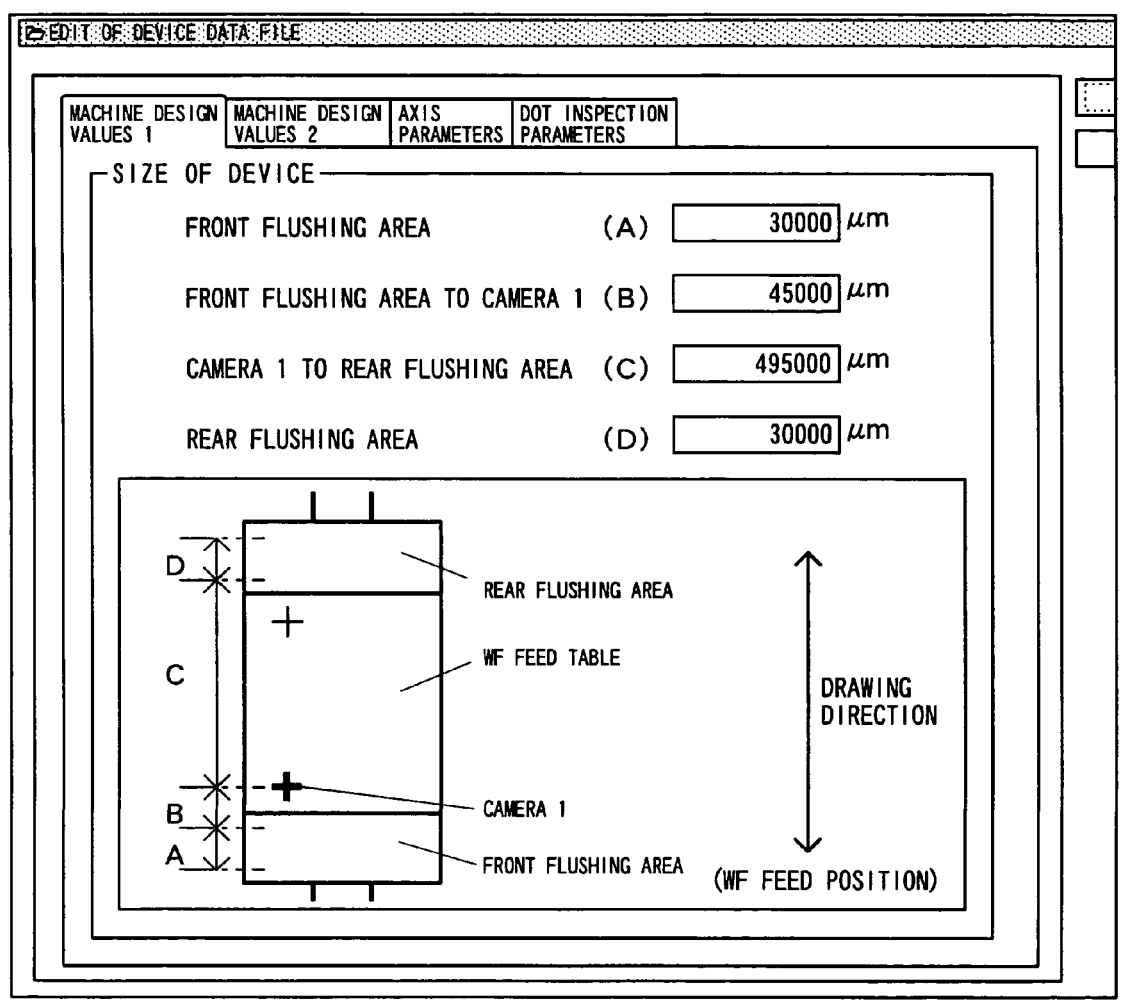
FIG. 24 is a diagram showing a screen for entering machine design values 1, as an example of the operation screen according to the embodiment.

Next, a device 1 of devices 1 to 3 as the functional liquid droplet ejection devices 10 is taken as an example, and edit operations for editing data file for the device 1 will be described hereinafter with reference to FIGS. 24 to 27. FIG. 24 shows a screen for entering machine design values 1. On this screen, it is possible to set sizes of the device 1. As described hereinabove, there are arranged a total of four substrate-sensing cameras so as to enable a master substrate alignment mark and a slave substrate alignment mark to be sensed in both of the case where a workpiece W is placed vertically (in portrait direction) and the case where a workpiece is placed laterally (in landscape direction). With reference to a camera 1 (represented by a symbol+in thick print) of the four cameras, areas extending from front and rear flushing regions are set. It should be noted that in FIG. 24, there is shown a plan view of the workpiece as viewed from above, which illustrates a relative position between the workpiece and the camera 1 in the drawing direction.

FIG. 25 shows a screen for entering machine-design values 2. On this screen, it is possible to set a distance between the reference camera 1 and each of the other cameras in the drawing direction. It should be noted that the cameras 1, 3 recognize the marks when the workpiece W is vertically placed, and the cameras 2, 4 recognize the marks when the workpiece W is laterally placed.

Figure 26:
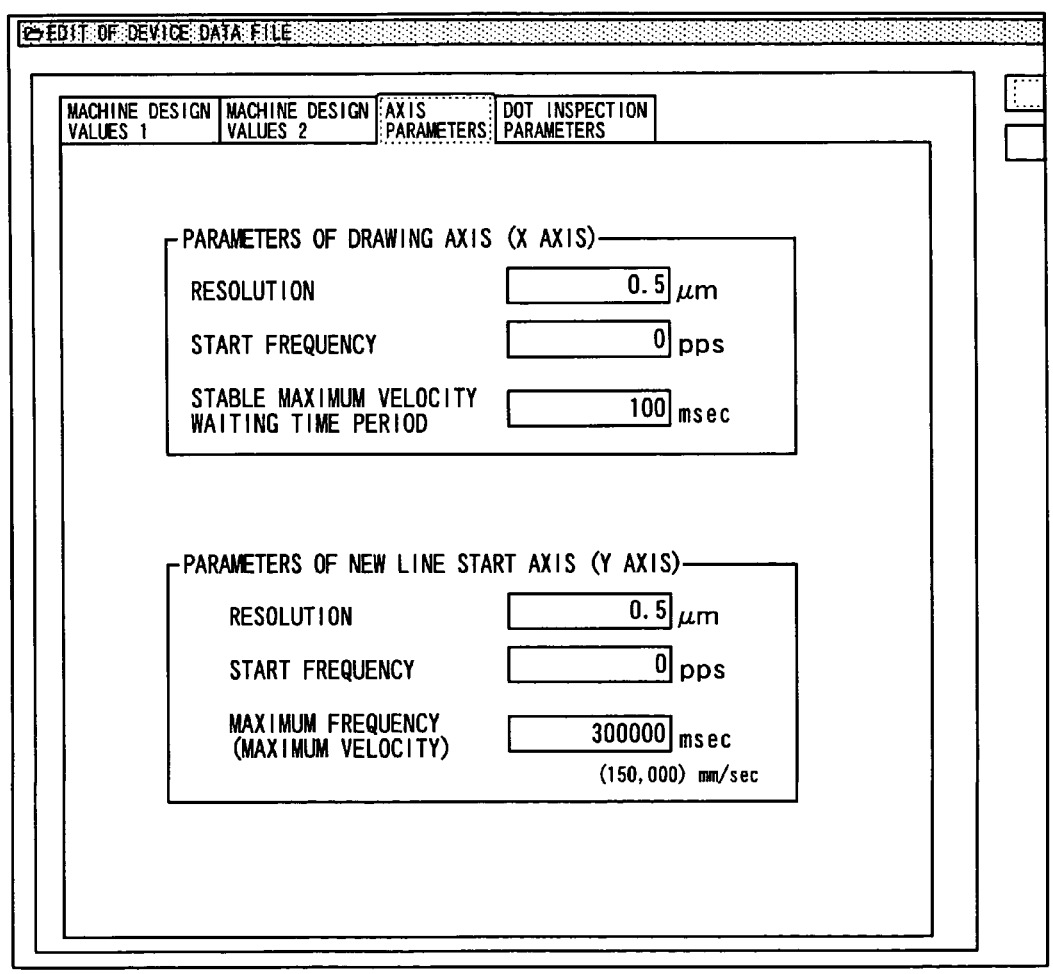
FIG. 26 is a diagram showing a screen for entering axis parameters, as an example of the operation screen according to the embodiment.

FIG. 26 shows a screen for entering axis parameters. On this screen, it is possible to set parameters of a drawing axis (X axis) and parameters of a new line start axis (Y axis). As the parameters of the drawing axis (X axis), there are entered resolution, a start frequency, and a stable maximum velocity waiting time period. Among these, the resolution is equal to the resolution of the linear scale. Further, the stable maximum velocity waiting time period indicates a waiting time period until the heads reach the maximum velocity thereof (until it becomes possible for the heads to scan stably), in scanning in the drawing direction. Further, the start frequency is used for calculating an acceleration area over which the heads are accelerated when driven (area in which the velocity of the heads is not stable), when head motion pattern data along the X and Y axes are generated. On the other hand, the maximum frequency as a parameter of the new line start axis (Y axis) is used in missing dot inspection, which is described in the following. The missing dot inspection is carried out by ejecting functional liquid droplets while moving the functional liquid droplet ejection heads 7, for inspection. The maximum frequency set here is used to set a traveling speed of the functional liquid droplet ejection heads 7 during the inspection and perform calculations concerning which nozzle 38 should eject functional liquid droplets at which position.

Figure 27:
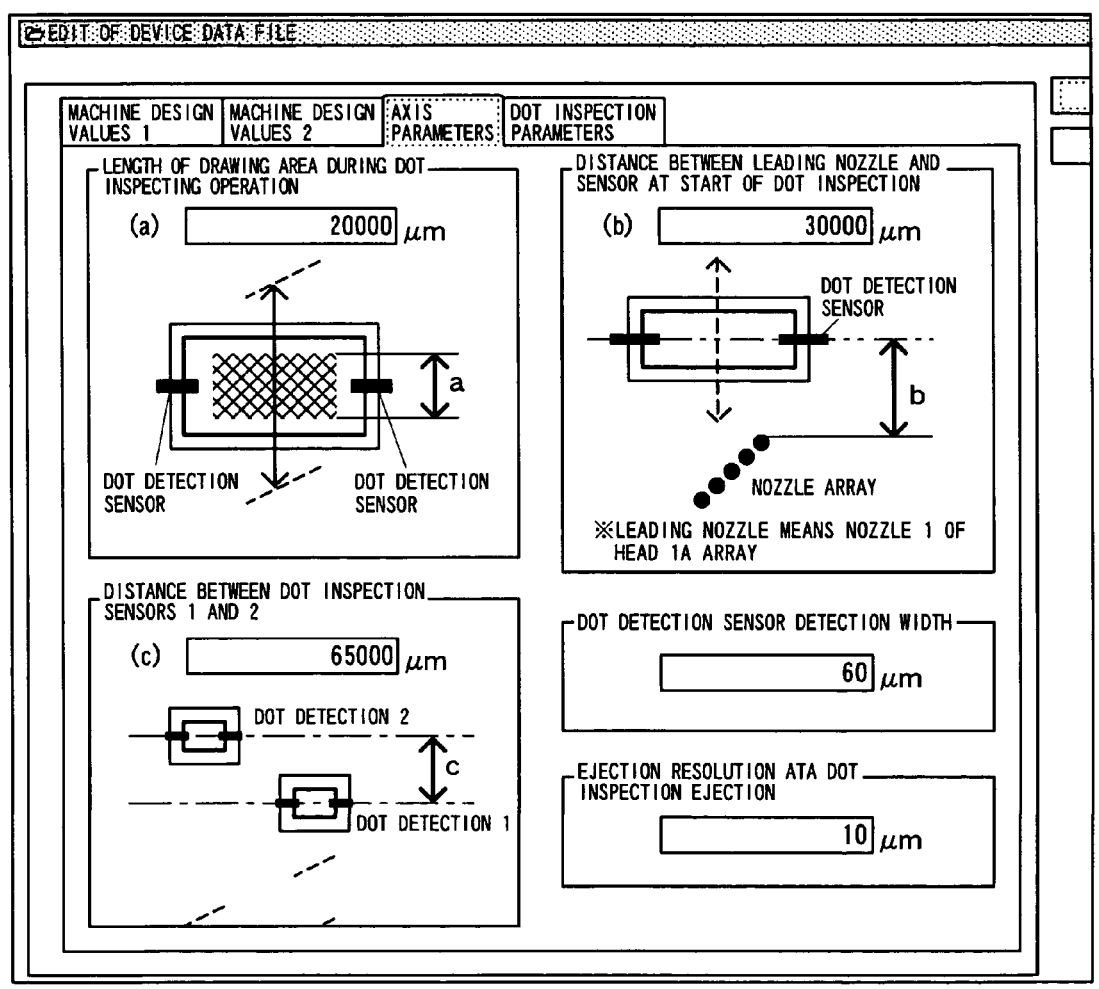
FIG. 27 is a diagram showing a screen for entering dot inspection parameters, as an example of the operation screen according to the embodiment.

FIG. 27 shows a screen for entering dot inspection parameters. On this screen, it is possible to set the length of a drawing area during a dot-inspecting operation, a distance between a dot inspection sensor 1 and a dot inspection sensor 2, a distance between a leading nozzle and the sensors at the start of the dot inspection, detection width of the dot inspection sensors, and ejection resolution during ejection of functional liquid droplets for the dot inspection. The "dot inspection parameters" are used for inspecting the clogging of the nozzles, and double squares shown in the figure represent a receiver for receiving functional liquid droplets. Further, the two sensors of the sensor 1 and the sensor 2 are used for inspecting two nozzle arrays 37 on the sub-carriage 41, respectively.

Figure 28:
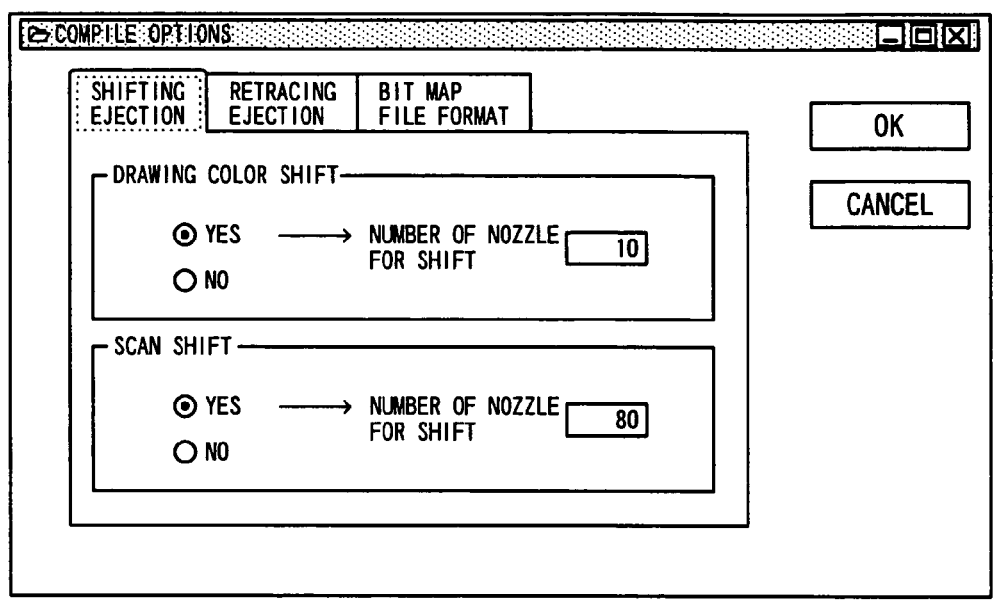
FIG. 28 is a diagram showing an input screen for shifting ejection, as an example of the operation screen according to the embodiment.
Figure 32:
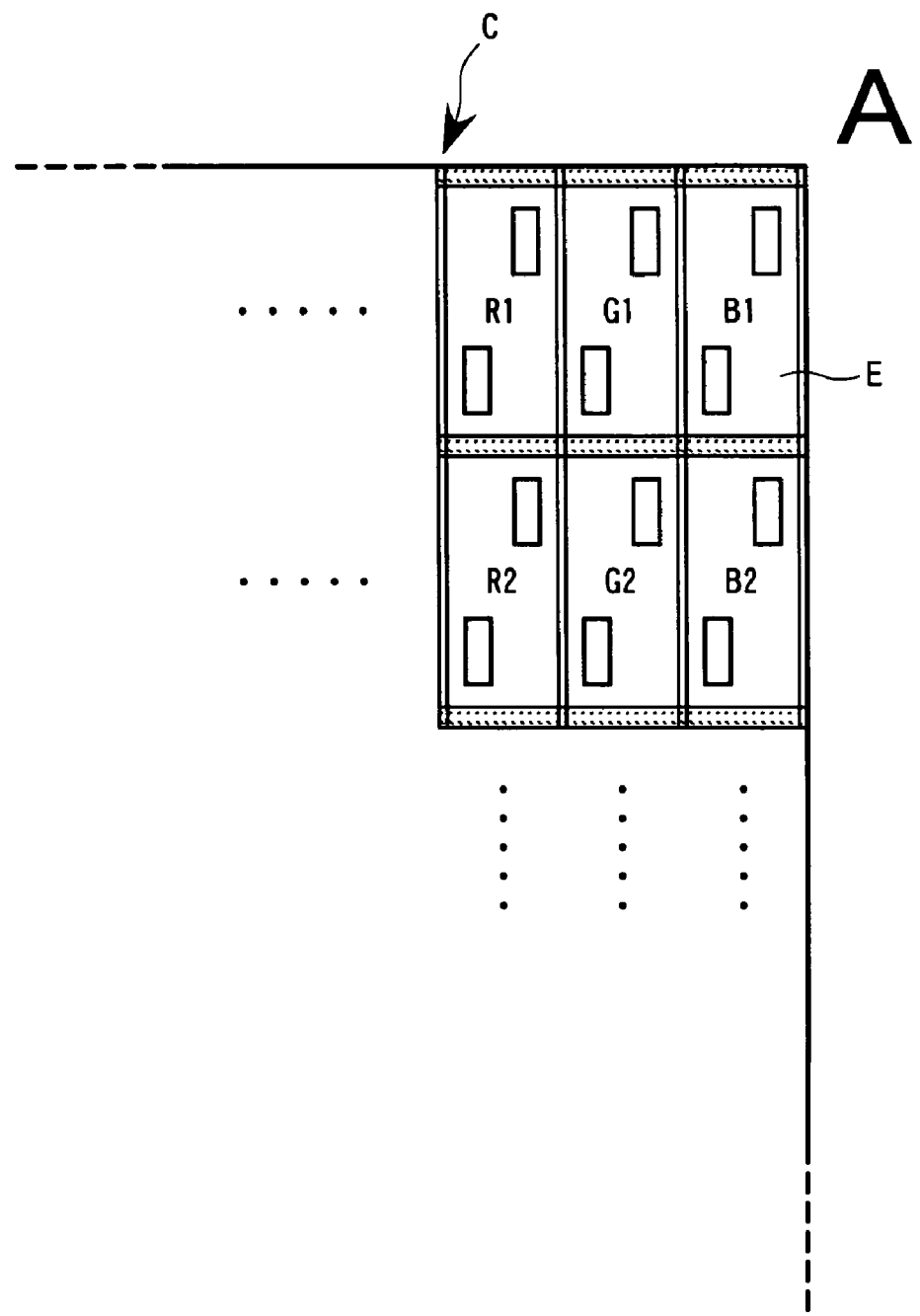
FIG. 32 is a diagram showing an example of lay out of R, G, B pixels, according to the embodiment.

Next, a description will be given of a compile option-setting operation with reference to FIGS. 28 to 30. The compile option can be set by clicking a "compile option" icon on a main menu. FIG. 28 shows a screen for setting shifting ejection. On this screen, it is possible to set drawing color shift and scan shift. The drawing color shift is set in drawing a chip-forming area C by using a plurality of colors, and assuming that the same nozzle numbers are assigned to corresponding nozzles of the nozzle arrays 37 of the functional liquid droplet ejection heads 7 of each of the devices 1 to 3, starting from one end of each nozzle array (since each nozzle array 37 has 180 nozzles, the numbers of 1 to 180 are assumed to be assigned to the nozzles, respectively), the drawing color shift is set so as to inhibit ejection of functional liquid droplets to adjacent pixels (e.g. R1 and G1, or G1 and B1, in FIG. 32) from nozzles 38 of the same numbers. In the illustrated example, the number of nozzles for a shift is set to "10", and hence if ejection to a pixel R1 is effected by a nozzle number 20 of the device 1, ejection to a pixel G1 is effected by a nozzle number 10 or a nozzle number 30 of the device 2. Further, if ejection to the pixel R1 is effected by a nozzle number 1 of the device 1, ejection to a pixel Gl is effected by a nozzle number 11 of the device 2 or a nozzle number 171 of a nozzle array adjacent thereto or the functional liquid droplet ejection head 7. As a result, even when ejection amounts are varied depending on the positions of the nozzles 38 (see FIG. 36), the amount of functional liquid droplets ejected per pixel can be made equal to or close to an average value, thereby making it difficult to recognize unevenness of ejection by the eye.

Figure 34A:
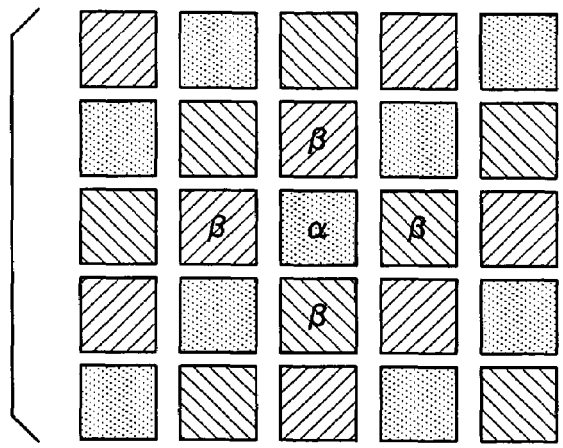
FIGS. 34A to 34C are diagrams showing examples of elements adjacent to each other, according to the embodiment.
Figure 34B:
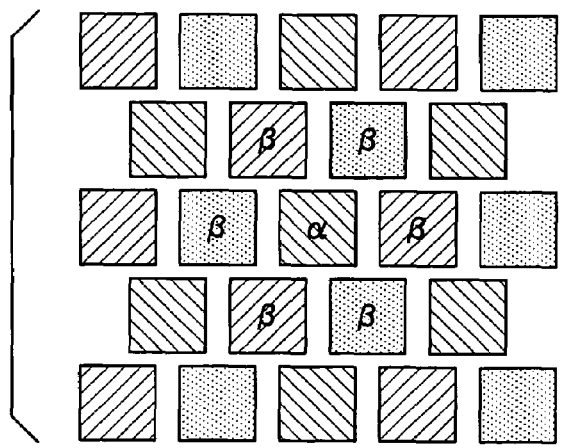
Figure 34C:
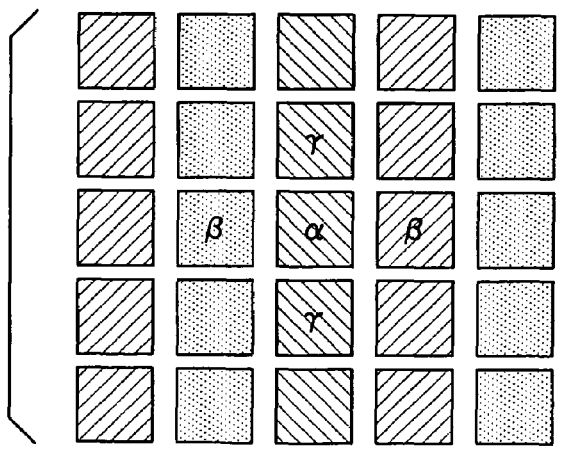

It should be noted that as shown in FIGS. 34A to 34C, pixels adjacent to each other in each layout (mosaic layout, delta layout, stripe layout) indicate pixels P with respect to pixels α. In the stripe layout shown in FIG. 34C, however, pixels y as well as the pixels β may be defined as pixels adjacent to the pixels a to thereby prevent functional liquid droplets from being ejected from the nozzles 38 having the same numbers.

On the other hand, according to the scan shift, when one pixel is drawn by a plurality of ejecting operations (in the present embodiment, the drawing is carried out by four separate ejecting operations), it is possible to eject functional liquid droplets from nozzles different from each other. In the illustrated example, the number of nozzles for a shift is set to "80", and hence if ejection to a certain pixel is effected by a nozzle number 10 on a first pass, ejection to the same is effected by a nozzle number 90 on a second pass, by a nozzle number 170 on a third pass, and by a nozzle number 70 of an adjacent nozzle array 37 or the functional liquid droplet ejection head 7 on a fourth pass. Consequently, even when ejection amounts are varied depending on the positions of the nozzles 38 (see FIG. 36), the amount of functional liquid droplets ejected per pixel can be made equal to or close to an average value.

Figure 29:
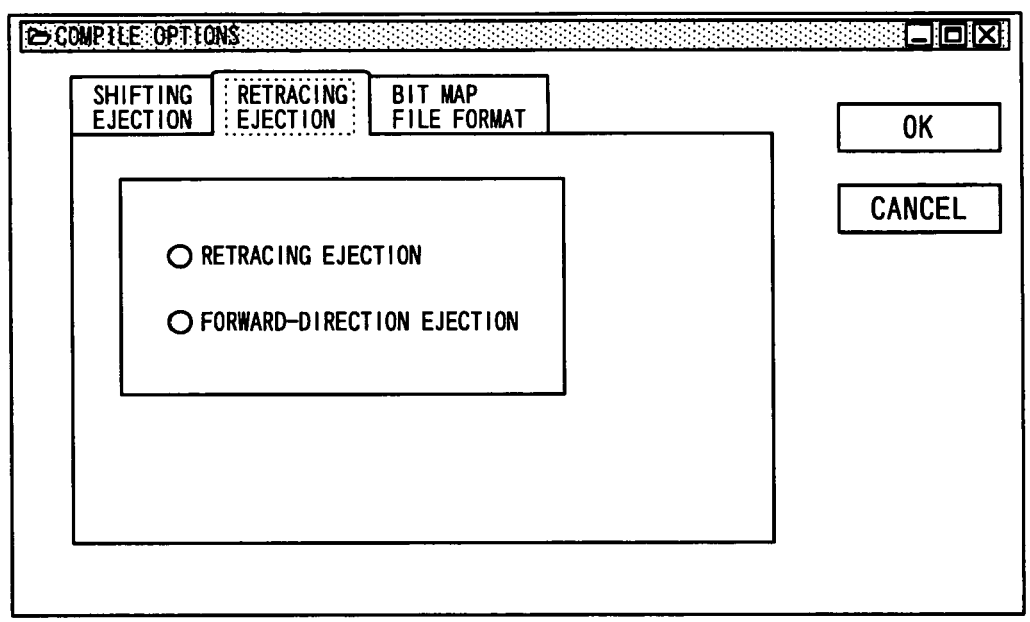
FIG. 29 is a diagram showing an input screen for retracing ejection, as an example of the operation screen according to the embodiment.
Figure 35:
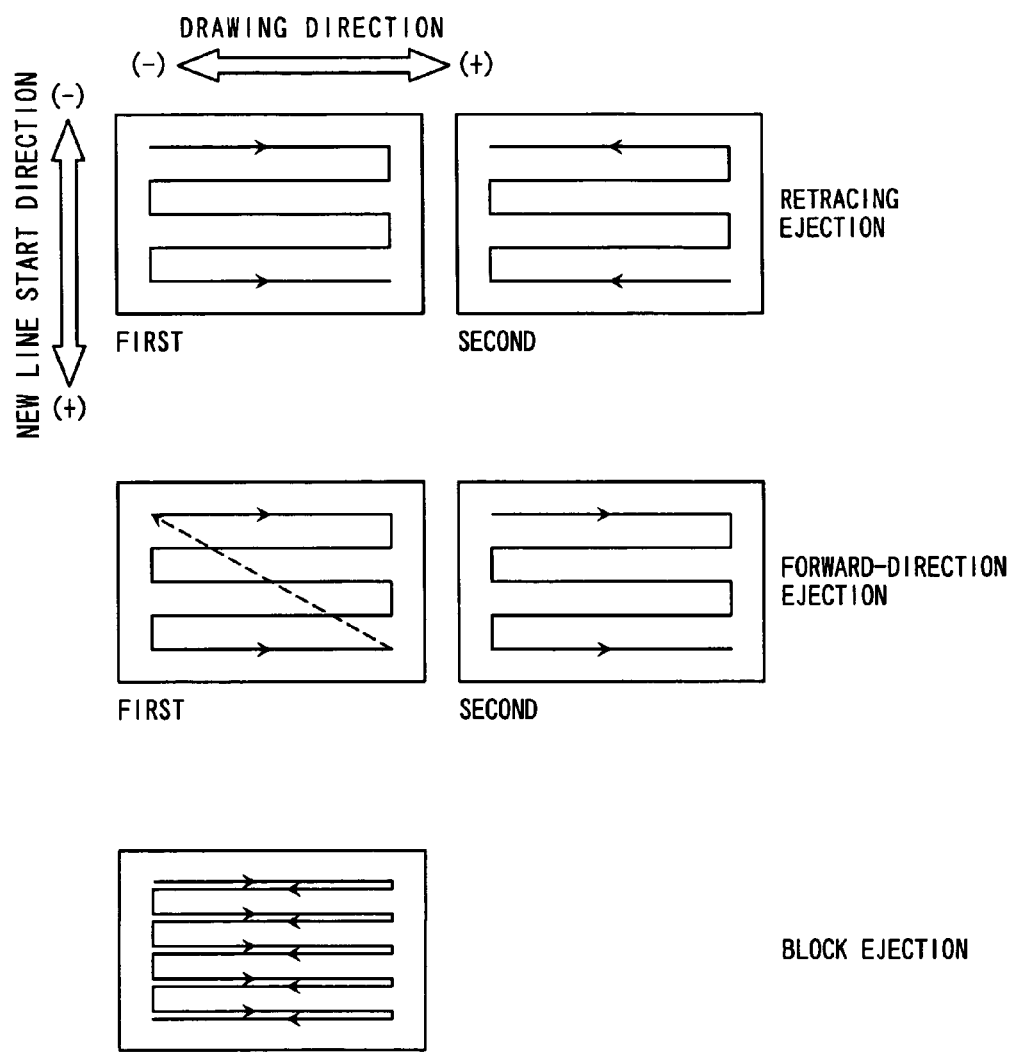
FIG. 35 is a diagram showing an example of a method of driving the functional liquid droplet ejection head according to the embodiment.

FIG. 29 shows a screen for setting a "retracing ejection" or the like, which is a type of a head-driving method for driving the functional liquid droplet ejection heads 7 relative to a workpiece W (X stage 23). On this screen, it is possible to set the "retracing ejection", or "forward-direction ejection". It should be noted that in this embodiment, the "block ejection" is employed, unless otherwise specified. The respective head-driving methods are illustrated in FIG. 35.

FIG. 30 shows a screen for setting a bit map file format (file storage format). On this screen, it is possible to set either "normal (BIN file)" or "debug (TET file)". The "normal (BIN file)" is formed by binary data which is driving data for driving the functional liquid droplet ejection heads 7, and the "debug (TEX file)" is text data displayable by a text editor.

As described hereinbefore, the machine type file (substrate data) shown in FIGS. 7 to 17, the head file (head data) shown in FIGS. 19 to 23, the device file (device data) shown in FIGS. 24 to 27 are edited, and further, the compile option shown in FIGS. 28 to 30 is set as required. Thereafter, by clicking the compile icon on the main menu shown in FIG. 5, the compiling of these data is performed to generate drawing data (ejection pattern data) of each drawing color (each device), and position data (head motion pattern data) (see FIG. 4). Thus, the ejection pattern data and head motion pattern data are generated based on pixel information and chip information (substrate data) and nozzle information and head movement information (head data), which are set as desired, according to a predetermined algorithm, and therefore, it is possible to generate the ejection pattern data of all the nozzles 38, and the head motion pattern data of all the devices (functional liquid droplet ejection heads 7) collectively, easily and quickly.

As described hereinbefore, the drawing system 1 and the functional liquid droplet ejection device 10 according to the present invention can be applied to the manufacturing method of manufacturing flat displays as well as manufacturing methods of manufacturing electronic devices and optical devices. In the following, manufacturing methods employing the drawing system 1 and the functional liquid droplet ejection device 10 will be described by taking a method of manufacturing a liquid crystal display device and a method of manufacturing an organic EL device as examples.

Figure 38A:
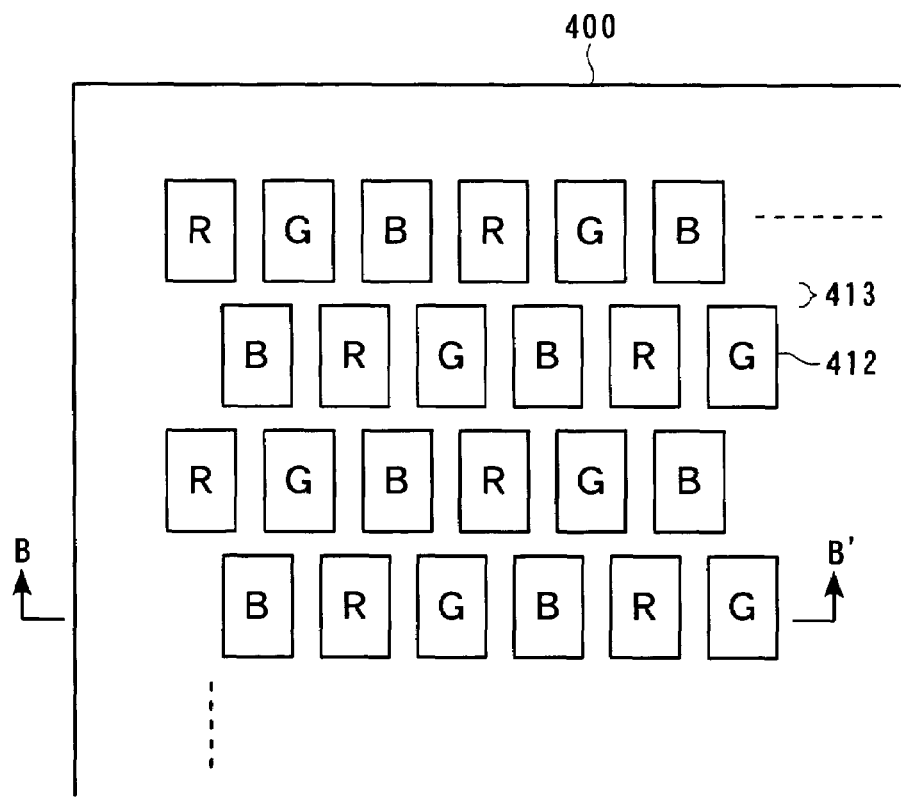
Figure 38B:
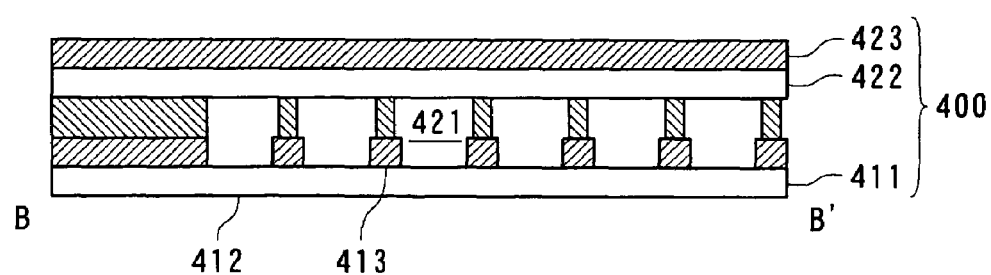

FIGS. 38A and 38B are enlarged partial views of a color filter for a liquid crystal display device. FIG. 38A is a plan view of the color filter, and FIG. 38B is a cross-sectional view of the same taken on line B-B of FIG. 38A. Hatching for showing cross-sectional portions in FIG. 38B is partially omitted.

Referring to FIG. 38A, the color filter 400 includes pixels (filter elements) 412 arrayed in the form of a matrix, and pixels are separated by partitions 413 arranged in the boundaries. To each pixel 412 is introduced one of inks (filter materials) of red (R), green (G), and blue (B). Although in this example, a so-called delta layout is employed to lay out the pixels of red, green and blue, this is not limitative, but any of other suitable layouts, such as the stripe layout and, and the mosaic layout, may be employed.

Referring to FIG. 38B, the color filter 400 includes a transparent substrate 411 and the light-shielding partitions 413. Portions where no partitions 413 are formed on the substrate 411 (where the partitions 413 are eliminated) form the above pixels 412. Inks of the colors introduced into the pixels 412 form a colored layer 421. There are formed an overcoating layer 422 and an electrode layer 423 on upper surfaces of the partitions 413 and the colored layer 421.

FIG. 39 provides cross-sectional views useful in explaining a process of manufacturing a color filter by the color filter-manufacturing method according to the present embodiment of the invention. In the figure, hatching for showing cross-sectional portions is partially omitted.

The transparent substrate 411 is formed of non-alkali glass having a film thickness of 0.7 mm, a length of 38 cm, and a width of 30 cm. Now, the surface of the transparent substrate 411 is cleaned with a cleaning liquid prepared by adding 1 wt % of hydrogen peroxide to heated concentrated sulfuric acid. Then, after being rinsed in pure water, the surface is dried by air to obtain a clean surface, on which a chromium film having an average thickness of 0.2 μm is formed by a sputtering method, thereby obtaining a metal layer 414' (FIG. 39: S1).

The substrate is dried at 80° C. for five minutes on a hot plate, and after that a photoresist layer, not shown, is formed on the surface of the metal layer 414' by spin coating. A matrix film having a required matrix pattern drawn thereon is brought into intimate contact with the surface of the substrate, and exposed to ultraviolet rays. Then, the substrate with the matrix film is immersed in an alkaline developer containing 8 wt % of potassium hydroxide, and a photoresist of an unexposed part is removed to pattern the photoresist layer. Subsequently, the exposed metal layer is removed with an etching liquid mainly composed of hydrochloric acid. As described above, it is possible to obtain a light-shielding layer (black matrix) 414 having a predetermined matrix pattern (FIG. 39: S2). The light-shielding layer 414 has a film thickness of approximately 0.2 μm, and a trace width of approximately 22 μm.

The above substrate is further coated with a negative-type transparent acrylic photosensitive resin composition 415' by the spin coating method (FIG. 39: S3). After being pre-baked at 100° C. for 20 minutes, the substrate coated with the resin composition 415' is exposed to ultraviolet rays by using the matrix film having the predetermined matrix pattern drawn thereon. The resin of an unexposed part of the resin composition 415' is developed with an alkaline developer, and spin-dried after rinsing in pure water. The resin portion of the resin composition 415' is sufficiently cured by performing an after-baking treatment as a final drying treatment at 200° C. for 30 minutes, whereby a bank layer 415 is formed, whereby the partition 413 comprised of the light-shielding layer 414 and the bank layer 415 is formed (FIG. 39: S4). The bank layer 415 has an average film thickness of 2.7 μm, and a bank width of approximately 14 μm.

So as to improve the ink wettability to a colored layer-forming area (especially, an exposed surface of the glass substrate 411) divided by the obtained light-shielding layer 414 and bank layer 415, dry etching, that is, a plasma treatment is carried out. More specifically, a high voltage is applied to a mixed gas produced by adding 20% of oxygen to helium, to form an etching spot in a plasma atmosphere. Then, the substrate is passed underneath the etching spot for etching.

Then, the above respective inks of R, G, and B are introduced by the ink jet method into the pixels 412 formed by dividing the colored layer-forming area by the partition 413 (FIG. 39: S5). Precision heads making use of piezoelectric effects are used as the functional liquid droplet ejection heads 7 (ink jet heads). Ten very small ink droplets are selectively ejected to each section of the colored layer-forming area. The driving frequency of each head 3 is set to 14.4 kHz, that is, the time intervals of ejection of ink droplets are set to 69.5μ seconds. The distance between each head 3 and a target of each ink is set to 0.3 mm. To attain a desired flying speed of the inks from the heads to sections of the colored layer-forming area as targets, prevent ink droplets from being deflected in flying direction, and inhibit ink droplets from being broken up or strayed, not only the physical properties of the inks but also the waveform (of applied voltage or the like) for driving piezoelectric elements of the heads is important. Therefore, a waveform having conditions set in advance is programmed, whereby ink droplets of the three colors are simultaneously applied to the substrate to thereby coat ink in a predetermined color layout pattern.

As the ink filter material, there is employed one which is obtained in the following manner: After an inorganic pigment is dispersed e.g. in polyurethane resin polygomer, cyclohexanone and butyl acetate as low-boiling solvents and butyl carbitol acetate as a high-boiling solvent are added to the dispersion, and further 0.01 wt % of nonionic surfactant is added to the resulting solution as a dispersant, to form ink having a viscosity of 6 to 8 centipoise.

Next, the ink applied to the substrate is dried. First, the substrate is left as it is for 3 hours in a natural atmosphere to set an ink layer 416, then heated for 40 minutes on the hot plate of 80° C., and finally heated at 200° C. for 30 minutes in an oven, for curing the ink layer 416, whereby the colored layer 421 can be obtained (FIG. 39: S6).

The overcoating layer 422 having a flat surface is formed on the substrate by applying a transparent acrylic resin coating material on the substrate by spin coating. Further, an electrode layer 423 made of ITO (Indium Tin Oxide) is formed in a required pattern on an upper surface of the overcoating layer 422 to obtain a color filter 400 (FIG. 39: S7). It should be noted that the overcoating layer 422 may be formed by the ink jet method of ejecting ink droplets by the functional liquid droplet ejection heads 7 (ink jet heads).

Figure 40:
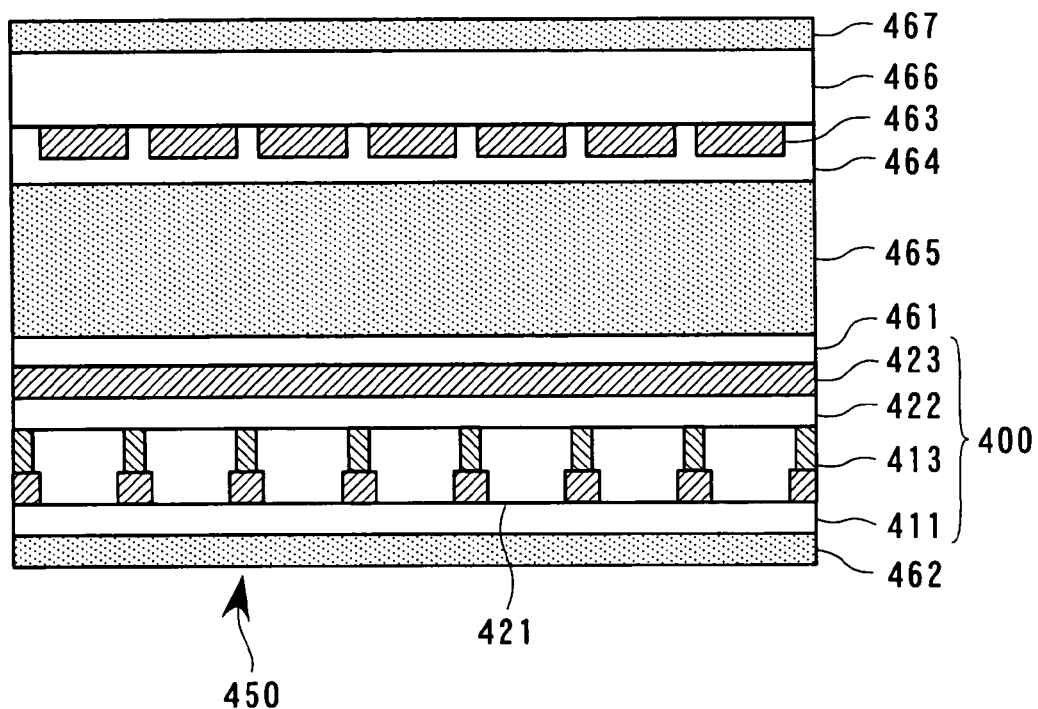
FIG. 40 is a cross-sectional view showing a liquid crystal display device manufactured by the color filter-manufacturing method according to the embodiment.

FIG. 40 is a cross-sectional view of a color liquid crystal display device as an example of an electro-optic device (flat display) manufactured by the manufacturing method according to the present invention. Hatching for showing cross-sectional portions is partially omitted.

The color liquid crystal display device 450 is produced by combining the color filter 400 with a substrate 466 opposed thereto and sealing a liquid crystal composition 465 therebetween. The substrate 466, i.e. one substrate of the liquid crystal display device 450 has an inner surface thereof formed with TFT (Thin Film Transistor) elements, not shown, and pixel electrodes 463 in the form of a matrix. Further, the color filter 400 is arranged as the other substrate such that the sections of R, G, and B of the colored layer 421 are arranged at respective locations opposed to the pixel electrodes 463.

Respective surfaces of the substrate 466 and the color filter 400, opposed to each other, are formed with alignment layers 461, 464. The alignment layers 461, 464 are subjected to rubbing treatment and liquid crystal molecules can be arranged in a fixed direction. Further, the substrate 466 and the color filter 400 have polarizing plates 467, 462 bonded to respective outer surfaces thereof. A combination of a fluorescent light, not shown, and a scattering plate is used as a backlight, according to a general practice in this field of the art. The liquid crystal composition 465 is caused to serve as an optical shutter for changing the transmittance of light emitted from the backlight, for display.

It should be noted that the electro-optic device according to the present invention is not limited to the above color liquid crystal display device, but various types of electro-optic means, such as a small-sized television which uses a thin-model Braun tube, a liquid crystal shutter, or the like, an EL display device, a plasma display, a CRT display, and an FED (Field Emission Display) panel, can be employed as the electro-optic device.

Next, the organic EL device (organic EL display device), and the manufacturing method for manufacturing the same will be described with reference to FIGS. 41 to 53.

FIGS. 41 to 53 show a manufacturing process for manufacturing the organic EL device including organic EL elements, and the construction of the organic EL device being produced according to the manufacturing process. The manufacturing process includes a bank portion forming process, a plasma treatment process, a light-emitting element forming process including a positive hole injection/transport layer forming process and a light-emitting layer forming process, an opposed electrode forming process, and a sealing process.

In the bank portion forming process, an inorganic bank layer 512a and an organic bank layer 512b are deposited sequentially at each predetermined location on a circuit element portion 502 preformed on a substrate 501, and an electrode 511 (also referred to as an "pixel electrode"), whereby a bank portion 512 formed with openings 512g is formed. As described above, the bank portion forming process includes a process for forming the inorganic bank layer 512a on the circuit element portion 502 in a manner partially overlapping the electrode 511, and a process for forming the organic bank layer 512b on the inorganic bank layer 512a.

Figure 41:
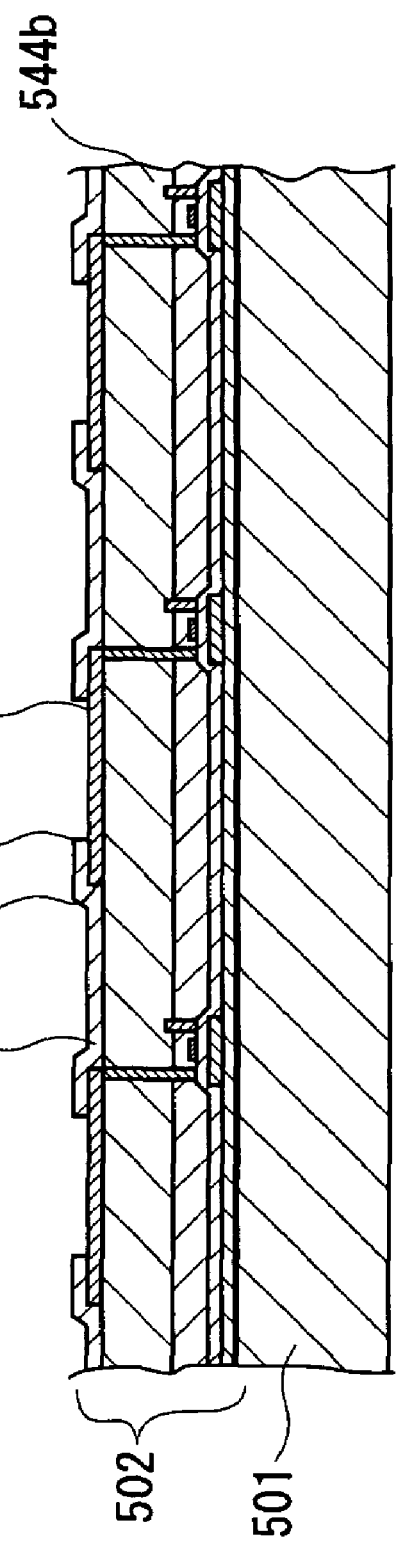
FIG. 41 is a cross-sectional view useful in explaining a process for producing bank portions (inorganic banks) by an organic EL device manufacturing method according to an embodiment of the invention.

First, as shown in FIG. 41, in the process for forming the inorganic bank layer 512a, the inorganic bank layer 512a is formed on a second interlayer-insulating film 544b of the circuit element portion 502, and the pixel electrode 511. The inorganic bank layer 512a is produced by forming an inorganic film made of SiO2, TiO2, or the like, on the second interlayer-insulating film 544b and a whole surface of the pixel electrode 511, by a CVD (Chemical Vapor Deposition) method, the coating method, the sputtering method, a vapor deposition method, or the like.

Next, the inorganic film is patterned by etching to thereby form lower openings 512c at a location corresponding to a location where an electrode surface 511a of the electrode 511 is formed. At this time, it is necessary to form the inorganic bank layer 512a such that it overlaps a peripheral portion of the electrode 511. By forming the inorganic bank layer 512a in a manner overlapping the peripheral portion (part) of the electrode 511, as described above, it is possible to control the light-emitting areas of a light-emitting layer 510b.

Figure 42:
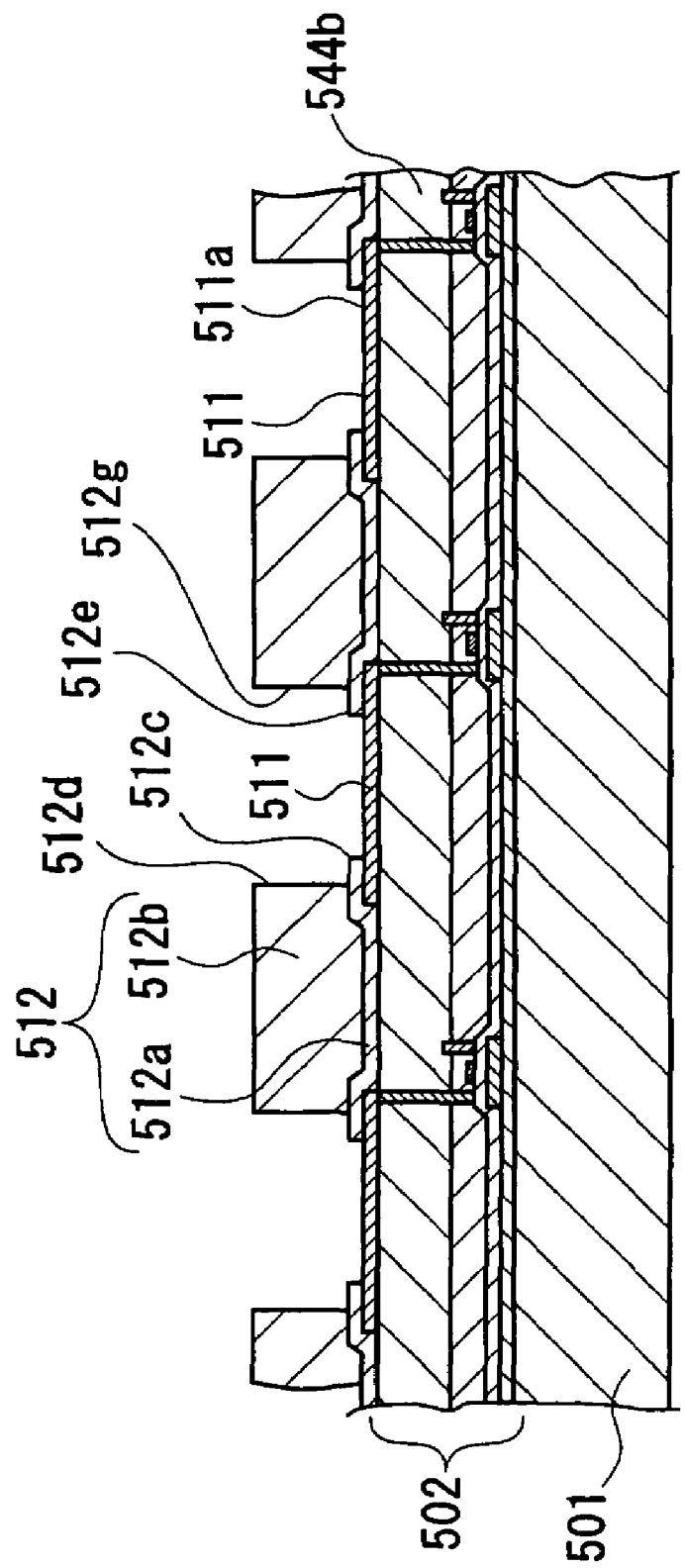
FIG. 42 is a cross-sectional view which is useful in explaining a process for producing bank portions (organic banks) by the organic EL device manufacturing method according to the embodiment.

Next, as shown in FIG. 42, in the process for forming the organic bank layer 512b, the organic bank layer 512b is formed on the inorganic bank layer 512a. The organic bank layer 512b is etched e.g. by a photo-lithographic technology to form upper openings 512d. The upper openings 512d are arranged at respective locations corresponding to the electrode surfaces 511a and the lower openings 512c.

As shown in FIG. 42, it is preferred that each upper opening 512d is formed to be wider than the lower opening 512c, and narrower than the electrode surface 511a. As a result, a first laminated portion 512e surrounding the lower opening 512c of the inorganic bank layer 512a is arranged in a manner such that it is further extended toward the center of the electrode 511 than the organic bank layer 512b. Thus, the upper opening 512d and the lower opening 512c are formed to communicate with each other, whereby an opening 512g is formed which extends through the inorganic bank layer 512a and the organic bank layer 512b.

Next, in the plasma treatment process, a region exhibiting ink affinity and a region exhibiting ink repellence are formed on a surface of each bank portion 512 and on the electrode surface 511a of each pixel electrode 511. This plasma treatment process is largely classified into a preheating process, an ink affinity-imparting process for imparting the ink affinity to an upper surface (512f) of each bank portion 512, wall surfaces of each opening 512g, and the electrode surface 511a of each pixel electrode 511, an ink repellence-imparting process for imparting the ink repellence to the upper surface 512f of each organic bank layer 512b, and wall surfaces of each upper opening 512d, and a cooling process.

First, in the preheating process, the substrate 501 including the bank portions 512 is heated to a predetermined temperature. The heating is carried out by attaching a heater to a stage on which the substrate 501 is placed and heating the substrate 501 together with the stage by the heater. More specifically, it is preferable to preheat the substrate 501 at a temperature between 70 and 80° C., for instance.

Figure 43:
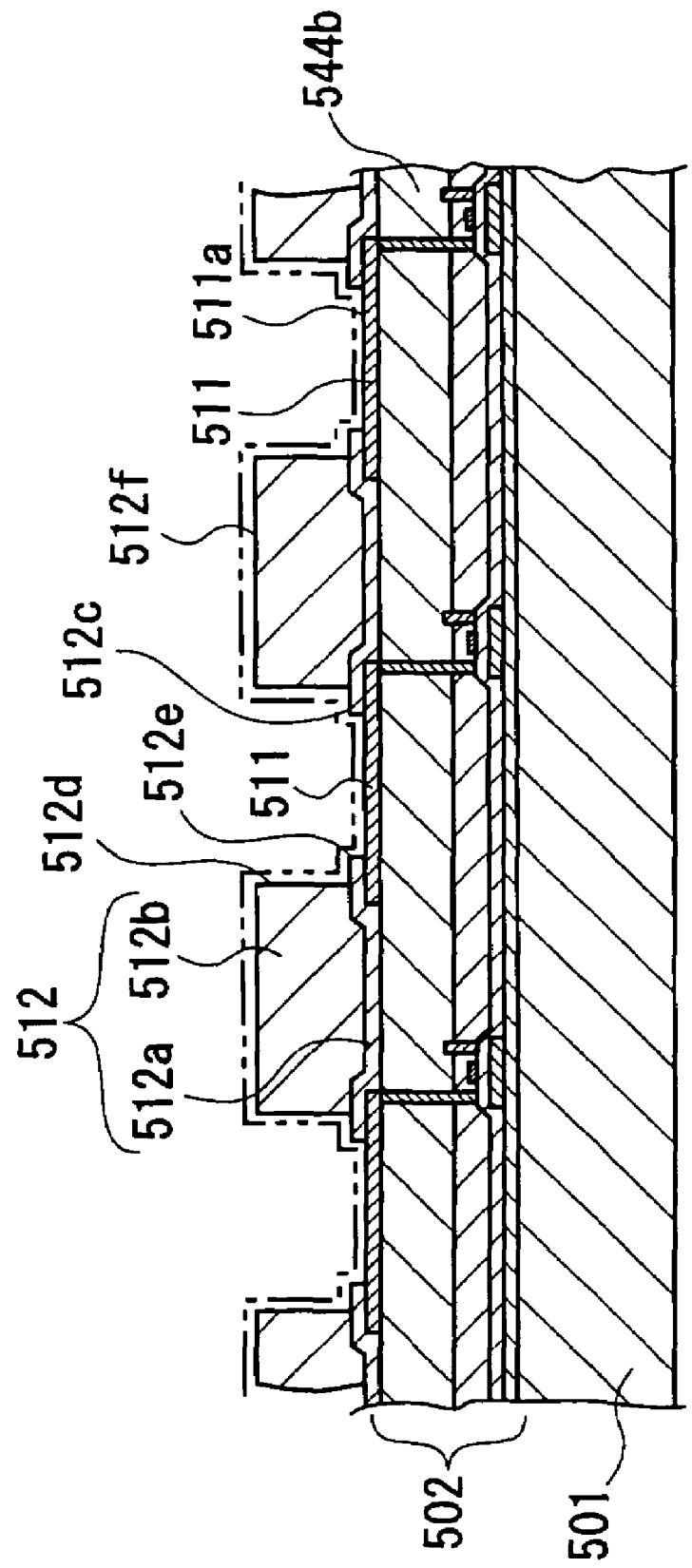
FIG. 43 is a cross-sectional view useful in explaining a plasma treatment process (liquid affinity-imparting process) in the organic EL device manufacturing method according to the embodiment.

Then, in the ink affinity-imparting process, a plasma treatment ($O_2$ plasma treatment) is carried out by using oxygen as a process gas in the air atmosphere. As shown in FIG. 43, by this $O_2$ plasma treatment, the ink affinity-imparting treatment is effected on the electrode surface 511a of each pixel electrode 511, the first laminated portions 512e of the inorganic bank layer 512a, and the wall surfaces of each upper opening 512d and the upper surfaces 512f of the organic bank layer 512b. The ink affinity-imparting treatment introduces hydroxyl groups into the above respective surfaces, thereby imparting the ink affinity thereto. In FIG. 43, portions having been subjected to the ink affinity-imparting treatment are indicated by one-dot-chain lines.

Figure 44:
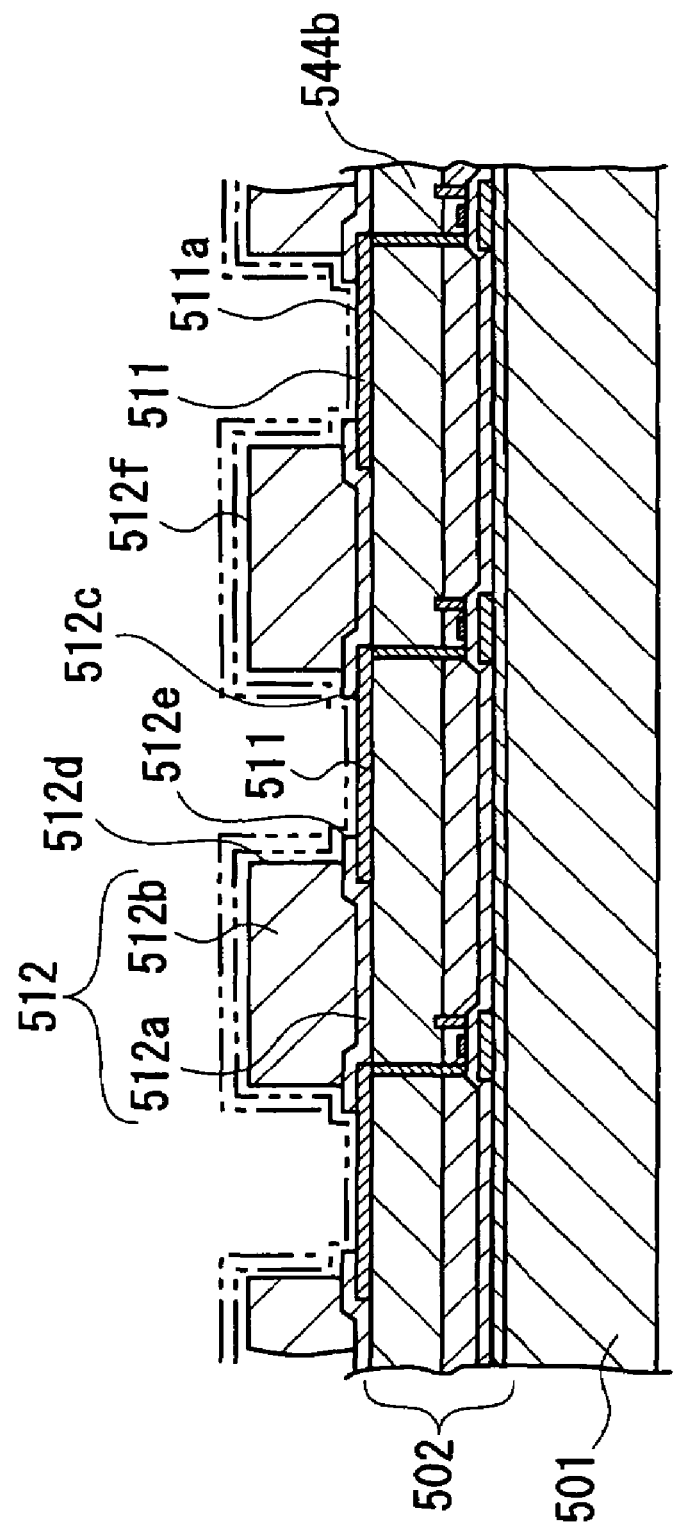
FIG. 44 is a cross-sectional view useful in explaining the plasma treatment process (liquid repellence-imparting process) in the organic EL device manufacturing method according to the embodiment.

Next, in the ink repellence-imparting process, a plasma treatment ($CF_4$ plasma treatment) is carried out by using tetrafluoromethane as a process gas in the air atmosphere. As shown in FIG. 44, by this $CF_4$ plasma treatment, the ink repellence-imparting treatment is effected on the wall surface of the upper openings 512d, and the upper surfaces 512f of the organic bank layer 512b. The ink repellence-imparting treatment introduces fluorine groups into the above respective surfaces, thereby imparting the ink repellence thereto. In FIG. 44, regions exhibiting the ink repellence are indicated by two-dot chain lines.

Next, in the cooling process, the temperature of the substrate 501 heated for the plasma treatments is lowered to a room temperature or a controlled temperature for an ink jet process (functional liquid droplet ejection process). By lowering the temperature of the substrate 501 subjected to the plasma treatments to the room temperature or a predetermined temperature (controlled temperature for execution of the ink jet process), it is possible to execute the subsequent positive hole injection/transport layer forming process at a constant temperature.

Next, in the light-emitting element forming process, a light-emitting element is formed by forming a positive hole injection/transport layer and a light-emitting layer on each pixel electrode 511. The light-emitting element forming process includes four processes: a first functional liquid droplet ejection process for ejecting a first composition required for forming the positive hole injection/transport layer, onto the pixel electrodes, the positive hole injection/transport layer forming process for drying the ejected first composition to form the positive hole injection/transport layer on the pixel electrodes, a second functional liquid droplet ejection process for ejecting a second composition required for forming the light-emitting layer, onto the positive hole injection/transport layer, and the light-emitting layer forming process for drying the ejected second composition to form the light-emitting layer on the positive hole injection/transport layer.

First, in the first functional liquid droplet ejection process, the first composition containing a hole injection/transport layer forming material is ejected onto each electrode surface 511a by the ink jet method (functional liquid droplet ejection method). It should be noted that the first functional liquid droplet ejection process and the following processes are preferably carried out in the inert gas atmosphere, such as a nitrogen gas atmosphere, an argon gas atmosphere or the like, which contains no water nor oxygen. (Further, when the positive hole injection/transport layer is formed only on the pixel electrodes, no positive hole injection/transport layer is formed adjacent to the organic bank layer).

Figure 45:
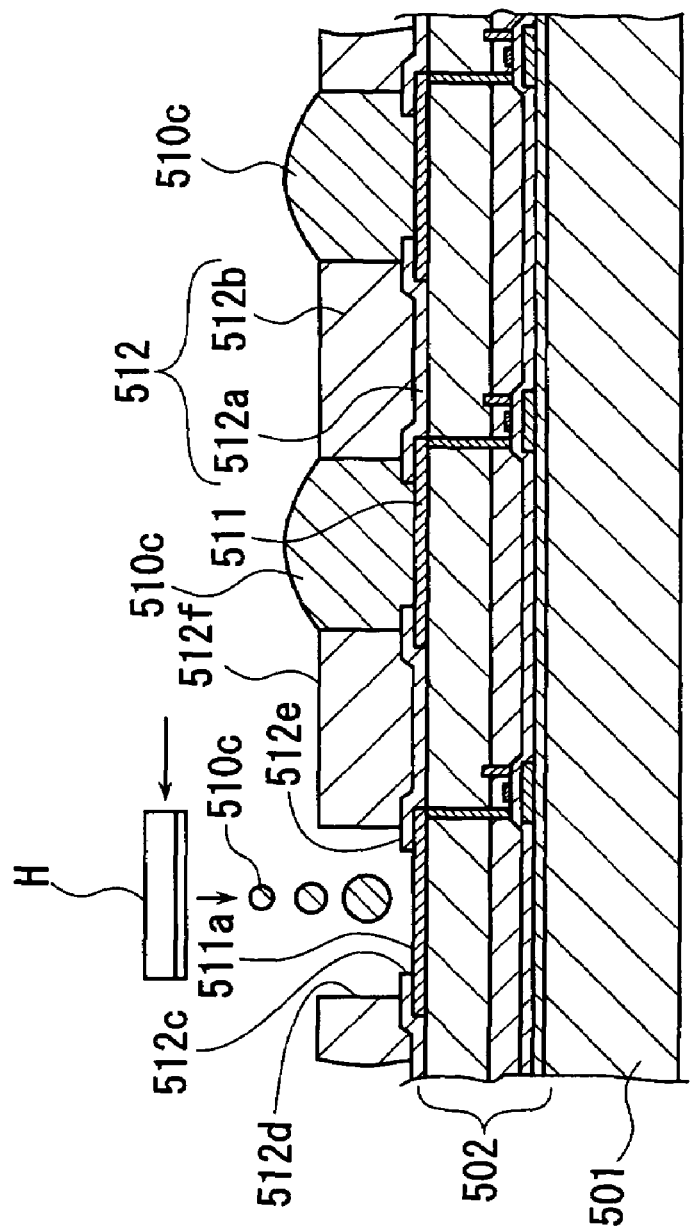
FIG. 45 is a cross-sectional view useful in explaining a positive hole injection/transport layer forming process (functional liquid droplet ejection process) in the organic EL device manufacturing method according to the embodiment.

As shown in FIG. 45, the first composition containing the hole injection/transport layer forming material is filled in an ink jet head (functional liquid droplet ejection head 7) H, each nozzle of the ink jet head H is caused to face toward the electrode surface 511a located in the lower opening 512c, and droplets 510c, each in a controlled amount, of the first composition are ejected from the nozzles onto the electrode surface 511a, while moving the ink jet head H and the substrate 501 relative to each other.

As the first composition employed in this process, there may be used, for instance, a composition obtained by dissolving a mixture of a polythiophene derivative, such as polyethylenedioxythiophene (PEDOT), and polystyrene-sulfonic acid (PSS), in a polar solvent. As the polar solvent, there may be mentioned, for instance, isopropyl alcohol (IPA), normal butanol, γ-butylolactone, N-methylpyrrolidone (NMP), 1, 3-dimethyl-2-imidazolidinone (DMI) and derivatives thereof, and glycol ethers, such as carbitol acetate and butyl carbitol acetate. It should be noted that the same material may be used for the respective light-emitting layers 510b of R, G, and B as the hole injection/transport layer forming material, or alternatively different materials may be used therefor.

As shown in FIG. 45, the ejected droplets 510c of the first composition spread over the electrode surface 511a and the first laminated portion 512e having been subjected to the ink affinity-imparting treatment, and fill the lower and upper openings 512c, 512d. The amount of the first composition ejected onto the electrode surface 511a is determined depending e.g. on the sizes of the lower and upper openings 512c, 512d, the thickness of the positive hole injection/transport layer to be formed, and the concentration of the hole injection/transport layer forming material in the first composition. Further, the droplets 510c of the first composition may be ejected onto the same electrode surface 511a not only by a single operation but also a plurality of separate operations.

Figure 46:
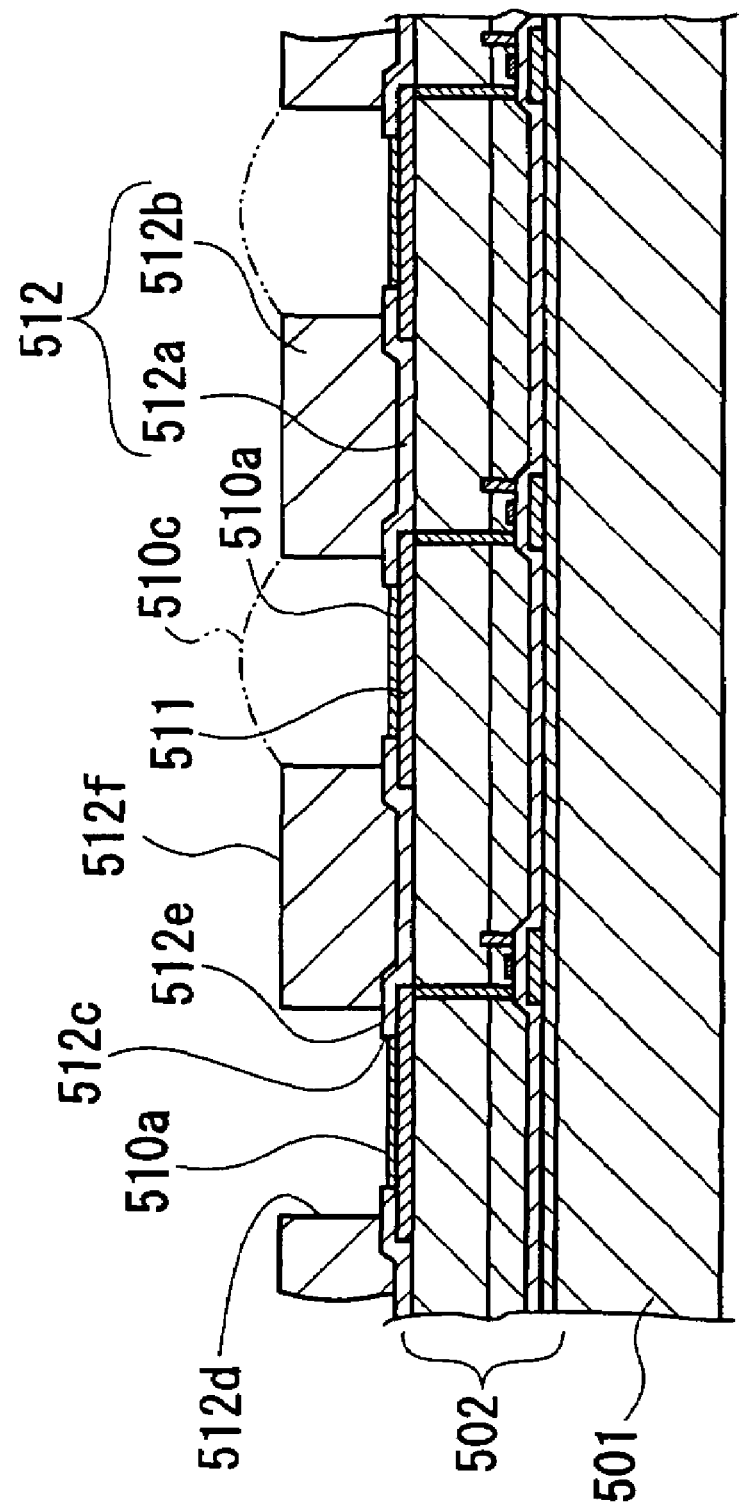
FIG. 46 is a cross-sectional view useful in explaining the positive hole injection/transport layer forming process (drying treatment) in the organic EL device manufacturing method according to the embodiment.

Next, as shown in FIG. 46, in the positive hole injection/transport layer forming process, the first composition ejected is subjected to drying and heating treatments for evaporating the polar solvent contained in the first composition, whereby a positive hole injection/transport layer 510a is formed (more specifically, individual portions or sections of the layer 510a are formed; similar wording is applied throughout the specification when considered appropriate) on the electrode surface 511a. When the drying treatment is performed, there occurs evaporation of the polar solvent contained in the droplets 510c of the first composition, at a location close to the inorganic bank layer 512a and the organic bank layer 512b, and in accordance with the evaporation, the hole injection/transport layer forming material is concentrated for precipitation.

As shown in FIG. 46, the above drying treatment also causes evaporation of the polar solvent on the electrode surface 511a, whereby a flat portion 510a of the hole injection/transport layer forming material is formed on the electrode surface 511*a*. Since the evaporating speed of the polar solvent is approximately uniform on the electrode surface 511*a*, the hole injection/transport hole injection/transport layer forming material is approximately uniformly concentrated on the electrode surface 511*a* to thereby form a flat portion 510*a* having a uniform thickness.

Next, in the second functional liquid droplet ejection process, the second composition containing a light-emitting layer forming material is ejected onto the positive hole injection/transport layer 510*a* by the ink jet method (functional liquid droplet ejection method). In this process, to prevent redissolution of the positive hole injection/transport layer 510*a*, a nonpolar solvent insoluble to the positive hole injection/transport layer 510*a* is employed as a solvent for solving the second composition used in forming the light-emitting layer.

However, the positive hole injection/transport layer 510*a* has a low affinity for a nonpolar solvent, and hence even if the second composition containing the nonpolar solvent is ejected onto the positive hole injection/transport layer 510*a*, there is a fear that the positive hole injection/transport layer 510*a* and the light-emitting layer 510*b* cannot be brought into intimate contact with each other, or the light-emitting layer 510*b* cannot be uniformly coated on the positive hole injection/transport layer 510*a*. Therefore, to increase the affinity of the surface of the positive hole injection/transport layer 510*a* to the nonpolar solvent and the light-emitting layer forming material, it is preferred to carry out a surface modification process before the light-emitting layer is formed.

Now, first, the surface modification process will be described hereinafter. In this process, a surface modification solvent, which is the same solvent or the same type of solvent as the nonpolar solvent for solving the first composition used in forming the light-emitting layer, is coated on the positive hole injection/transport layer 510*a* by the ink jet method (functional liquid droplet ejection method), the spin coating method, or a dipping method, and then dried.

Figure 47:
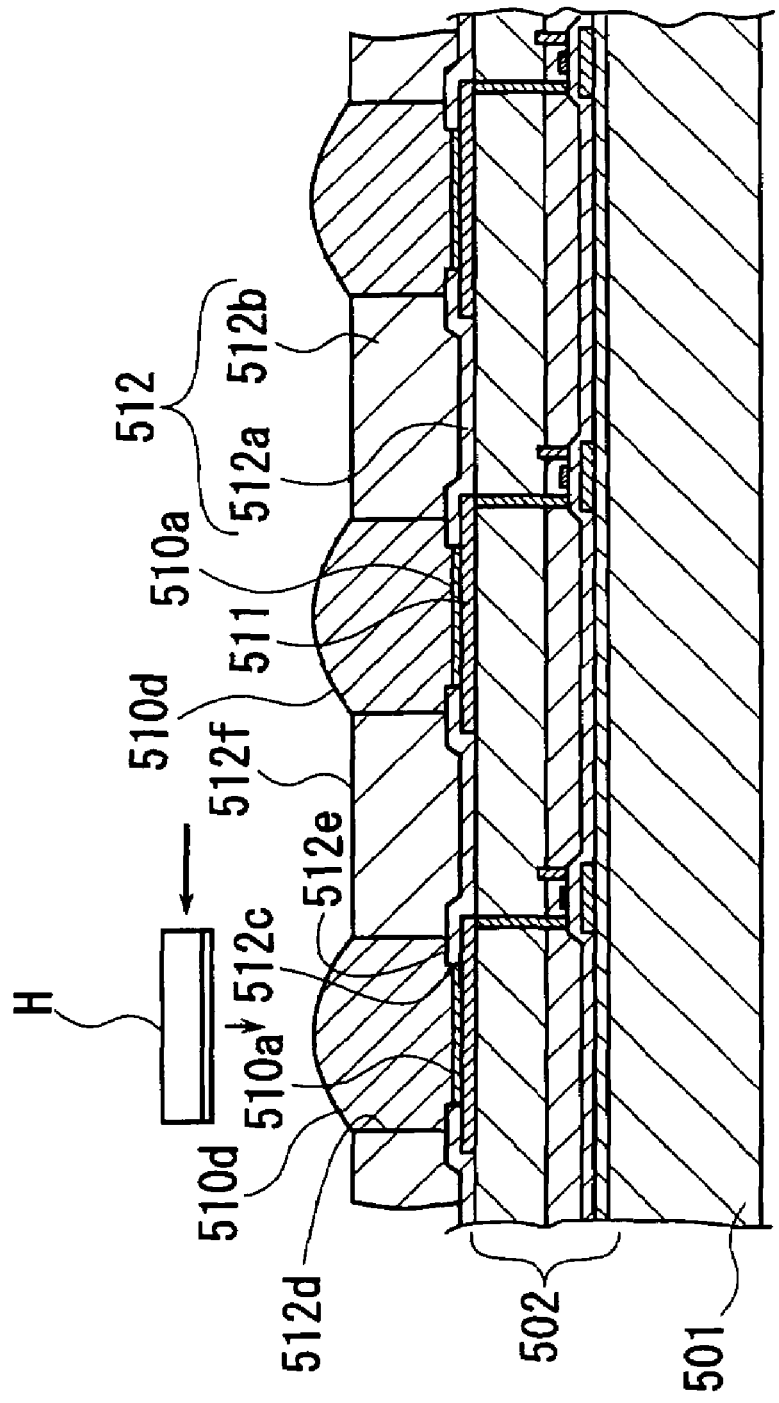
FIG. 47 is a cross-sectional view useful in explaining a surface modification process (functional liquid droplet ejection process) in the organic EL device manufacturing method according to the embodiment.
Figure 48:
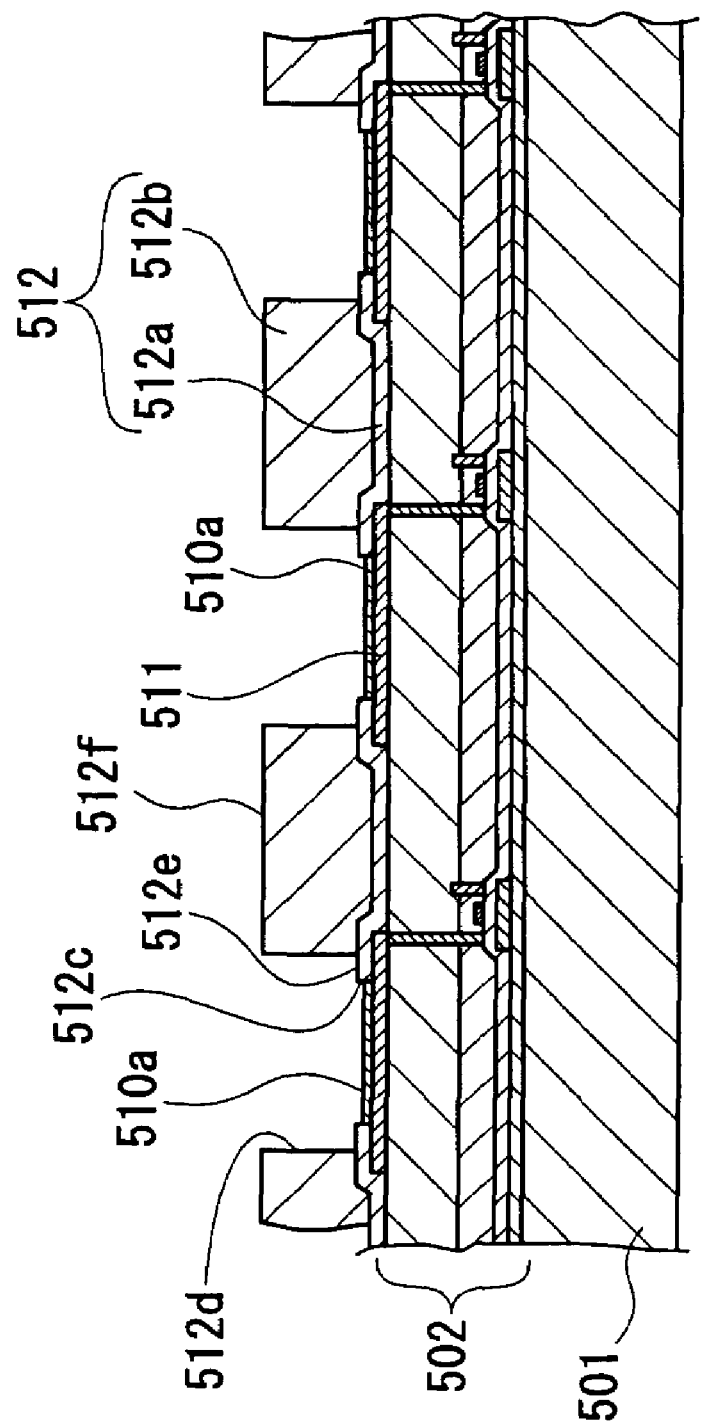
FIG. 48 is a cross-sectional view useful in explaining the surface modification process (drying treatment) in the organic EL device manufacturing method according to the embodiment.

For instance, as shown in FIG. 47, coating by the ink jet method is carried out by filling the surface modification solvent in the ink jet head H, causing the nozzles of the head H to face toward the substrate (i.e. substrate formed with the positive hole injection/transport layer 510*a*), and ejecting the surface modification solvent 510*d* onto the positive hole injection/transport layer 510*a* from the nozzles, while moving the head H and the substrate 501 relative to each other. After that, as shown in FIG. 48, the surface modification solvent 510*d* is dried.

Figure 49:
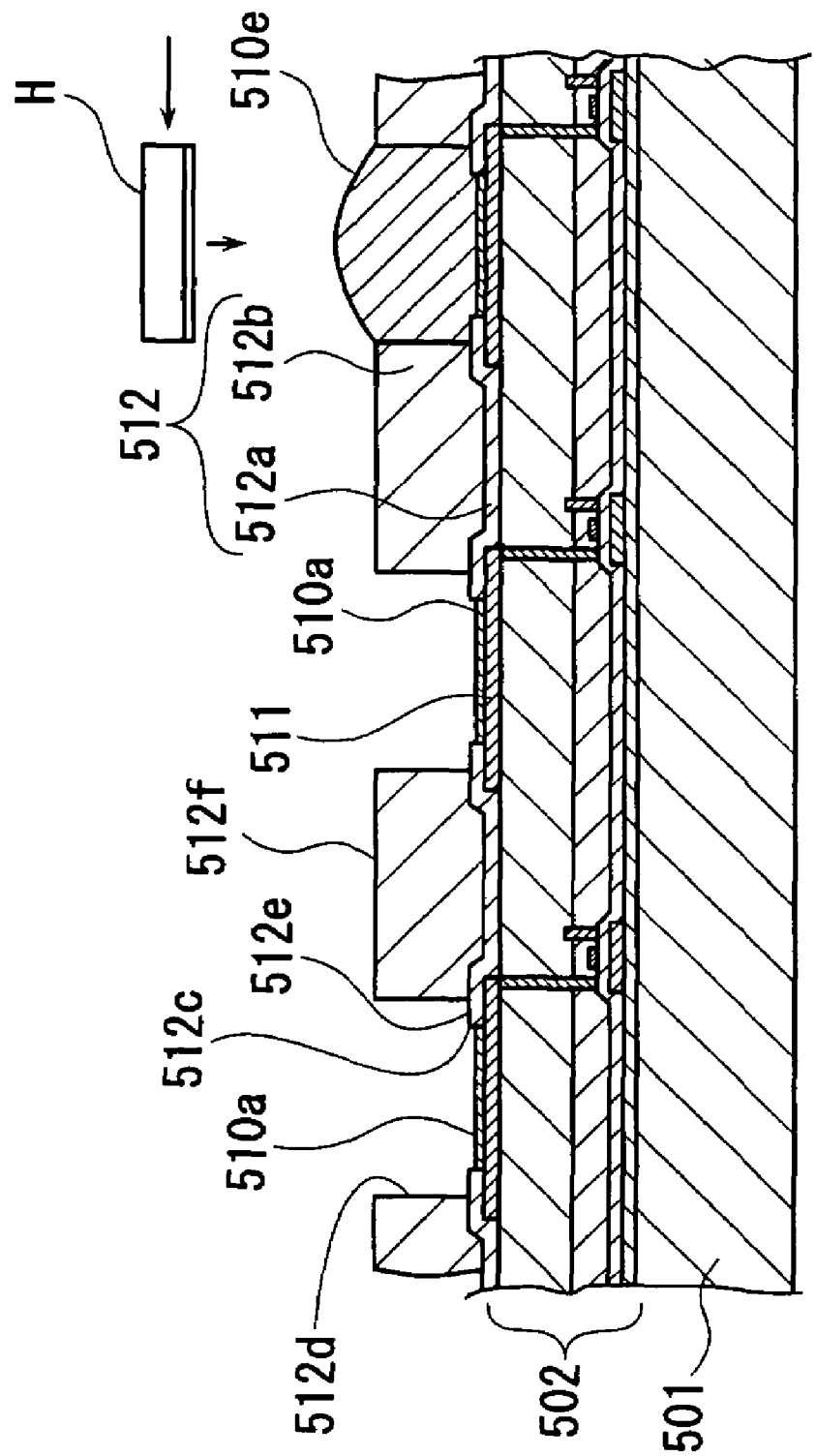
FIG. 49 is a cross-sectional view useful in explaining a B light-emitting layer forming process (functional liquid droplet ejection process) in the organic EL device manufacturing method according to the embodiment.

Next, in the second functional liquid droplet ejection process, the second composition containing the light-emitting layer forming material is ejected onto the positive hole injection/transport layer 510*a* by the ink jet method (functional liquid droplet ejection method). As shown in FIG. 49, the second composition containing a blue (B) light-emitting layer forming material is filled in the head H, the nozzles of the head H are caused to face toward sections of the positive hole injection/transport layer 510*a* located with the lower openings 512*c* and droplets 510*e*, each in a controlled amount, of the second composition are ejected from the nozzles onto the positive hole injection/transport layer 510*a*, while moving the head H and the substrate 501 relative to each other.

As the light-emitting layer forming material, there may be used a polyfluorene-based polymer derivative, a (poly)paraphenylenevinylene derivative, a polyphenylene derivatives, polyvinyl carbazole, a polythiophene derivative, a perylene-based dye, a coumarin-based dye, a rhodamine-based dye, or a material obtained by doping any of the above polymer compounds with an organic EL material. For instance, the above polymer compounds can be used by doping the same with rubrene, perylene, 9, 10-diphenylanthracene, tetraphenyl butadiene, Nile red, coumarin 6, quinacridone, or the like.

As nonpolar solvents, it is preferable to use solvents insoluble to the positive hole injection/transport layer 510*a*, such as cyclohexylbenzene, dihydrobenzofuran, trimethylbenzene, tetramethylbenzene, and the like. By using any of the above nonpolar solvents for solving the second composition used in forming the light-emitting layer 510*b*, it is possible to coat the second composition on the positive hole injection/transport layer 510*a* without redissolving the same.

Referring to FIG. 49, the ejected second composition 510*e* spread over the positive hole injection/transport layer 510*a* to fill the lower and upper openings 512*c*, 512*d*. The second composition 510*e* maybe ejected onto the same positive hole injection/transport layer 510*a* not by a single operation but by a plurality of separate operations. In the latter case, the same amount of the second composition 510*e* may be ejected each time, or alternatively a different amount of the second composition 510*e* may be ejected each time.

Figure 50:
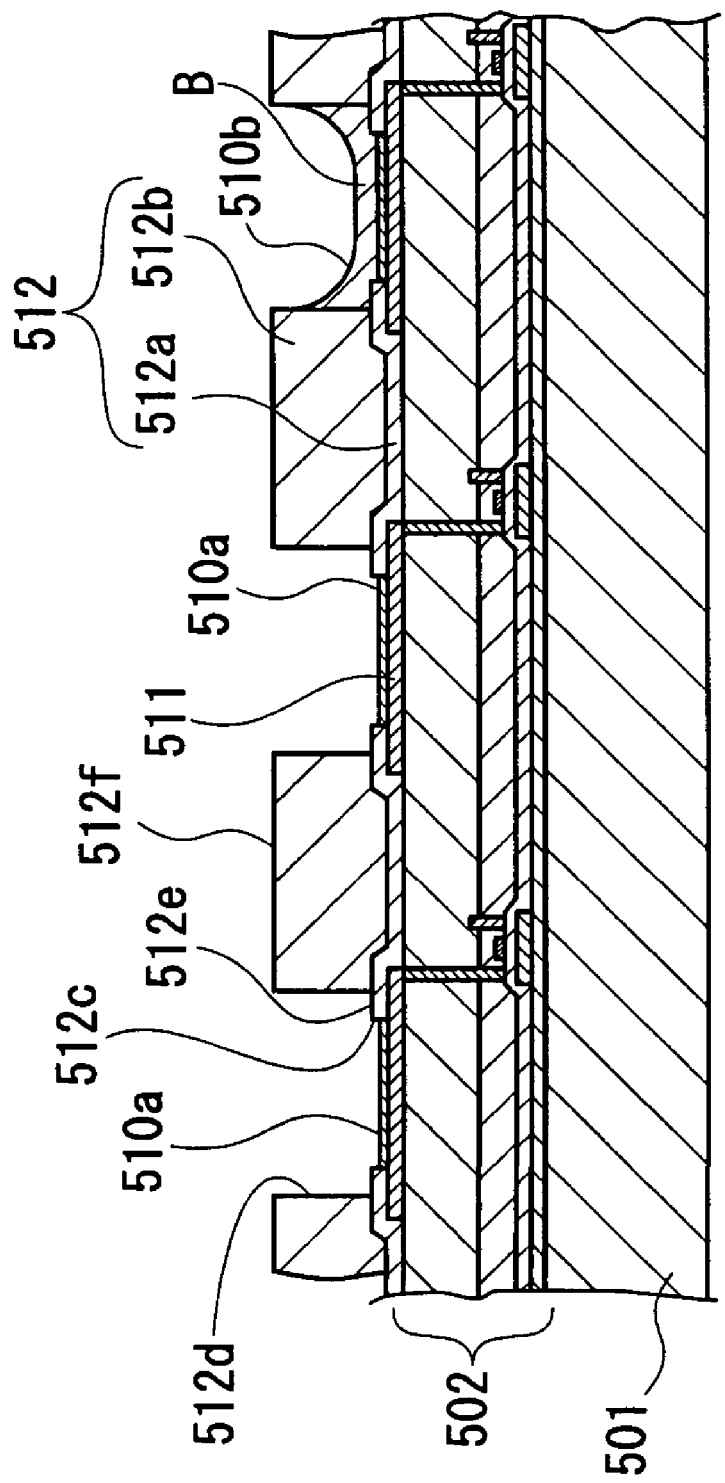
FIG. 50 is a cross-sectional view useful in explaining the B light-emitting layer forming process (drying treatment) in the organic EL device manufacturing method according to the embodiment.

Next, in the light-emitting layer forming process, after the second composition is ejected, it is subjected to drying and heating treatments to form the light-emitting layer 510*b* on the positive hole injection/transport layer 510*a*. The drying treatment causes the nonpolar solvent contained in the ejected second composition to be evaporated, whereby a blue (B) light-emitting layer 510*b*, is formed, as shown in FIG. 50.

Figure 51:
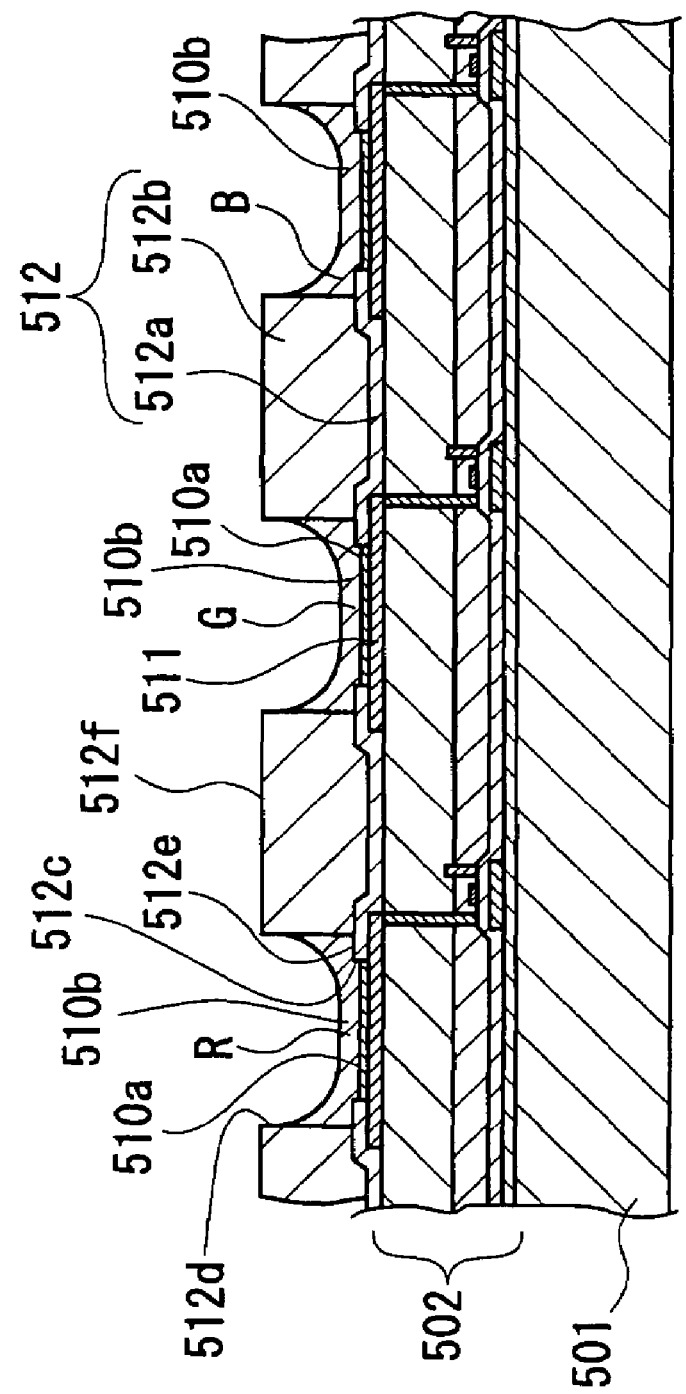
FIG. 51 is a cross-sectional view useful in explaining a process for forming R light, G light-, B light-emitting layers in the organic EL device manufacturing method according to the embodiment.

Successively, as shown in FIG. 51, similarly to the case of the blue (B) light-emitting layer 510*b*, a red (R) light-emitting layer 510*b* is formed, and finally a green (G) light-emitting layer 510*b* is formed. It should be noted that the order of forming of the light-emitting layers 510*b* is not limited to the mentioned order, but the layers may be formed in any order. For instance, it is possible to determine the order of forming them depending on the materials used for forming them.

Figure 52:
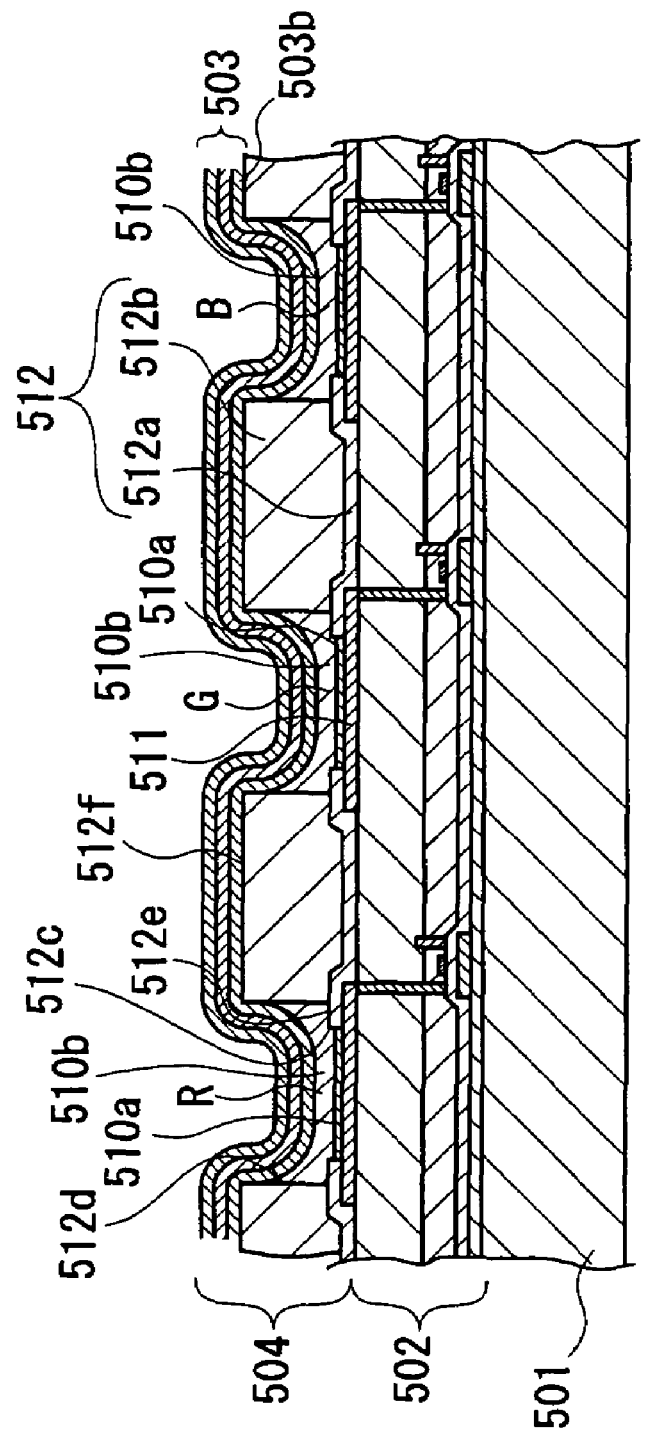
FIG. 52 is a cross-sectional view useful in explaining an opposed electrode forming process in the organic EL device manufacturing method according to the embodiment.

Next, as shown in FIG. 52, in the opposed electrode forming process, a cathode (opposed electrode) 503 is formed on all the surfaces of the light-emitting layer 510*b* and the organic bank layer 512*b*. It should be noted that the cathode 503 may be formed by depositing a plurality of layers of materials. For instance, it is preferred that a layer of a material having a lower work function is formed toward the light-emitting layer. In this case, for instance, it is possible to use Ca, Ba, or the like. Further, it may be preferable to form a thin LiF film on a lower layer depending on the material. Further, it is preferred that a material having a higher work function is used on an upper side (sealing side) than on a lower side. It is preferable to form the above cathodes (cathode layers) 503 e.g. by the vapor deposition method, the sputtering method, or a CVD (Chemical Vapor Deposition) method. Especially, it is preferable to form them by the vapor deposition method since damage to the light-emitting layers 510*b* by heat can be prevented.

Further, a lithium fluoride cathode layer may be formed only on the light-emitting layer 510*b*. Further, it may be formed only on the blue (B) light-emitting layer 510*b*. In this case, the other layers, that is, the red (R) light-emitting layer 510*b* and the green (G) light-emitting layer 510*b* are adjacent to an upper cathode layer 503*b* made of LiF. Further, it is preferable to form an Al layer, an Ag layer or the like on the upper surface of the cathode 503 by the vapor deposition method, the sputtering method, or the CVD method. Furthermore, on the cathode 503, there may be formed a protective layer made of $SiO_2$, SiN, etc. for prevention of oxidation.

Finally, in the sealing process shown in FIG. 53, a sealing substrate is deposited upon an organic EL device 504 in the atmosphere of inert gas, such as nitrogen gas, argon gas, helium gas, or the like. It is preferable to carry out the sealing process in the above inert gas atmosphere. It is not preferable to carry out the sealing process in the air atmosphere, since when the sealing process is performed in the air atmosphere, if the cathode 503 has a defect, such as a pin hole, formed therein, there is a fear that water, oxygen, or the like enters the cathode 503 from the defect to oxidize the cathode 503. Finally, the cathode 503 is connected to the wiring of a flexible board, and the wiring of the circuit element portion 502 is connected to a driving IC, whereby an organic EL device 500 according to the present embodiment is obtained.

It should be noted that in forming the pixel electrode 511 and the cathode (opposed electrode) 503, the ink jet method may be employed by using the ink jet head H. More specifically, electrode materials in a liquid form are introduced into the ink jet heads H, respectively, and the pixel electrode 511 and cathode 503 are formed, respectively, by ejecting the electrode materials from the respective heads H (this method includes a drying process).

Similarly, the functional liquid droplet ejection device 10 according to the present embodiment can be applied to a method of manufacturing an electron emitting device, a method of manufacturing a PDP (Plasma Display Panel) device, and a method of manufacturing an electrophoresis display device.

In the method of manufacturing an electron emitting device, fluorescent materials for forming phosphors that emit fluorescent light of the colors R, G, and B are introduced into a plurality of functional liquid droplet ejection heads 7, and while moving the plurality of heads 7 for main scanning and sub scanning, the fluorescent materials are selectively ejected from the heads 7 to thereby form a lot of phosphors on electrodes. It should be noted that the electron emitting device is a superordinate concept including an FED (Field Emission Display).

In the method of manufacturing a PDP device, fluorescent materials for forming phosphors that emit fluorescent light of the colors R, G, and B are introduced into a plurality of functional liquid droplet ejection heads 7, and while moving the plurality of heads 7 for main scanning and sub scanning, the fluorescent materials are selectively ejected from the heads 7 to thereby form phosphors in a multiplicity of respective concave portions of a back substrate.

In the method of manufacturing an electrophoresis display device, materials for forming migration elements of the colors R, G, and B are introduced into a plurality of functional liquid droplet ejection heads 7, and while moving the plurality of heads 7 for main scanning and sub scanning, ink materials are selectively ejected from the heads 7 to thereby form migration elements in a multiplicity of respective concave portions of electrodes. It should be noted that a migration element is comprised of an electrically charged particle and a dye, and is preferably enclosed in a microcapsule.

On the other hand, the functional liquid droplet ejection device 2 according to the present embodiment can also be applied to a spacer forming method, a metal wiring-forming method, a lens forming method, a resist forming method, and a light diffuser-forming method.

The spacer forming method is employed for forming a multiplicity of particulate spacers to form very small cell gaps between two substrates. A particle material for forming the spacers is introduced into a plurality of functional liquid droplet ejection heads 7, and while moving the plurality of heads 7 for main scanning and sub scanning, the material is selectively ejected from the heads 7 to thereby form the spacers on at least one of the two substrates. For instance, the spacer forming method is useful in forming cell gaps between two substrates in the liquid crystal display device and the electrophoresis display device, described above. It goes without saying that the spacer forming method can be applied to techniques of manufacturing semiconductor devices which require very small gaps of the above-mentioned kind.

In the metal wiring-forming method, a metal material in a liquid form is introduced into a plurality of functional liquid droplet ejection heads 7, and while moving the plurality of heads 7 for main scanning and sub scanning, the metal material in the liquid form is selectively ejected from the heads 7 to thereby form metal wiring on a substrate. The metal wiring-forming method can be employed to form, for instance, metal wiring connecting between a driver and electrodes of the above liquid crystal display device, and metal wiring connecting between TFTs or the like and electrodes of the above organic EL device. Further, it goes without saying that the metal wiring-forming method can be applied not only to production of the flat displays of the above-mentioned kinds but also to the general semiconductor manufacturing technique of.

In the lens forming method, a lens material is introduced into a plurality of functional liquid droplet ejection heads 7, and while moving the plurality of heads 7 for main scanning and sub scanning, the lens material is selectively ejected from the heads 7 to thereby form a lot of microlenses on a transparent substrate. The lens forming method can be applied e.g. to a beam converging device in the above FED device. Of course, the method can be allied to various optical devices.

In the resist forming method, a resist material is introduced into a plurality of functional liquid droplet ejection heads 7, and while moving the plurality of heads 7 for main scanning and sub scanning, the resist material is selectively ejected from the heads 7 to thereby form a photoresist having a desired shape on a substrate. The resist forming method can be widely applied, for instance, to the coating of a photoresist necessitated in a photo-lithographic method which forms a major portion of the semiconductor manufacturing technique, let alone to the forming of banks in the above display devices.

In the light diffuser-forming method for forming a multiplicity of light diffusers on a board, a light diffusing material is introduced into a plurality of functional liquid droplet ejection heads 7, and while moving the plurality of heads 7 for main scanning and sub scanning, the light diffusing material is selectively ejected from the heads 7 to thereby form a multiplicity of light diffusers. Needless to say, this method as well can be applied to various optical devices.

As described heretofore, according to the ejection pattern data-generating method, the ejection pattern data-generating device, the functional liquid droplet ejection device, and the drawing system of the present invention, ejection pattern data are generated based on pixel information, chip information, and nozzle information, which are set by the user as he desires. Therefore, it is possible to collectively generate ejection pattern data for all the nozzles. In other words, it is possible to generate ejection pattern data for each nozzle easily and quickly, irrespective of the number of the nozzles.

Further, according to the head motion pattern data-generating device of the present invention, head motion pattern data for the functional liquid droplet ejection heads are generated based on chip information, nozzle information, etc. set by the user. This makes it possible to generate conditioned head motion pattern data easily and quickly.

According to the liquid crystal display device manufacturing method, the organic EL device manufacturing method, the electron emitting device-manufacturing method, the PDP device manufacturing method, and the electrophoresis display device manufacturing method, of the present invention, it is possible to easily introduce the functional liquid droplet ejection heads suitable for filter materials and light-emitting materials used in the above devices. This makes it possible to enhance the manufacturing efficiency.

Further, according to the color filter-manufacturing method, the organic EL manufacturing method, the spacer forming method, the metal wiring-forming method, the lens forming method, the resist forming method, and the light diffuser-forming method, of the present invention, it is possible to easily introduce the functional liquid droplet ejection heads suitable for filter materials and light-emitting materials used in the electronic devices and the optical devices. This makes it possible to enhance the manufacturing efficiency.

It is further understood by those skilled in the art that the foregoing is a preferred embodiment of the invention, and that various changes and modifications may be made without departing from the spirit and scope thereof.

What is claimed is:

1. A functional liquid droplet ejection device comprising:
an ejection pattern data-generating device that generates ejection pattern data for a plurality of nozzles formed in an array in a functional liquid droplet ejection head, the ejection pattern data being used for selectively ejecting functional liquid droplets from the nozzles, to thereby draw on at least one chip-forming area on a workpiece, the device including:
pixel-setting means for setting pixel information concerning an array of pixels in the at least one chip-forming area;
chip-setting means for setting chip information concerning an array of the at least one chip-forming area on the workpiece;
nozzle-setting means for setting nozzle information concerning an array of the nozzles;
storage means for storing the pixel information, the chip information, and the nozzle information, which have been set; and
data-generating means for generating the ejection pattern data for the nozzles based on a positional relationship between the workpiece and the functional liquid droplet ejection head, and each information stored in said storage means, wherein the pixel information includes color information of the functional liquid droplets and wherein said data-generating means generates the ejection pattern data on a color-by-color basis.

2. A functional liquid droplet ejection device according to claim 1, further comprising:
head motion-setting means for setting head motion information concerning relative motion of the functional liquid droplet ejection head with respect to the workpiece; and
head motion pattern data-generating means for generating head motion pattern data for the functional liquid droplet ejection head based on each information stored in said storage means and the head motion information.

3. A drawing system comprising a plurality of the functional liquid droplet ejection devices as claimed in claim 1, in a manner associated with a plurality of colors, and
drawing means for drawing on the at least one chip-forming area based on the ejection pattern data generated on a color-by-color basis, by the plurality of the functional liquid droplet ejection devices.

4. The system according to claim 3, wherein the functional liquid droplet ejection heads arranged on the plurality of the functional liquid droplet ejection devices have respective arrays of nozzles arranged in the same number and in the same layout, and assuming that identical nozzle numbers are assigned to nozzles of each array, respectively, starting from one end of the array,
said drawing means is inhibited from ejecting the functional liquid droplets to pixels adjacent to each other from nozzles having the same nozzle number.

5. A method of manufacturing a liquid crystal display device, by using the functional liquid droplet ejection device as claimed in claim 1, the liquid crystal display device having a multiplicity of filter elements formed on a substrate of a color filter thereof, the method comprising:
introducing filter materials of colors into a plurality of the functional liquid droplet ejection heads; and
forming the large number of filter elements by causing the functional liquid droplet ejection heads to scan relative to the substrate and selectively eject the filter materials.

6. A method of manufacturing an organic EL device, by using the functional liquid droplet ejection device as claimed in claim 1, the organic EL device having EL light-emitting layers formed on a multiplicity of pixels on a substrate thereof, the method comprising:
introducing light-emitting materials of colors into a plurality of the functional liquid droplet ejection heads; and
forming a multiplicity of the EL light-emitting layers by causing the functional liquid droplet ejection heads to scan relative to the substrate and selectively eject the light-emitting materials.

7. A method of manufacturing an electron emitting device, by using the functional liquid droplet ejection device as claimed in claim 1, the electron emitting device having a multiplicity of phosphors formed on electrodes thereof, the method comprising:
introducing fluorescent materials into a plurality of the functional liquid droplet ejection heads; and
forming the large number of phosphors by causing the functional liquid droplet ejection head to scan relative to the electrodes and selectively eject the fluorescent materials.

8. A method of manufacturing a PDP device, by using the functional liquid droplet ejection device as claimed in claim 1, the PDP device having phosphors formed in a multiplicity of concave portions of a back substrate thereof, respectively, the method comprising:
introducing fluorescent materials into a plurality of the functional liquid droplet ejection heads; and
forming a multiplicity of the phosphors by causing the functional liquid droplet ejection heads to scan relative to the back substrate and selectively eject the fluorescent materials.

9. A method of manufacturing an electrophoresis display device, by using the functional liquid droplet ejection device as claimed in claim 1, the electrophoresis display device having migration elements formed in a multiplicity of concave portions of electrodes thereof, the method comprising:

introducing migration element materials into a plurality of the functional liquid droplet ejection heads; and forming a multiplicity of the migration elements by causing the functional liquid droplet ejection heads to scan relative to the electrodes and selectively eject the migration element materials.

10. A method of manufacturing a color filter by using the functional liquid droplet ejection device as claimed in claim 1, the color filter having a multiplicity of filter elements arranged on a substrate thereof, the method comprising:

introducing filter materials into a plurality of the functional liquid droplet ejection heads; and forming the large number of filter elements by causing the functional liquid droplet ejection heads to scan relative to the substrate and selectively eject the filter materials.

11. The method according to claim 10, wherein said color filter includes an overcoating layer covering the large number of filter elements, and the method further comprises, subsequent to forming of the filter elements:

introducing a transparent coating material into the plurality of the functional liquid droplet ejection heads; and forming the overcoating layer by causing the functional liquid droplet ejection heads to scan relative to the substrate and selectively eject the coating material.

12. A method of manufacturing an organic EL, by using the functional liquid droplet ejection device as claimed in claim 1, the organic EL having a multiplicity of pixels, including EL light-emitting layers, arranged on a substrate thereof, the method comprising:

introducing light-emitting materials into a plurality of the functional liquid droplet ejection heads; and forming a multiplicity of the EL light-emitting layers by causing the functional liquid droplet ejection heads to scan relative to the substrate and selectively eject the light-emitting materials.

13. The method according to claim 12, wherein the organic EL includes a multiplicity of pixel electrodes formed between the large number of the EL light-emitting layers and the substrate in a manner associated with the EL light-emitting layers, respectively, the method further comprising:

introducing an electrode material in a liquid form into a plurality of the functional liquid droplet ejection heads; and forming the large number of pixel electrodes, by causing the functional liquid droplet ejection heads to scan relative to the substrate and selectively eject the electrode material.

14. The method according to claim 13, wherein the organic EL has opposed electrodes formed in a manner covering the large number of the EL light-emitting layers, the method further comprising, subsequent to forming of the EL light-emitting layers:

introducing an electrode material in a liquid form into a plurality of the functional liquid droplet ejection heads; and forming the opposed electrodes, by causing the functional liquid droplet ejection heads to scan relative to the substrate and selectively eject the electrode material in the liquid form.

15. A method of forming particulate spacers, by using the functional liquid droplet ejection device as claimed in claim 1, the spacers creating very small cell gaps between two substrates, the method comprising:

introducing a particle material for forming the spacers into a plurality of the functional liquid droplet ejection heads; and causing the functional liquid droplet ejection heads to scan relative to at least one of the two substrates and selectively eject the particle material, thereby forming the spacers on the substrate.

16. A method of forming metal wiring on a substrate, by using the functional liquid droplet ejection device as claimed in claim 1, the method comprising:

introducing a metal material in a liquid form into a plurality of the functional liquid droplet ejection heads; and forming the metal wiring by causing the functional liquid droplet ejection heads to scan relative to the substrate and selectively eject the metal material.

17. A method of forming a multiplicity of microlenses on a substrate, by using the functional liquid droplet ejection device as claimed in claim 1, the method comprising:

introducing a lens material into a plurality of the functional liquid droplet ejection head; and forming the large number of microlenses by causing the functional liquid droplet ejection heads to scan relative to the substrate and selectively eject the lens material.

18. A method of forming a resist having a desired shape on a substrate, by using the functional liquid droplet ejection device as claimed in claim 1, the method comprising:

introducing a resist material into the functional liquid droplet ejection head; and forming the resist by causing a plurality of the functional liquid droplet ejection heads to scan relative to the substrate and selectively eject the resist material.

19. A method of forming a multiplicity of light diffusers on a substrate, by using the functional liquid droplet ejection device as claimed in claim 1, the method comprising:

introducing a light diffusing material into a plurality of the functional liquid droplet ejection heads; and forming the large number of light diffusers by causing the functional liquid droplet ejection heads to scan relative to the substrate and selectively eject the light diffusing material.

* * * * *